(12) United States Patent
Huang

(10) Patent No.: US 10,861,780 B1
(45) Date of Patent: Dec. 8, 2020

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/410,872

(22) Filed: May 13, 2019

(51) Int. Cl.
*H05K 1/02* (2006.01)
*H01L 23/498* (2006.01)
*H01L 21/48* (2006.01)
*H05K 3/46* (2006.01)
(Continued)

(52) U.S. Cl.
CPC ...... *H01L 23/49822* (2013.01); *H01L 21/486* (2013.01); *H01L 21/4857* (2013.01); *H01L 23/49838* (2013.01); *H05K 1/115* (2013.01); *H05K 3/0047* (2013.01);
(Continued)

(58) Field of Classification Search
CPC ............. H01L 23/49822; H01L 21/486; H01L 23/49838; H01L 21/4857; H01L 23/49827; H01L 2224/16225; H01L 2224/32225; H01L 2224/73204; H01L 2924/15174; H01L 2924/15311; H01L 23/49833; H01L 2225/1041; H01L 2225/1058; H01L 22/32; H01L 23/3128; H01L 24/16; H01L 21/4853; H01L 21/563; H01L 21/565; H01L 22/12; H01L 2224/16227; H01L 23/49816; H01L 24/32; H01L 24/13; H01L 24/73; H01L 24/92; H01L 2224/131; H01L 2224/92125; H01L 2924/3511; H01L 2924/37001; H01L 2224/16237; H01L 22/14; H05K 3/4623; H05K 3/0052; H05K 3/4602; H05K 3/0047; H05K 1/115; H05K 3/4682; H05K 1/0298; H05K 3/4688; H05K 1/0346; H05K 1/0326; H05K 1/0306; H05K 1/09; H05K 1/181; H05K 3/0023; H05K 3/0055; H05K 3/0094; H05K 2203/061;
(Continued)

(56) References Cited

U.S. PATENT DOCUMENTS 7,167,373 B1 * 1/2007 Hoang ................ H01L 23/3128
174/254
8,288,875 B2 10/2012 Shimizu et al.
(Continued)

*Primary Examiner* — Steven T Sawyer
(74) *Attorney, Agent, or Firm* — Foley & Lardner LLP

(57) ABSTRACT

A wiring structure includes an upper conductive structure, a lower conductive structure, a lower encapsulant and an intermediate layer. The upper conductive structure includes at least one upper dielectric layer and at least one upper circuit layer in contact with the upper dielectric layer. The lower conductive structure includes at least one lower dielectric layer and at least one lower circuit layer in contact with the lower dielectric layer. The lower encapsulant surrounds a lateral peripheral surface of the lower conductive structure. The intermediate layer is disposed between the upper conductive structure and the lower conductive structure to bond the upper conductive structure and the lower conductive structure together. The upper conductive structure is electrically connected to the lower conductive structure.

20 Claims, 43 Drawing Sheets

(51) Int. Cl.
*H05K 3/00* (2006.01)
*H05K 1/11* (2006.01)

(52) U.S. Cl.
CPC ......... *H05K 3/0052* (2013.01); *H05K 3/4602* (2013.01); *H05K 3/4623* (2013.01); *H05K 3/4682* (2013.01)

(58) Field of Classification Search
CPC ......... H05K 3/4644; H05K 2201/0154; H05K 2201/0141; Y10T 29/49167
See application file for complete search history.

(56) References Cited

U.S. PATENT DOCUMENTS

| | | | |
|---|---|---|---|
| 2006/0087029 A1* | 4/2006 | Imanaka | H01L 23/3114 |
| | | | 257/723 |
| 2013/0175699 A1* | 7/2013 | Haba | H01L 24/96 |
| | | | 257/774 |
| 2013/0214396 A1* | 8/2013 | Kim | H01L 23/552 |
| | | | 257/659 |
| 2015/0102510 A1* | 4/2015 | Kaneda | H05K 1/115 |
| | | | 257/778 |
| 2018/0061726 A1* | 3/2018 | Anderson | H01L 23/3675 |
| 2018/0145060 A1* | 5/2018 | Appelt | H01L 25/0657 |

* cited by examiner

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least two conductive structures attached or bonded together by an intermediate layer, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes: (a) an upper conductive structure including at least one upper dielectric layer and at least one upper circuit layer in contact with the upper dielectric layer; (b) a lower conductive structure including at least one lower dielectric layer and at least one lower circuit layer in contact with the lower dielectric layer; (c) a lower encapsulant surrounding a lateral peripheral surface of the lower conductive structure; and (d) an intermediate layer disposed between the upper conductive structure and the lower conductive structure and bonding the upper conductive structure and the lower conductive structure together, wherein the upper conductive structure is electrically connected to the lower conductive structure.

In some embodiments, a method for manufacturing a wiring structure includes: (a) providing a lower substrate including at least one lower conductive structure, wherein the lower conductive structure includes at least one dielectric layer and at least one circuit layer in contact with the dielectric layer; (b) providing a plurality of upper strips, wherein each of the upper strips includes at least one upper conductive structure, and the upper conductive structure includes at least one dielectric layer and at least one circuit layer in contact with the dielectric layer; (c) attaching the upper strips to the lower substrate side by side, wherein a position of the upper conductive structure of the upper strip corresponds to a position of the lower conductive structure of the lower substrate; (d) electrically connecting the upper conductive structure of the upper strip and the lower conductive structure of the lower substrate; and (e) conducting a singulation process to form a plurality of wiring structures.

In some embodiments, a method for manufacturing a wiring structure includes: (a) providing a plurality of lower conductive structures, wherein each of the lower conductive structures includes at least one dielectric layer and at least one circuit layer in contact with the dielectric layer; (b) forming a lower encapsulant to encapsulate a plurality of known good lower conductive structures to form a lower module; (c) providing a plurality of upper conductive structures, wherein each of the upper conductive structures includes at least one dielectric layer and at least one circuit layer in contact with the dielectric layer of the upper conductive structure; (d) attaching the upper conductive structures to the known good lower conductive structures of the lower module respectively; and electrically connecting the upper conductive structures and the known good lower conductive structures of the lower module; and (f) conducting a singulation process to form a plurality of wiring structures.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
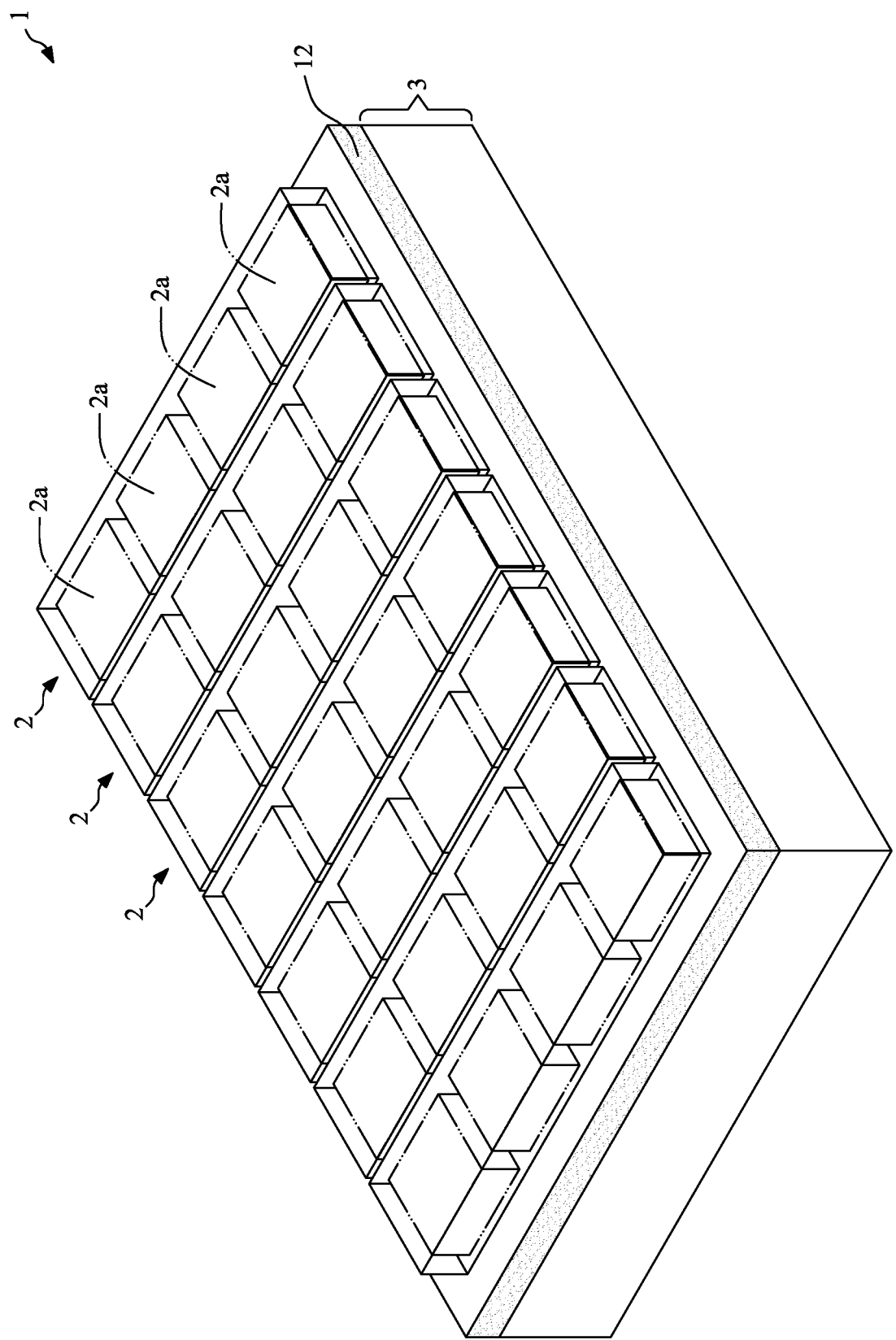
FIG. 1 illustrates a perspective view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 μm/2 μm, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

Figure 2:
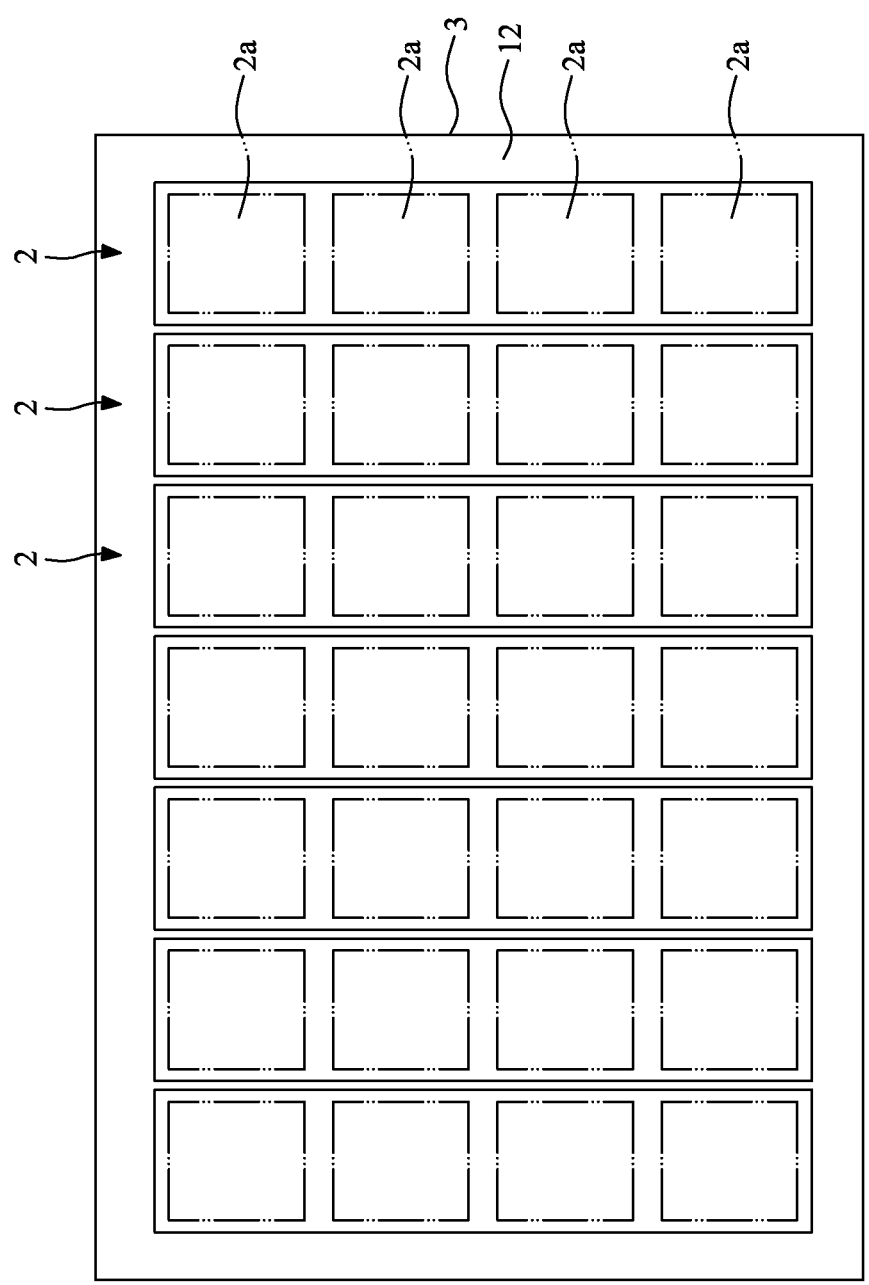
FIG. 2 illustrates a top view of the wiring structure of FIG. 1.
Figure 3:
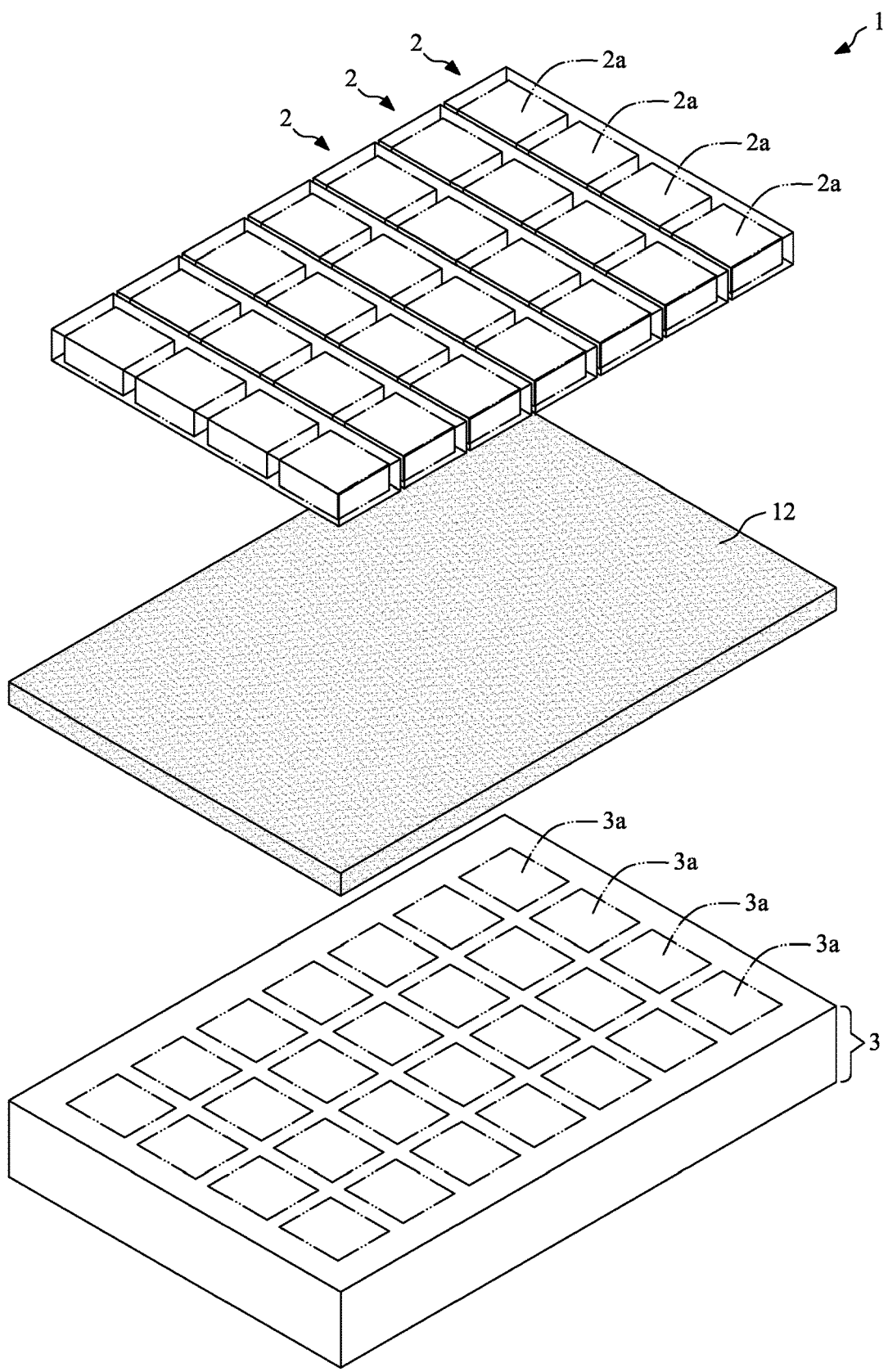
FIG. 3 illustrates an exploded view of the wiring structure of FIG. 1.
Figure 4:
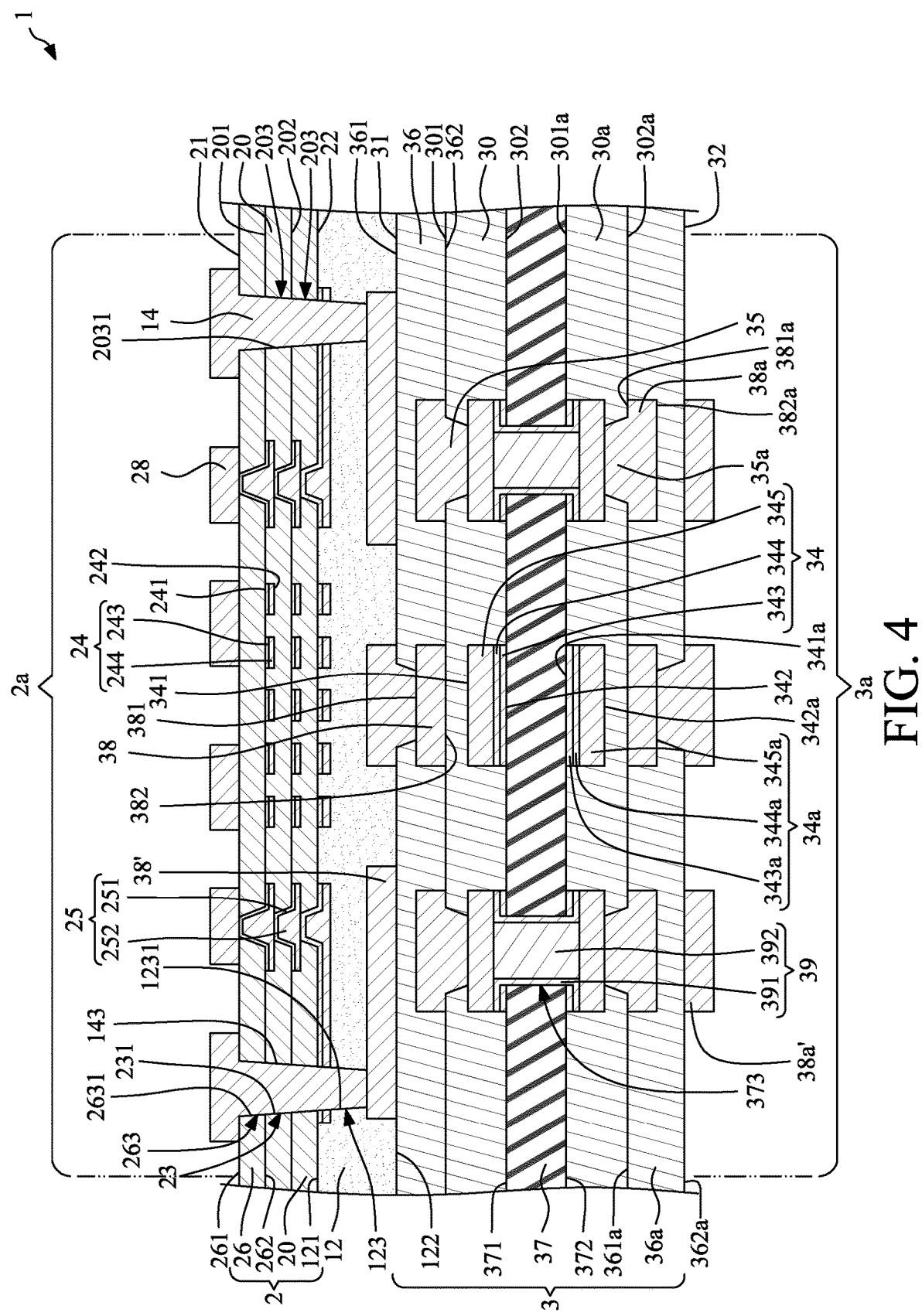
FIG. 4 illustrates a cross-sectional view of a portion of the wiring structure of FIG. 1.

FIG. 1 illustrates a perspective view of a wiring structure 1 according to some embodiments of the present disclosure. FIG. 2 illustrates a top view of the wiring structure 1 of FIG. 1. FIG. 3 illustrates an exploded view of the wiring structure 1 of FIG. 1. FIG. 4 illustrates a cross-sectional view of a portion of the wiring structure 1 of FIG. 1. The wiring structure 1 includes a plurality of upper strips 2, a lower substrate 3, an intermediate layer 12 and at least one upper through via 14.

As shown in FIG. 1 to FIG. 3, the upper strips 2 are disposed on the lower substrate 3 side by side. In some embodiments, the upper strips 2 are attached to the lower substrate 3 through the intermediate layer 12. Each of the upper strips 2 includes at least one upper conductive structure 2a. For example, each of the upper strips 2 may include a plurality of upper conductive structures 2a arranged in a row. It is noted that the upper strip 2 is in a strip type before a singulation process, and may be also referred to as an upper conductive structure. The upper conductive structure 2a may be a die unit after a singulation process.

As shown in FIG. 4, the upper conductive structure 2a includes at least one dielectric layer (including, for example, two first dielectric layers 20 and a second dielectric layer 26) and at least one circuit layer (including, for example, three first circuit layers 24 and a second circuit layer 28 formed of a metal, a metal alloy, or other conductive material) in contact with the dielectric layer (e.g., the first dielectric layers 20 and the second dielectric layer 26). In some embodiments, the upper conductive structure 2a may be similar to a coreless substrate. The upper conductive structure 2*a* may be also referred to as "a stacked structure" or "a high-density conductive structure" or "a high-density stacked structure". The circuit layer (including, for example, the three circuit layers 24) of the upper conductive structure 2*a* may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2*a* has a top surface 21 and a bottom surface 22 opposite to the top surface 21, and defines at least one through hole 23, each of which is a single, continuous through hole. The upper conductive structure 2*a* includes a plurality of dielectric layers (e.g., the two first dielectric layers 20 and the second dielectric layer 26), a plurality of circuit layers (e.g., the three first circuit layers 24 and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2*a* can be recognized or detected from the top surface 21 of the upper conductive structure 2*a* by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201, and defines a through hole 203 having an inner surface 2031. The second dielectric layer 26 has a top surface 261 and a bottom surface 262 opposite to the top surface 261, and defines a through hole 263 having an inner surface 2631. The bottom surface 262 of the second dielectric layer 26 is disposed on and contacts the top surface 201 of the adjacent first dielectric layer 20. Thus, the top surface 21 of the upper conductive structure 2*a* is the top surface 261 of the second dielectric layer 26, and the bottom surface 22 of the upper conductive structure 2*a* is the bottom surface 202 of the bottommost first dielectric layer 20.

As shown in FIG. 4, each of the through holes 203 of the first dielectric layers 20 tapers downwardly along a direction from the top surface 21 towards the bottom surface 22 of the upper conductive structure 2*a*; that is, a size of a top portion of the through hole 203 is greater than a size of a bottom portion of the through hole 203. The through hole 263 of the second dielectric layer 26 also tapers downwardly; that is, a size of a top portion of the through hole 263 is greater than a size of a bottom portion of the through hole 263. Further, the through hole 263 of the second dielectric layer 26 is aligned with and in communication with the through holes 203 of the first dielectric layers 20. The bottom portion of the through hole 263 of the second dielectric layer 26 is disposed adjacent to or connected to the top portion of the through hole 203 of the first dielectric layer 20 under the second dielectric layer 26. The size of the bottom portion of the through hole 263 of the second dielectric layer 26 is substantially equal to the size of the top portion of the through hole 203 of the first dielectric layer 20 under the second dielectric layer 26. Thus, the inner surface 2631 of the through hole 263 of the second dielectric layer 26 is coplanar with or aligned with the inner surfaces 2031 of the through holes 203 of the first dielectric layers 20. It is noted that the above-mentioned "coplanar" surfaces need not be flat. In some embodiments, the inner surface 2631 of the through hole 263 of the second dielectric layer 26 and the inner surfaces 2031 of the through holes 203 of the first dielectric layers 20 may be curved surfaces, and are portions of an inner surface 231 of the single, continuous through hole 23 for accommodating the upper through via 14. The through hole 263 of the second dielectric layer 26 and the through holes 203 of the first dielectric layers 20 are collectively configured to form or define a portion of the single through hole 23. As shown in FIG. 4, cross-sectional views of one side of the inner surface 2631 of the through hole 263 of the second dielectric layer 26 and the inner surfaces 2031 of the through holes 203 of the first dielectric layers 20 are segments of a substantially straight line. That is, cross-sectional views of one side of the inner surface 2631 of the through hole 263 of the second dielectric layer 26 and the inner surfaces 2031 of the through holes 203 of the first dielectric layers 20 may extend along the same substantially straight line. The single through hole 23 extends through the upper conductive structure 2; that is, the single through hole 23 extends from the top surface 21 of the upper conductive structure 2*a* to the bottom surface 22 of the upper conductive structure 2*a*. The single through hole 23 tapers downwardly.

The first circuit layers 24 may be fan-out circuit layers or redistribution layers (RDLs), and an L/S of the first circuit layers 24 may be less than or equal to about 2 μm/about 2 μm, or less than or equal to about 1.8 μm/about 1.8 μm. Each of the first circuit layers 24 has a top surface 241 and a bottom surface 242 opposite to the top surface 241. In some embodiments, the first circuit layer 24 is embedded in the corresponding first dielectric layer 20, and the top surface 241 of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 4, the bottommost first circuit layer 24 is disposed on and protrudes from the bottom surface 22 of the upper conductive structure 2*a* (e.g., the bottom surface 202 of the bottommost first dielectric layer 20). In addition, the second circuit layer 28 is disposed on and protrudes from the top surface 21 of the upper conductive structure 2*a* (e.g., the top surface 261 of the second dielectric layer 26). An L/S of the second circuit layer 28 may be greater than or equal to the L/S of the first circuit layer 24. As illustrated in the embodiment of FIG. 4, a horizontally connecting or extending circuit layer is omitted in the second dielectric layer 26.

The upper conductive structure 2*a* includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 μm, such as about 25 μm, about 20 μm about 15 μm or about 10 μm.

As shown in FIG. 1 to FIG. 3, the lower substrate 3 includes at least one lower conductive structure 3a. For example, the lower substrate 3 may include a plurality of lower conductive structures 3a arranged in an array. Alternatively, the lower substrate 3 may be a panel type. It is noted that the lower substrate 3 is in a substrate type before a singulation process, and may be also referred to as a lower conductive structure. The lower conductive structure 3a may be a die unit after a singulation process. A position of the upper conductive structure 2a corresponds to a position of the lower conductive structure 3a. In some embodiments, the upper conductive structure 2a may be disposed right above the lower conductive structure 3a, and a central axis of the upper conductive structure 2a may be aligned with a central axis of the lower conductive structure 3a.

As shown in FIG. 4, the lower conductive structure 3a includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3a may be similar to a core substrate that further includes a core portion 37. The lower conductive structure 3a may be also referred to as "a stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3a may be also referred to as "a low-density circuit layer". As shown in FIG. 4, the lower conductive structure 3a has a top surface 31 and a bottom surface 32 opposite to the top surface 31. The lower conductive structure 3a includes a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 contacts the top surface 301 of the first upper dielectric layer 30, and the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The second lower dielectric layer 36a is stacked or disposed on the first lower dielectric layer 30a, and has a top surface 361a and a bottom surface 362a opposite to the top surface 361a. Thus, the top surface 361a of the second lower dielectric layer 36a contacts the bottom surface 302a of the first lower dielectric layer 30a, and the second lower dielectric layer 36a is the bottommost dielectric layer. As shown in FIG. 4, the top surface 31 of the lower conductive structure 3a is the top surface 361 of the second upper dielectric layer 36, and the bottom surface 32 of the lower conductive structure 3a is the bottom surface 362a of the second lower dielectric layer 36a.

A thickness of each of the dielectric layers (e.g., the first dielectric layers 20 and the second dielectric layer 26) of the upper conductive structure 2a is less than or equal to about 40%, less than or equal to about 35%, less than or equal to about 30% of a thickness of each of the dielectric layers (e.g., the first upper dielectric layer 30, the second upper dielectric layer 36, the first lower dielectric layer 30a and the second lower dielectric layer 36a) of the lower conductive structure 3a. For example, a thickness of each of the dielectric layers (e.g., the first dielectric layers 20 and the second dielectric layer 26) of the upper conductive structure 2a may be less than or equal to about 7 μm, and a thickness of each of the dielectric layers (e.g., the first upper dielectric layer 30, the second upper dielectric layer 36, the first lower dielectric layer 30a and the second lower dielectric layer 36a) of the lower conductive structure 3a may be about 40 μm.

An L/S of the first upper circuit layer 34 may be greater than or equal to about 10 μm/about 10 μm. Thus, the L/S of the first upper circuit layer 34 may be greater than or equal to about five times the L/S of the first circuit layers 24 of the upper conductive structure 2a. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the first circuit layers 24 of the upper conductive structure 2a. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3a.

In addition, in some embodiments, the second upper circuit layer 38' is disposed on and protrudes from the top surface 361 of the second upper dielectric layer 36. In some embodiments, the second upper circuit layer 38 is electrically connected to the second upper circuit layer 38' through the upper interconnection vias 35. That is, the upper interconnection vias 35 are disposed between the second upper circuit layers 38, 38' for electrically connecting the second upper circuit layers 38, 38'. In some embodiments, the second upper circuit layer 38' and the upper interconnection vias 35 are formed integrally as a monolithic or one-piece structure.

An L/S of the first lower circuit layer 34a may be greater than or equal to about 10 μm/about 10 μm. Thus, the L/S of the first lower circuit layer 34a may be greater than or equal to about five times the L/S of the first circuit layers 24 of the upper conductive structure 2a. The first lower circuit layer 34a has a top surface 341a and a bottom surface 342a opposite to the top surface 341a. In some embodiments, the first lower circuit layer 34a is formed or disposed on the bottom surface 372 of the core portion 37, and covered by the first lower dielectric layer 30a. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the first circuit layers 24 of the upper conductive structure 2a. The second lower circuit layer 38a has a top surface 381a and a bottom surface 382a opposite to the top surface 381a. In some embodiments, the second lower circuit layer 38a is formed or disposed on the bottom surface 302a of the first lower dielectric layer 30a, and covered by the second lower dielectric layer 36a. The top surface 381a of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection vias 35a tapers upwardly along a direction from the bottom surface 32 towards the top surface 31 of the lower conductive structure 3a.

In addition, in some embodiments, the second lower circuit layer 38a' is disposed on and protrudes from the bottom surface 362a of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' and the lower interconnection vias 35a are formed integrally as a monolithic or one-piece structure.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper strips 2 and the lower substrate 3 to bond the upper strips 2 and the lower substrate 3 together. That is, the intermediate layer 12 adheres to the bottom surface 22 of the upper conductive structure 2a and the top surface 31 of the lower conductive structure 3a. In some embodiments, the intermediate layer 12 may be an adhesion layer that is cured from an adhesive material (e.g., includes a cured adhesive material such as an adhesive polymeric material).

The intermediate layer 12 has a top surface 121 and a bottom surface 122 opposite to the top surface 121, and defines at least one through hole 123 having an inner surface 1231. The top surface 121 of the intermediate layer 12 contacts the bottom surface 22 of the upper conductive structure 2a (that is, the bottom surface 22 of the upper conductive structure 2a is attached to the top surface 121 of the intermediate layer 12), and the bottom surface 122 of the intermediate layer 12 contacts the top surface 31 of the lower conductive structure 3a. Thus, the bottommost first circuit layer 24 of the upper conductive structure 2a and the topmost circuit layer 38' (e.g., the second upper circuit layer 38') of the lower conductive structure 3a are embedded in the intermediate layer 12. In some embodiments, a bonding force between two adjacent dielectric layers (e.g., two adjacent first dielectric layers 20) of the upper conductive structure 2a is greater than a bonding force between a dielectric layer (e.g., the bottommost first dielectric layers 20) of the upper conductive structure 2a and the intermediate layer 12. A surface roughness of a boundary between two adjacent dielectric layers (e.g., two adjacent first dielectric layers 20) of the upper conductive structure 2a is greater than a surface roughness of a boundary between a dielectric layer (e.g., the bottommost first dielectric layers 20) of the upper conductive structure 2a and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 31 of the lower conductive structure 3a can be recognized or detected from the top surface 21 of the upper conductive structure 2a by human eyes or machine. In addition, a material of the intermediate layer 12 may include an insulating film, such as Ajinomoto build-up film (ABF).

The through hole 123 extends through the intermediate layer 12. In some embodiments, the through hole 123 of the intermediate layer 12 may extend through the bottommost first circuit layer 24 of the upper conductive structure 2a and terminate at or on a topmost circuit layer (e.g., the second upper circuit layer 38') of the lower conductive structure 3a. That is, the through hole 123 of the intermediate layer 12 does not extend through the topmost circuit layer (e.g., the second upper circuit layer 38') of the lower conductive structure 3a. The through hole 123 of the intermediate layer 12 may expose a portion of the topmost circuit layer (e.g., the top surface of the second upper circuit layer 38') of the lower conductive structure 3a.

As shown in FIG. 4, the through hole 123 of the intermediate layer 12 tapers downwardly along a direction from the top surface 121 towards the bottom surface 122 of the intermediate layer 12; that is, a size of a top portion of the through hole 123 is greater than a size of a bottom portion of the through hole 123. Further, the through hole 123 of the intermediate layer 12 is aligned with and in communication with the through holes 203 of the first dielectric layers 20 and the through hole 263 of the second dielectric layer 26. The bottom portion of the through hole 203 of the bottommost first dielectric layer 20 is disposed adjacent to or connected to the top portion of the through hole 123 of the intermediate layer 12. The size of the bottom portion of the through hole 203 of the bottommost first dielectric layer 20 is substantially equal to the size of the top portion of the through hole 123 of the intermediate layer 12. Thus, the inner surface 1231 of the through hole 123 of the intermediate layer 12 is coplanar or aligned with the inner surfaces 2031 of the through holes 203 of the first dielectric layers 20 and the inner surface 2631 of the through hole 263 of the second dielectric layer 26. In some embodiments, inner surface 1231 of the through hole 123 of the intermediate layer 12 may be a curved surface, and is a portion of an inner surface 231 of the single, continuous through hole 23 for accommodating the upper through via 14. The through hole 123 of the intermediate layer 12, the through hole 203 of the first dielectric layer 20 and the through hole 263 of the second dielectric layer 26 are collectively configured to form or define the single through hole 23. Thus, the single through hole 23 includes the through hole 123 of the intermediate layer 12, the through hole 203 of the first dielectric layer 20 and the through hole 263 of the second dielectric layer 26.

As shown in FIG. 4, cross-sectional views of one side of the through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. The single through hole 23 extends through the upper conductive structure 2a and the intermediate layer 12; that is, the single through hole 23 extends from the top surface 21 of the upper conductive structure 2a to the bottom portion of the intermediate layer 12 to expose a portion of the topmost circuit layer (e.g., the top surface of the second upper circuit layer 38') of the lower conductive structure 3a. The single through hole 23 tapers downwardly. A maximum width (e.g., at the top portion) of the single through hole 23 may be about 25 µm to about 60 µm.

The upper through via 14 is formed or disposed in the corresponding single through hole 23, and is formed of a metal, a metal alloy, or other conductive material. Thus, the upper through via 14 extends through at least a portion of the upper conductive structure 2a and the intermediate layer 12, and is electrically connected to the topmost circuit layer (e.g., the top surface of the second upper circuit layer 38') of the lower conductive structure 3a. As shown in FIG. 4, the upper through via 14 extends through and contacts the bottommost first circuit layer 24 of the upper conductive structure 2a, and terminates at or on, and contacts a portion of the topmost circuit layer (e.g., the top surface of the second upper circuit layer 38') of the lower conductive structure 3a. The upper through via 14 extends from the top surface 21 of the upper conductive structure 2a to the bottom surface 122 of the intermediate layer 12. Thus, the upper through via 14 extends to contact a portion of the lower conductive structure 3a, and the upper through via 14 does not extend through the lower conductive structure 3a. In some embodiments, a low-density circuit layer (e.g., the second upper circuit layer 38') of the low-density conductive structure (e.g., the lower conductive structure 3a) is electrically connected to a high-density circuit layer (e.g., the bottommost first circuit layer 24) of the high-density conductive structure (e.g., the upper conductive structure 2a) solely by the upper through via 14 extending through the high-density circuit layer (e.g., the bottommost first circuit layer 24) of the high-density conductive structure (e.g., the upper conductive structure 2a). A length (along a longitudinal axis) of the upper through via 14 is greater than a thickness of the high-density conductive structure (e.g., the upper conductive structure 2a). Further, the upper through via 14 tapers downwardly; that is, a size of a top portion of the upper through via 14 is greater than a size of a bottom portion of the upper through via 14. Thus, a tapering direction of the inner via 25 of the upper conductive structure 2a is different from a tapering direction of the upper through via 14. In some embodiments, the upper through via 14 is a monolithic structure or a one-piece structure having a homogeneous material composition, and a peripheral surface of the upper through via 14 is a substantially continuous surface without boundaries. The upper through via 14 and the second circuit layer 28 may be formed integrally as a monolithic or one-piece structure. In some embodiments, a maximum width of the upper through via 14 may be less than about 40 µm, such as about 30 µm or about 20 µm.

As shown in the embodiment illustrated in FIG. 1 to FIG. 4, the wiring structure 1 is a combination of the upper strips 2 and the lower substrate 3 (e.g., the upper conductive structure 2a and the lower conductive structure 3a), in which the first circuit layer 24 of the upper strip 2 (e.g., the upper conductive structure 2a) has fine pitch, high yield and low thickness; and the circuit layers (e.g., the first upper circuit layer 34, the second upper circuit layers 38, 38', the first lower circuit layer 34a and the second lower circuit layers 38a, 38a') of the lower substrate 3 (e.g., the lower conductive structure 3a) have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the first circuit layers 24 of the upper strip 2 (e.g., the upper conductive structure 2a) and six layers of the circuit layers (e.g., the first upper circuit layer 34, the second upper circuit layers 38, 38', the first lower circuit layer 34a and the second lower circuit layers 38a, 38a') of the lower substrate 3 (e.g., the lower conductive structure 3a). The manufacturing yield for one layer of the first circuit layers 24 of the upper strip 2 (e.g., the upper conductive structure 2a) may be 99%, and the manufacturing yield for one layer of the circuit layers (e.g., the first upper circuit layer 34, the second upper circuit layers 38, 38', the first lower circuit layer 34a and the second lower circuit layers 38a, 38a') of the lower substrate 3 (e.g., the lower conductive structure 3a) may be 90%. Thus, the yield of the wiring structure 1 may be improved.

In addition, the warpage of the upper strip 2 (e.g., the upper conductive structure 2a) and the warpage of the lower substrate 3 (e.g., the lower conductive structure 3a) are separated and will not influence each other. In some embodiments, a warpage shape of the upper strip 2 (e.g., the upper conductive structure 2a) may be different from a warpage shape of the lower substrate 3 (e.g., the lower conductive structure 3a). For example, the warpage shape of the upper strip 2 (e.g., the upper conductive structure 2a) may be a convex shape, and the warpage shape of the lower substrate 3 (e.g., the lower conductive structure 3a) may be a concave shape. In some embodiments, the warpage shape of the upper strip 2 (e.g., the upper conductive structure 2a) may be the same as the warpage shape of the lower substrate 3 (e.g., the lower conductive structure 3a); however, the warpage of the lower substrate 3 (e.g., the lower conductive structure 3a) will not be accumulated onto the warpage of the upper strip 2 (e.g., the upper conductive structure 2a). Thus, the yield of the wiring structure 1 may be further improved.

In addition, during a manufacturing process, the lower substrate 3 (e.g., the lower conductive structure 3a) and the upper strip 2 (e.g., the upper conductive structure 2a) may be tested individually before being bonded together. Therefore, known good lower substrate 3 (e.g., the lower conductive structure 3a) and known good upper strip 2 (e.g., the upper conductive structure 2a) may be selectively bonded together. Bad (or unqualified) lower substrate 3 (e.g., the lower conductive structure 3a) and bad (or unqualified) upper strip 2 (e.g., the upper conductive structure 2a) may be discarded. As a result, the yield of the wiring structure 1 may be further improved.

In addition, during a manufacturing process, the relative positions of the upper strips 2 are separated and will not influence each other. In some embodiments, if one or some of the upper strips 2 may be shifted with respect to a predetermined position of the lower substrate 3, the other upper strips 2 still can be disposed on a predetermined position of the lower substrate 3. In addition, the design of the upper strips 2 can increase effective area of the lower substrate 3. That is, the lower substrate 3 can carry more upper strips 2 (or upper conductive structures 2a) as compared with a panel type of upper conductive structure.

Figure 5:
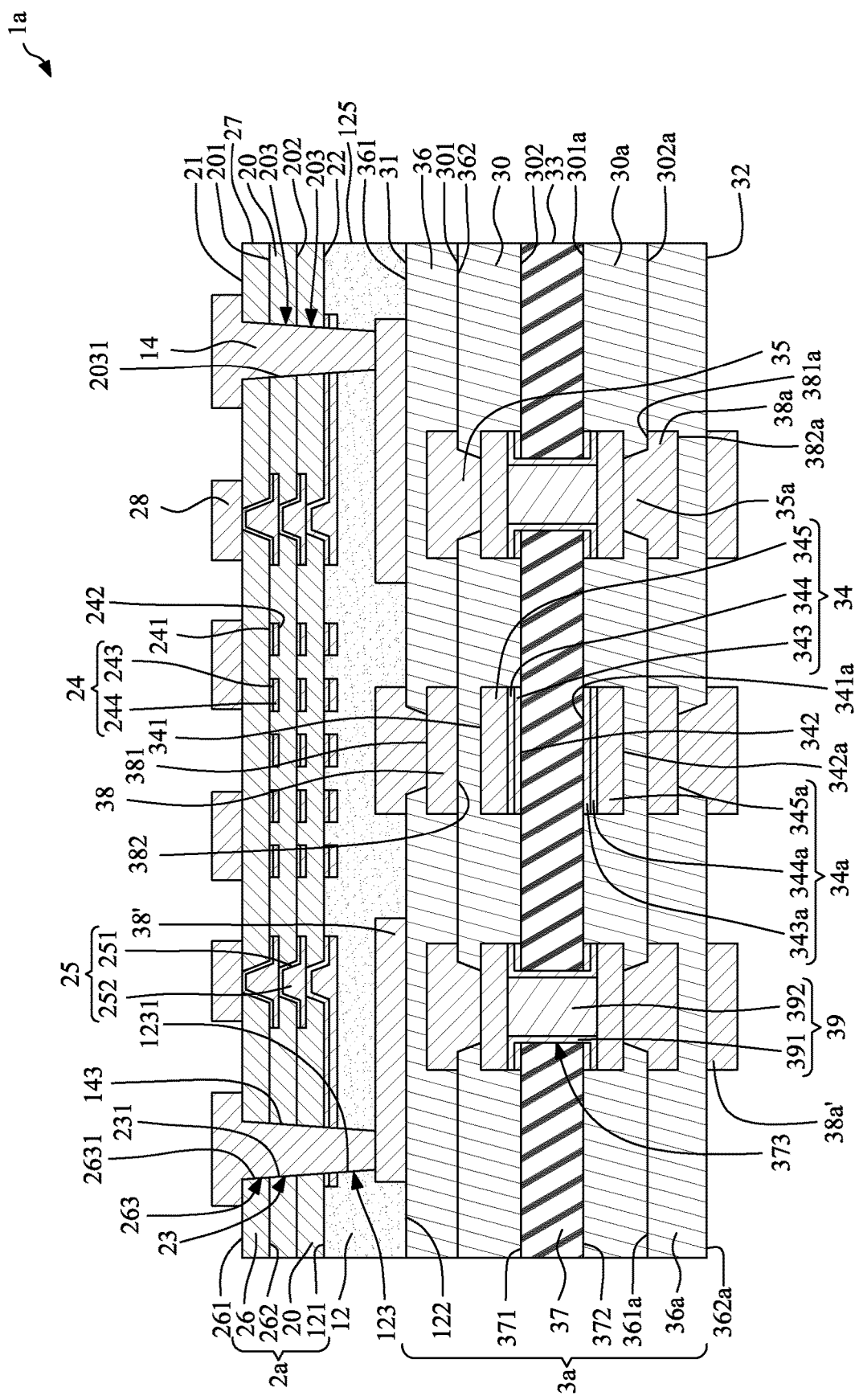
FIG. 5 illustrates a cross-sectional view of a wiring structure according to some embodiments of the present disclosure.

FIG. 5 illustrates a cross-sectional view of a wiring structure 1a according to some embodiments of the present disclosure. The wiring structure 1a is similar to the wiring structure 1 shown in FIG. 4, except for structures of an upper conductive structure 2a and a lower conductive structure 3a. As shown in FIG. 5, the upper conductive structure 2a and the lower conductive structure 3a are both die units after a singulation process. In addition, a lateral peripheral surface 27 of the upper conductive structure 2a, a lateral peripheral surface 125 of the intermediate layer 12 and a lateral peripheral surface 33 of the lower conductive structure 3a are substantially coplanar with each other. That is, a size of the upper conductive structure 2a is equal to a size of the lower conductive structure 3a.

Figure 6:
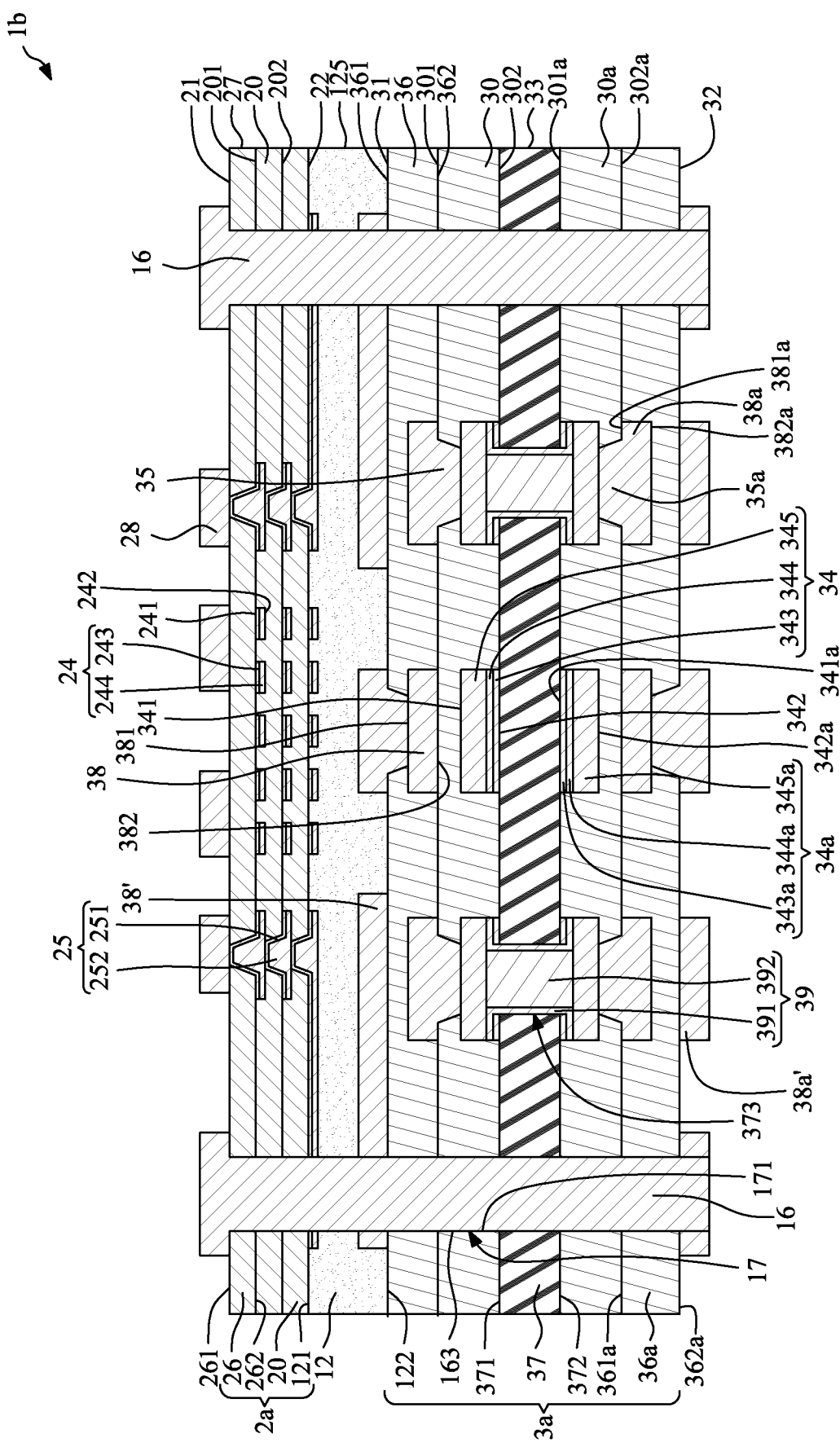
FIG. 6 illustrates a cross-sectional view of a wiring structure according to some embodiments of the present disclosure.

FIG. 6 illustrates a cross-sectional view of a wiring structure 1b according to some embodiments of the present disclosure. The wiring structure 1b is similar to the wiring structure 1a shown in FIG. 5, except for a structure of at least one through via 16. The through via 16 is disposed in a single, continuous through hole 17. The single through hole 17 extends through the upper conductive structure 2a, the intermediate layer 12 and the lower conductive structure 3a (including the second lower circuit layer 38a'); that is, the single through hole 17 extends from the top surface 21 of the upper conductive structure 2a to the bottom surface 32 of the lower conductive structure 3a. A maximum width of the single through hole 17 may be about 100 µm to about 1000 µm. In some embodiments, the single through hole 17 may be formed by mechanical drilling. Thus, the through hole 17 may not taper, and the inner surface 171 of the through hole 17 may be substantially perpendicular to the top surface 21 of the upper conductive structure 2a and/or the bottom surface 32 of the lower conductive structure 3a.

Each through via 16 is formed or disposed in the corresponding through hole 17, and is formed of a metal, a metal alloy, or other conductive material. Thus, the through via 16 extends through the upper conductive structure 2a, the intermediate layer 12 and the lower conductive structure 3a. As shown in FIG. 6, the lower through via 16 extends through and contacts the bottommost circuit layer 24 of the upper conductive structure 2a, the topmost circuit layer (e.g., the second upper circuit layer 38') of the lower conductive structure 3a, and the bottommost circuit layer (e.g., the second lower circuit layer 38a') of the lower conductive structure 3a. In some embodiments, a low-density circuit layer (e.g., the second upper circuit layer 38')

of the low-density conductive structure (e.g., the lower conductive structure 3a) is electrically connected to a high-density circuit layer (e.g., the first circuit layer 24) of the high-density conductive structure (e.g., the upper conductive structure 2a) solely by the through via 16. In some embodiments, the through via 16 is a monolithic structure or one-piece structure having a homogeneous material composition, and a peripheral surface 163 of the through via 16 is a substantially continuous surface without boundaries. The through via 16 and the outer circuit layer 28 may be formed integrally.

Figure 7:
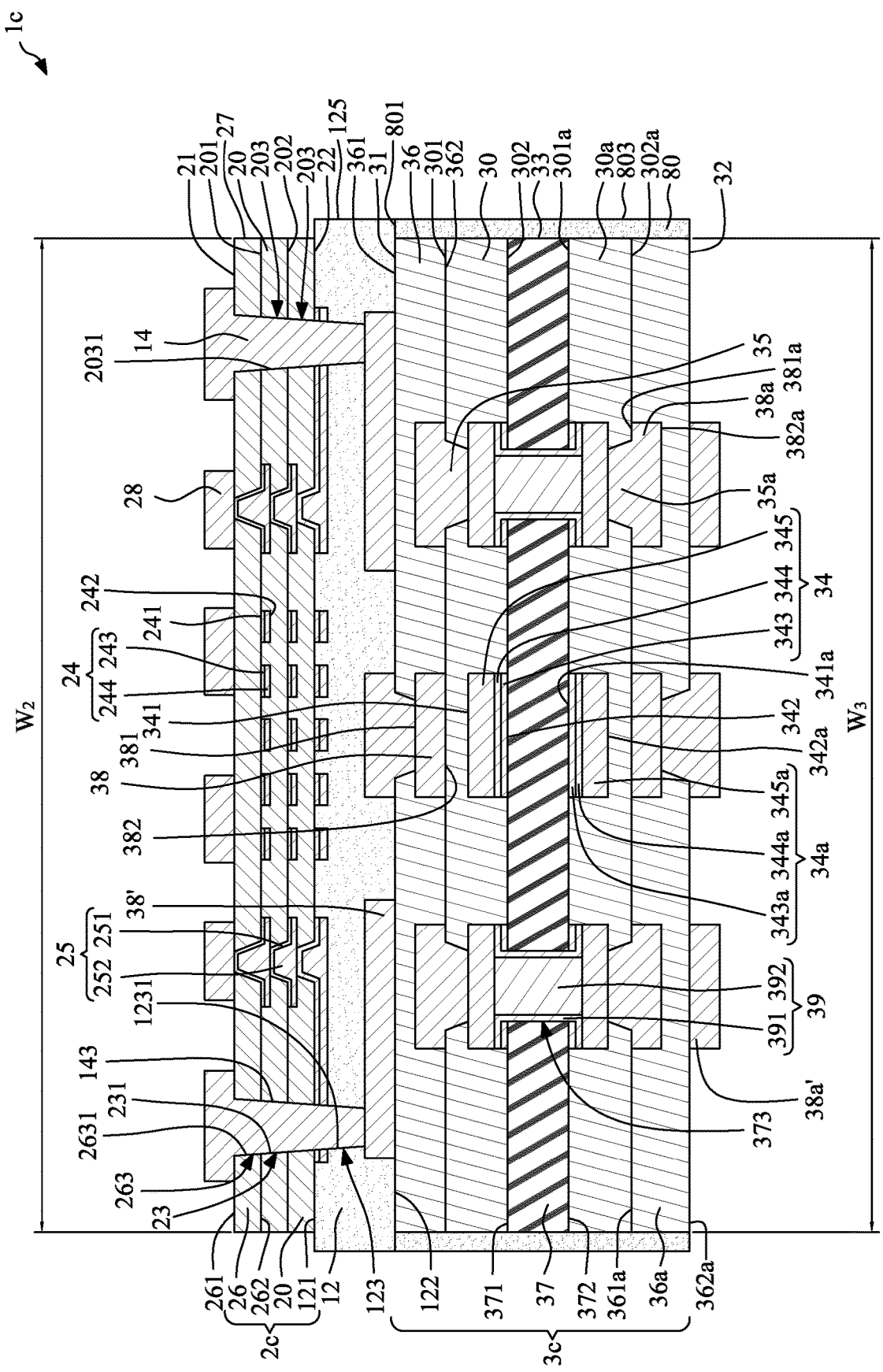
FIG. 7 illustrates a cross-sectional view of a wiring structure according to some embodiments of the present disclosure.

FIG. 7 illustrates a cross-sectional view of a wiring structure 1c according to some embodiments of the present disclosure. The wiring structure 1c is similar to the wiring structure 1a shown in FIG. 5, except for structures of an upper conductive structure 2c, a lower conductive structure 3c and a lower encapsulant 80. A size of the upper conductive structure 2c is substantially equal to a size of the lower conductive structure 3c. Thus, a width W2 of the upper conductive structure 2c is substantially equal to a width W3 of the lower conductive structure 3c. The lateral peripheral surface 27 of the upper conductive structure 2c is substantially coplanar with the lateral peripheral surface 33 of the lower conductive structure 3c. The lower encapsulant 80 surrounds the lateral peripheral surface 33 of the lower conductive structure 3c. In some embodiments, the lower encapsulant 80 may be a molding compound, and may cover and contact the lateral peripheral surface 33 of the lower conductive structure 3c. Thus, the lateral peripheral surface 27 of the upper conductive structure 2c is not coplanar with (e.g., is inwardly recessed from or otherwise displaced from) a lateral peripheral surface 803 of the lower encapsulant 80. In addition, a portion of the intermediate layer 12 covers a top surface 801 of the lower encapsulant 80. Thus, the lateral peripheral surface 27 of the upper conductive structure 2c is not coplanar with (e.g., is inwardly recessed from or otherwise displaced from) the lateral peripheral surface 125 of the intermediate layer 12. In some embodiments, during a manufacturing process, a plurality of lower conductive structures 3c may be known good die units and are reconstituted and encapsulated in the lower encapsulant 80. Then, a plurality of known good upper conductive structures 2c are attached to the lower conductive structures 3c respectively. Then, a singulation process is conducted along the lower encapsulant 80. Thus, a portion of the lower encapsulant 80 remains on the lateral peripheral surface 33 of the lower conductive structure 3c.

Figure 8:
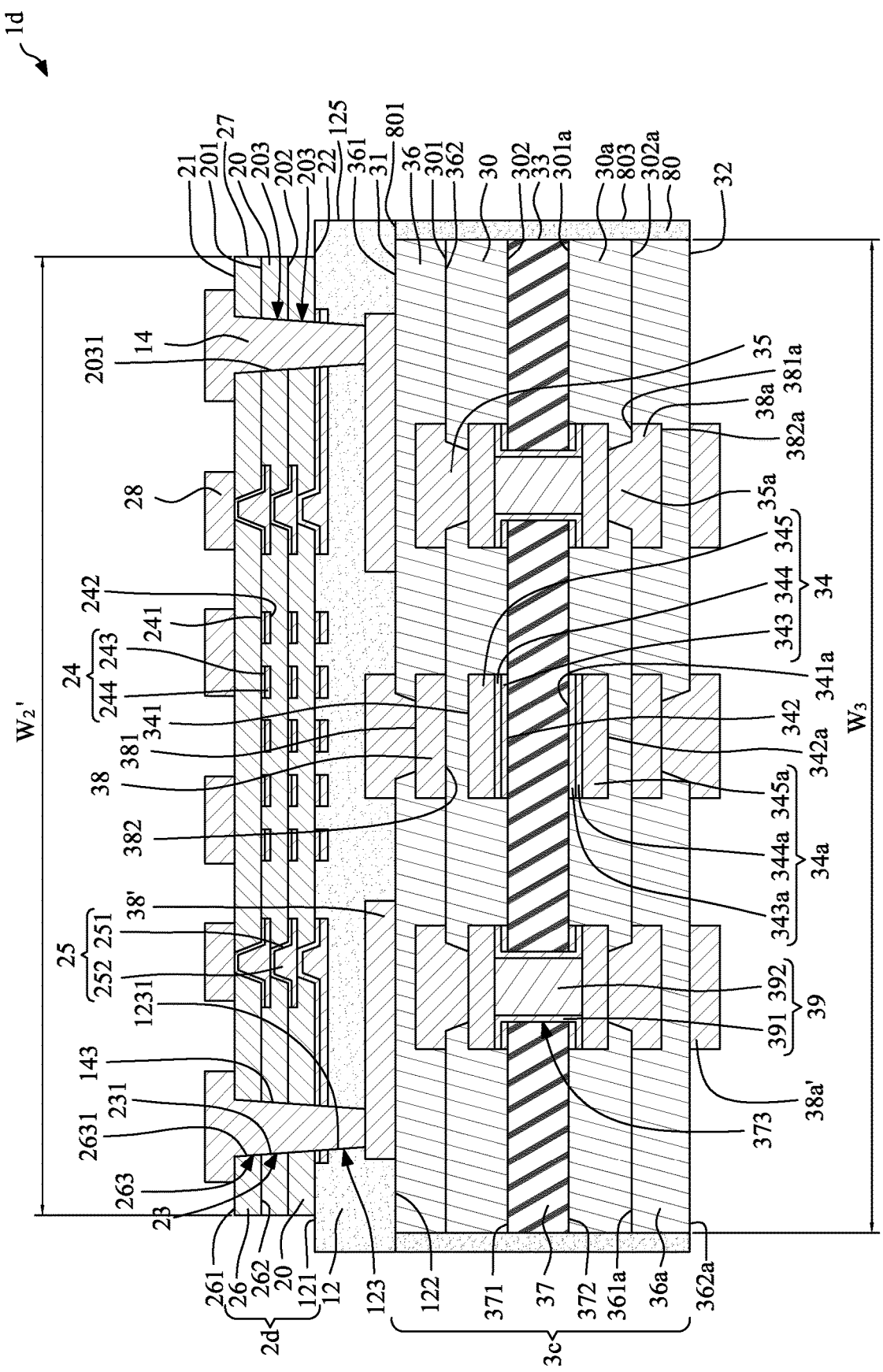
FIG. 8 illustrates a cross-sectional view of a wiring structure according to some embodiments of the present disclosure.

FIG. 8 illustrates a cross-sectional view of a wiring structure 1d according to some embodiments of the present disclosure. The wiring structure 1d is similar to the wiring structure 1c shown in FIG. 7, except for a structure of an upper conductive structure 2d. A size of the upper conductive structure 2d is smaller than a size of the lower conductive structure 3c. Thus, a width W2' of the upper conductive structure 2d is less than the width W3 of the lower conductive structure 3c. The lateral peripheral surface 27 of the upper conductive structure 2d is not coplanar with (e.g., is inwardly recessed from or otherwise displaced from) the lateral peripheral surface 33 of the lower conductive structure 3c.

Figure 9:
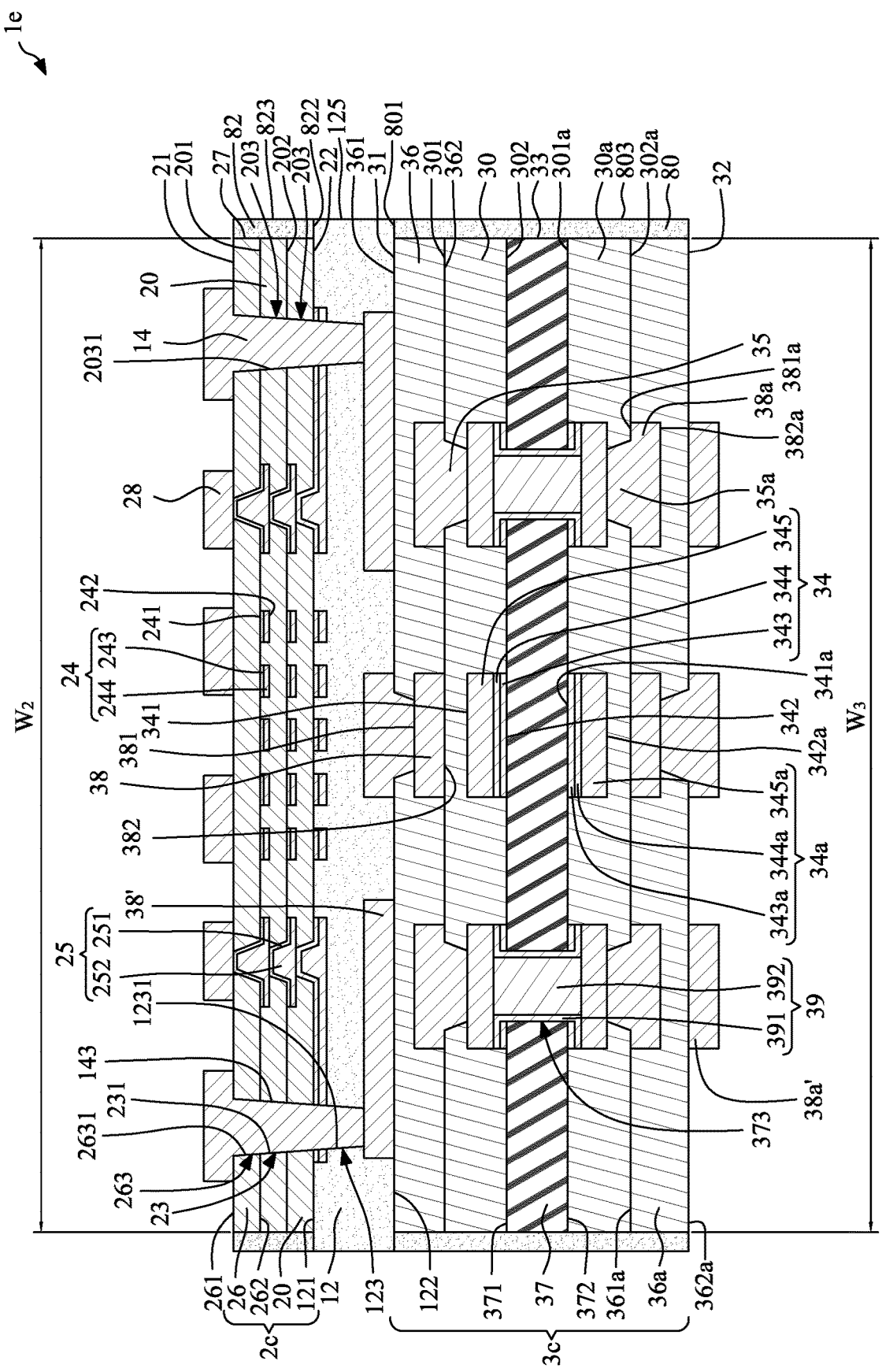
FIG. 9 illustrates a cross-sectional view of a wiring structure according to some embodiments of the present disclosure.

FIG. 9 illustrates a cross-sectional view of a wiring structure 1e according to some embodiments of the present disclosure. The wiring structure 1e is similar to the wiring structure 1c shown in FIG. 7, except that an upper encapsulant 82 is further included. The upper encapsulant 82 surrounds the lateral peripheral surface 27 of the upper conductive structure 2c. In some embodiments, the upper encapsulant 82 may be a molding compound, and may cover and contact the lateral peripheral surface 27 of the upper conductive structure 2c. Thus, a lateral peripheral surface 823 of the upper encapsulant 82 is substantially coplanar with the lateral peripheral surface 803 of the lower encapsulant 80. In addition, the upper encapsulant 82 may cover and contact a portion a top surface of the intermediate layer 12. In some embodiments, during a manufacturing process, a plurality of lower conductive structures 3c may be known good die units and are reconstituted and encapsulated in the lower encapsulant 80, and a plurality of upper conductive structures 2c may be known good die units and are reconstituted and encapsulated in the upper encapsulant 82. Then, the conductive structures 2c with the upper encapsulant 82 are attached to the lower conductive structures 3c with the lower encapsulant 80. Then, a singulation process is conducted along the upper encapsulant 82 and the lower encapsulant 80. Thus, a portion of the upper encapsulant 82 remains on the lateral peripheral surface 27 of the upper conductive structure 2c, and a portion of the lower encapsulant 80 remains on the lateral peripheral surface 33 of the lower conductive structure 3c.

Figure 10:
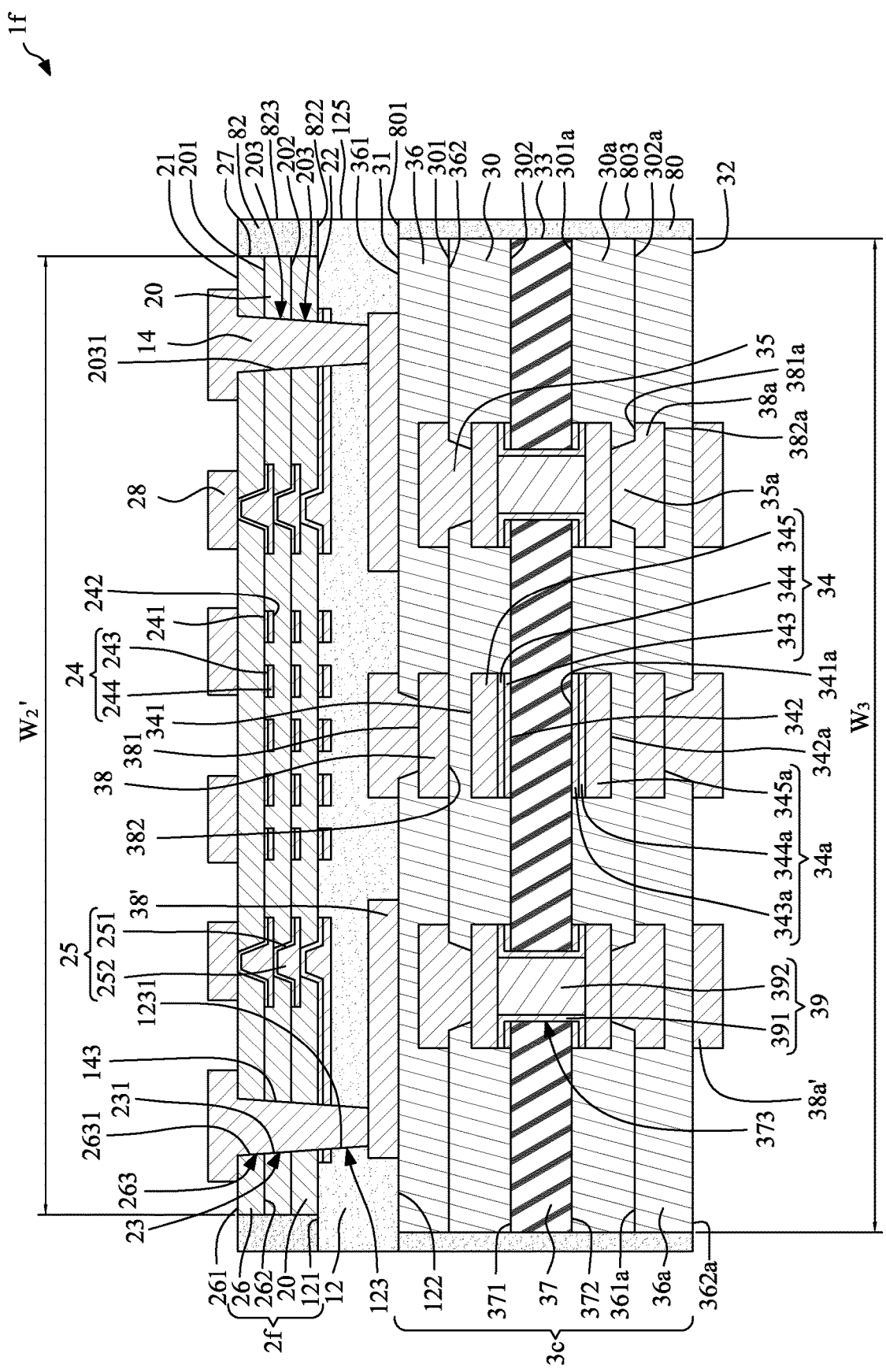
FIG. 10 illustrates a cross-sectional view of a wiring structure according to some embodiments of the present disclosure.

FIG. 10 illustrates a cross-sectional view of a wiring structure if according to some embodiments of the present disclosure. The wiring structure if is similar to the wiring structure 1e shown in FIG. 9, except for a structure of an upper conductive structure 2f. A size of the upper conductive structure 2f is smaller than a size of the lower conductive structure 3c. Thus, a width W2' of the upper conductive structure 2f is less than the width W3 of the lower conductive structure 3c. The lateral peripheral surface 27 of the upper conductive structure 2f is not coplanar with (e.g., is inwardly recessed from or otherwise displaced from) the lateral peripheral surface 33 of the lower conductive structure 3c.

FIG. 11 through FIG. 51 illustrate a method for manufacturing a wiring structure according to some embodiments of the present disclosure. In some embodiments, the method is for manufacturing the wiring structure 1 shown in FIG. 4 and/or the wiring structure 1a shown in FIG. 5.

Figure 11:
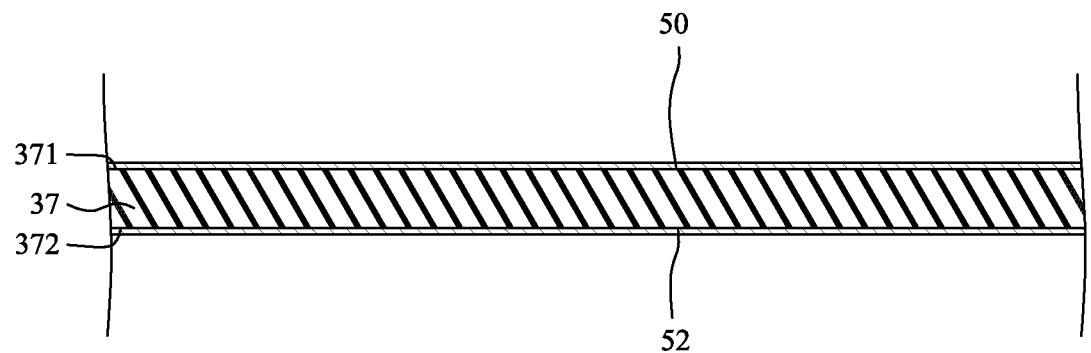
FIG. 11 illustrates one or more stages of an example of a method for manufacturing a wiring structure according to some embodiments of the present disclosure.

Referring to FIG. 11 through FIG. 31, a lower substrate 3 is provided. The lower substrate 3 is manufactured as follows. Referring to FIG. 11, a core portion 37 with a top copper foil 50 and a bottom copper foil 52 is provided. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 12:
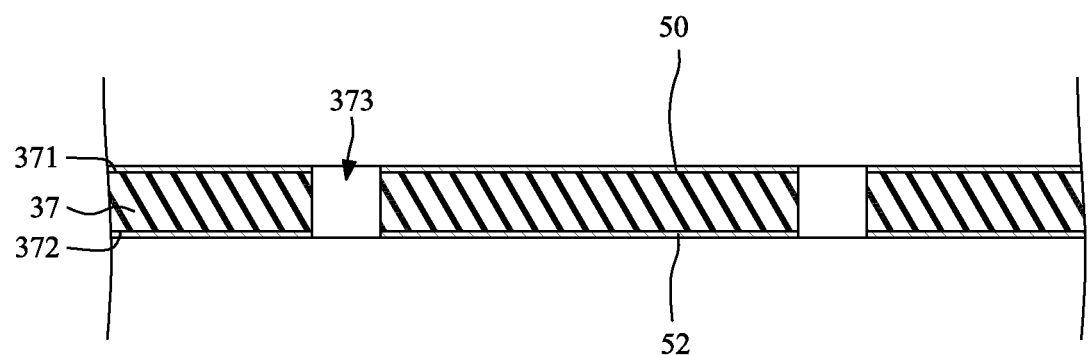
FIG. 12 illustrates one or more stages of an example of a method for manufacturing a wiring structure according to some embodiments of the present disclosure.

Referring to FIG. 12, a plurality of through holes 373 are formed to extend through the core portion 37, the top copper foil 50 and the bottom copper foil 52 by a drilling technique (such as laser drilling or mechanical drilling) or other suitable techniques.

Figure 13:
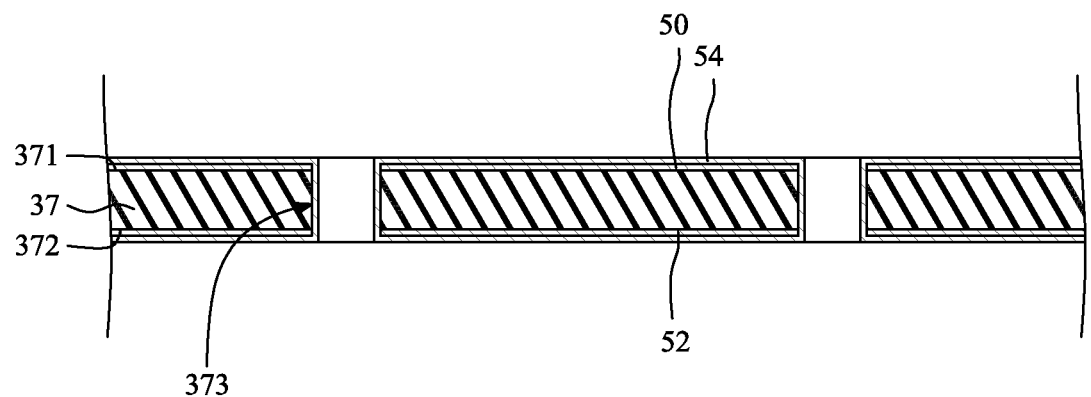
FIG. 13 illustrates one or more stages of an example of a method for manufacturing a wiring structure according to some embodiments of the present disclosure.

Referring to FIG. 13, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Figure 14:
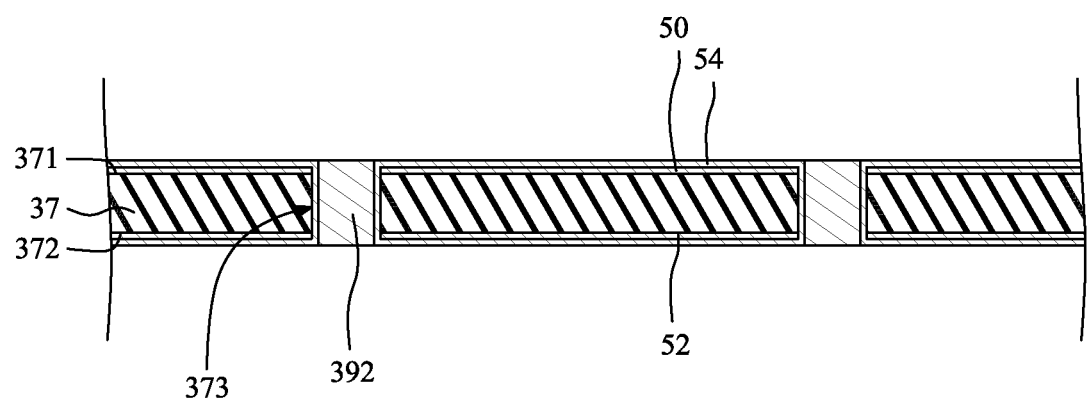
FIG. 14 illustrates one or more stages of an example of a method for manufacturing a wiring structure according to some embodiments of the present disclosure.

Referring to FIG. 14, an insulation material 392 is disposed to fill the central through hole defined by the second metallic layer 54.

Figure 15:
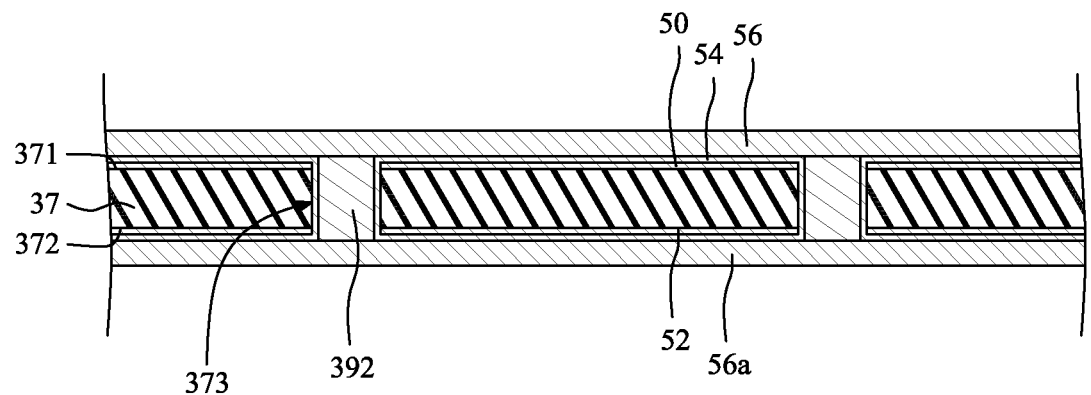
FIG. 15 illustrates one or more stages of an example of a method for manufacturing a wiring structure according to some embodiments of the present disclosure.

Referring to FIG. 15, a top third metallic layer 56 and a bottom third metallic layer 56a are formed or disposed on the second metallic layer 54 by a plating technique or other suitable techniques. The third metallic layers 56, 56a cover the insulation material 392.

Figure 16:
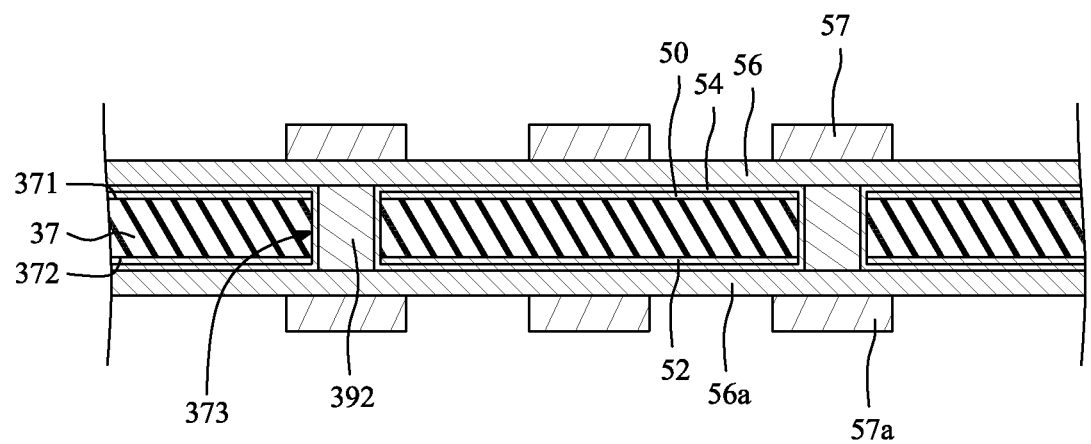
FIG. 16 illustrates one or more stages of an example of a method for manufacturing a wiring structure according to some embodiments of the present disclosure.

Referring to FIG. 16, a top photoresist layer 57 is formed or disposed on the top third metallic layer 56, and a bottom photoresist layer 57a is formed or disposed on the bottom third metallic layer 56a. Then, the photoresist layers 57, 57a are patterned by exposure and development.

Figure 17:
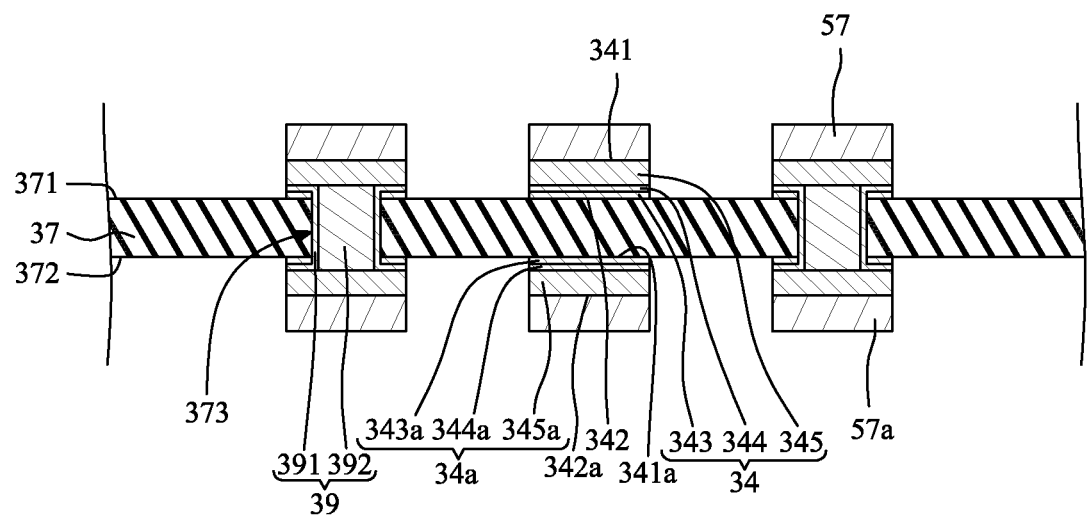
FIG. 17 illustrates one or more stages of an example of a method for manufacturing a wiring structure according to some embodiments of the present disclosure.

Referring to FIG. 17, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56a that are not covered by the bottom photoresist layer 57a are removed by an etching technique or other suitable techniques. Portions of the bottom copper foil 52, the second metallic layer 54 and the bottom third metallic layer 56a that are covered by the bottom photoresist layer 57a remain to form a first lower circuit layer 34a. Meanwhile, portions of the second metallic layer 54 and the insulation material 392 that are disposed in the through hole 373 form an interconnection via 39. The interconnection via 39 electrically connects the first upper circuit layer 34 and the first lower circuit layer 34a.

Figure 18:
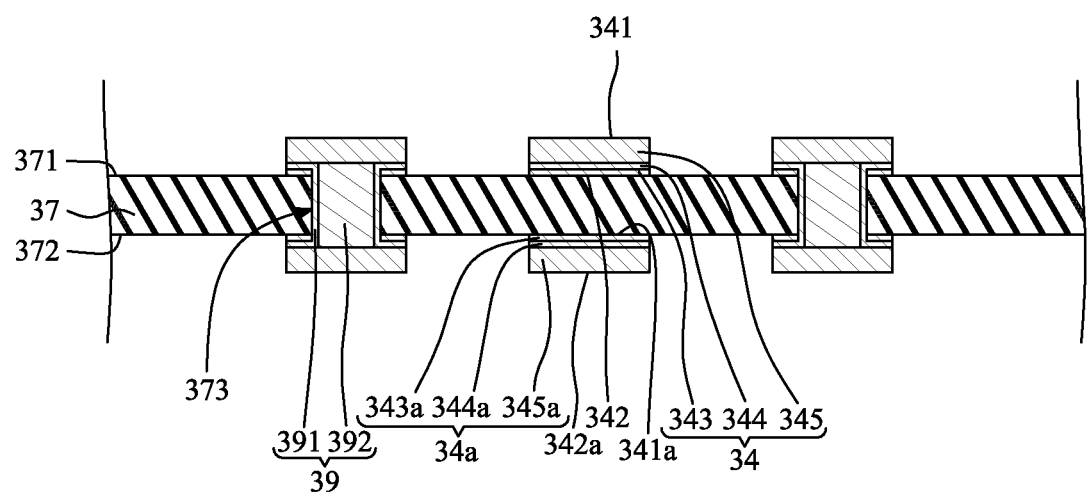
FIG. 18 illustrates one or more stages of an example of a method for manufacturing a wiring structure according to some embodiments of the present disclosure.

Referring to FIG. 18, the top photoresist layer 57 and the bottom photoresist layer 57a are removed by a stripping technique or other suitable techniques.

Figure 19:
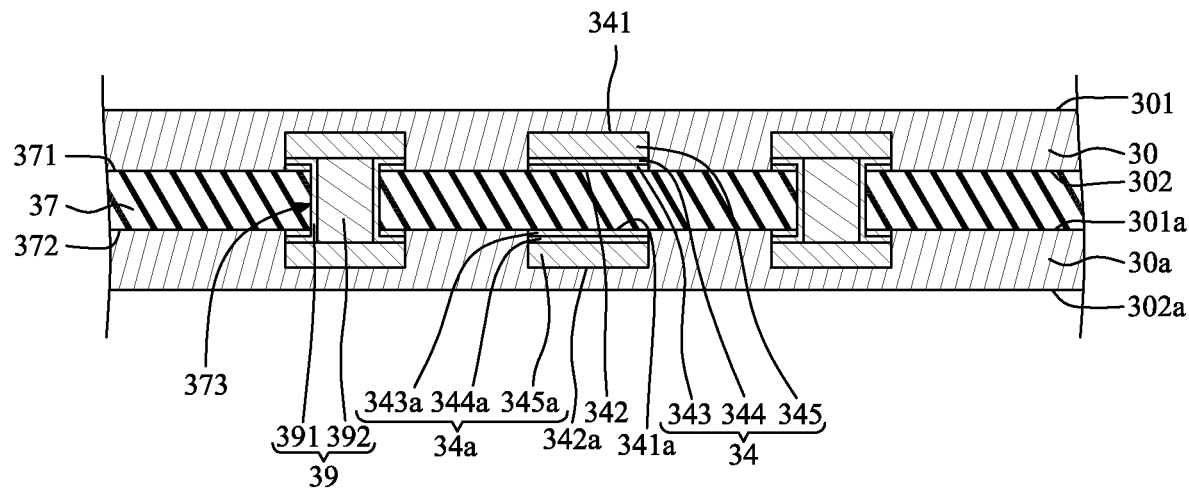
FIG. 19 illustrates one or more stages of an example of a method for manufacturing a wiring structure according to some embodiments of the present disclosure.

Referring to FIG. 19, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30a is formed or disposed on the bottom surface 372 of the core portion 37 to cover the bottom surface 372 of the core portion 37 and the first lower circuit layer 34a by a lamination technique or other suitable techniques.

Figure 20:
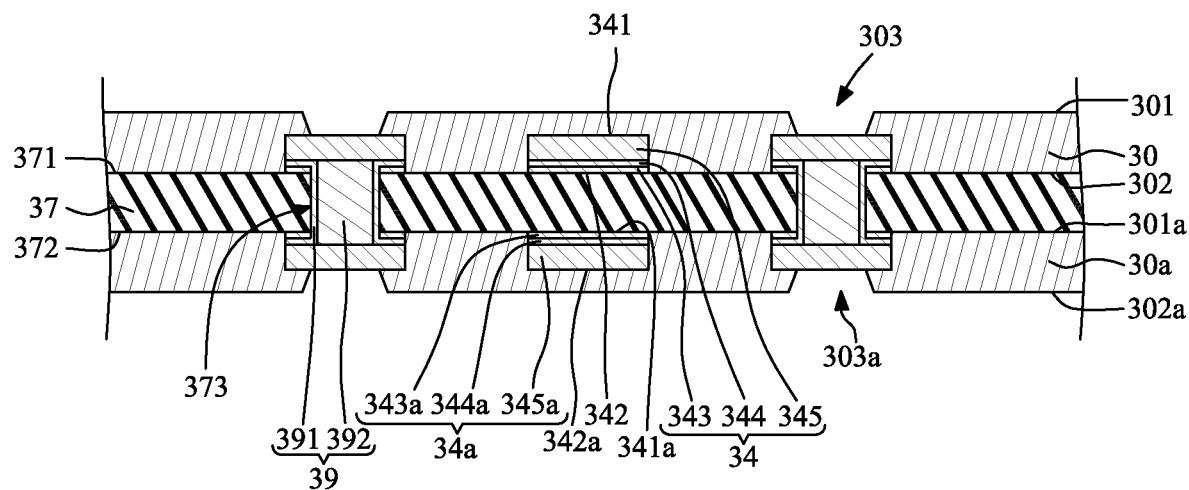
FIG. 20 illustrates one or more stages of an example of a method for manufacturing a wiring structure according to some embodiments of the present disclosure.

Referring to FIG. 20, at least one through hole 303 is formed to extend through the first upper dielectric layer 30 to expose a portion of the first upper circuit layer 34 by a drilling technique or other suitable techniques. Meanwhile, at least one through hole 303a is formed to extend through the first lower dielectric layer 30a to expose a portion of the first lower circuit layer 34a by a drilling technique or other suitable techniques.

Figure 21:
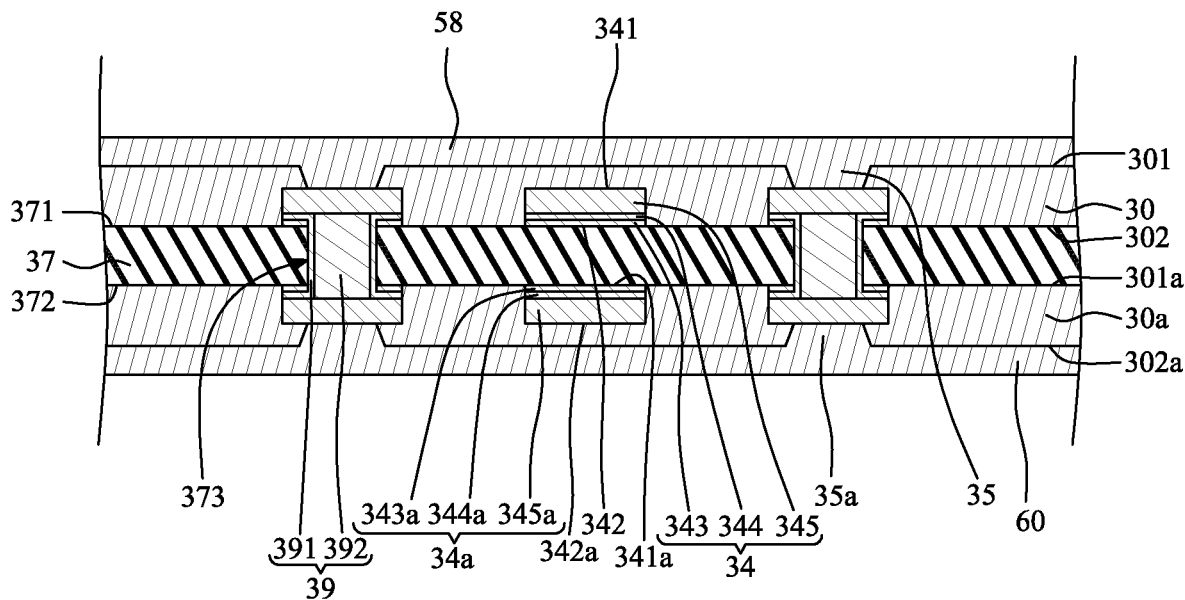
FIG. 21 illustrates one or more stages of an example of a method for manufacturing a wiring structure according to some embodiments of the present disclosure.

Referring to FIG. 21, a top metallic layer 58 is formed on the first upper dielectric layer 30 and in the through hole 303 to form an upper interconnection via 35 by a plating technique or other suitable techniques. Meanwhile, a bottom metallic layer 60 is formed on the first lower dielectric layer 30a and in the through hole 303a to form a lower interconnection via 35a by a plating technique or other suitable techniques.

Figure 22:
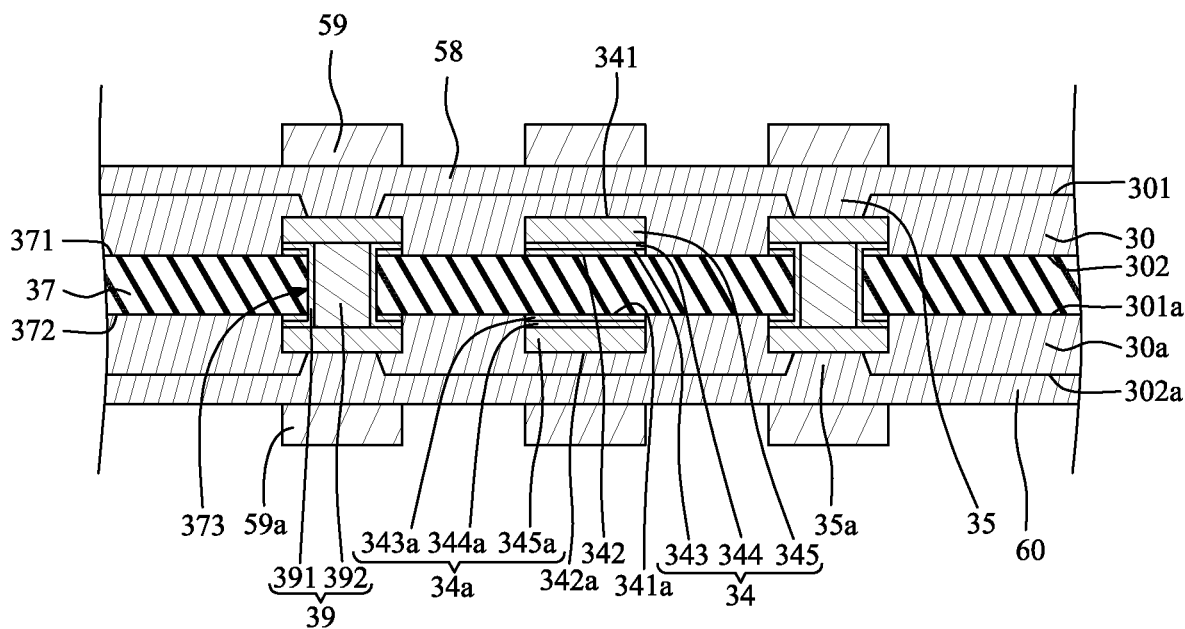
FIG. 22 illustrates one or more stages of an example of a method for manufacturing a wiring structure according to some embodiments of the present disclosure.

Referring to FIG. 22, a top photoresist layer 59 is formed or disposed on the top metallic layer 58, and a bottom photoresist layer 59a is formed or disposed on the bottom metallic layer 60. Then, the photoresist layers 59, 59a are patterned by exposure and development.

Figure 23:
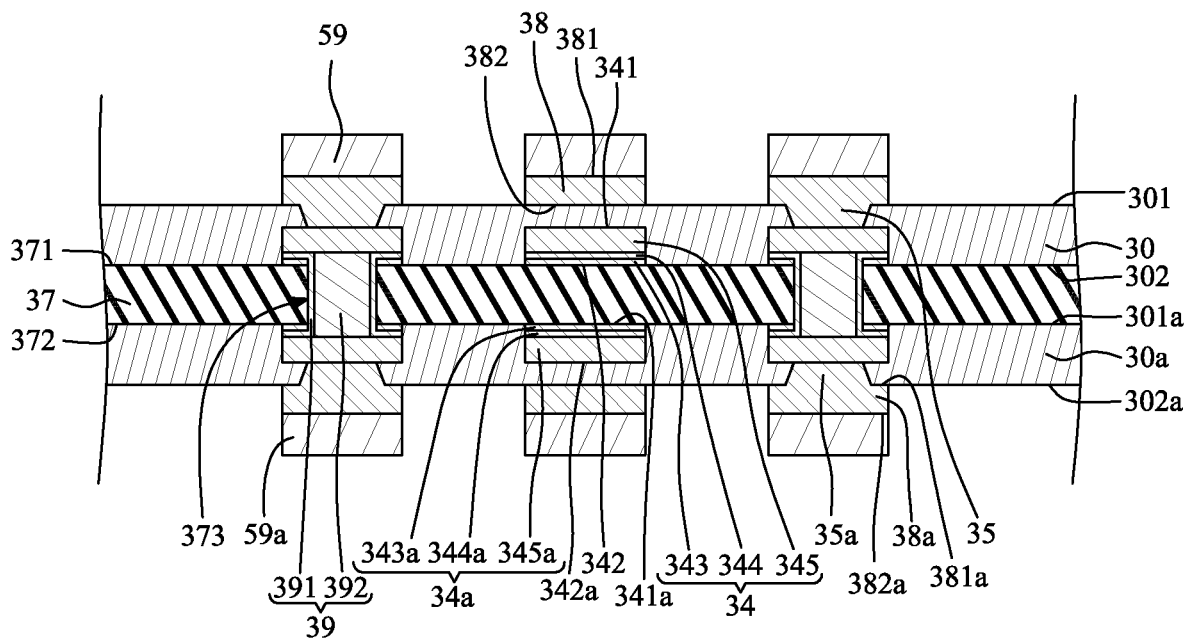
FIG. 23 illustrates one or more stages of an example of a method for manufacturing a wiring structure according to some embodiments of the present disclosure.

Referring to FIG. 23, portions of the top metallic layer 58 that are not covered by the top photoresist layer 59 are removed by an etching technique or other suitable techniques. Portions of the top metallic layer 58 that are covered by the top photoresist layer 59 remain to form a second upper circuit layer 38. Meanwhile, portions of the bottom metallic layer 60 that are not covered by the bottom photoresist layer 59a are removed by an etching technique or other suitable techniques. Portions of the bottom metallic layer 60 that are covered by the bottom photoresist layer 59a remain to form a second lower circuit layer 38a.

Figure 24:
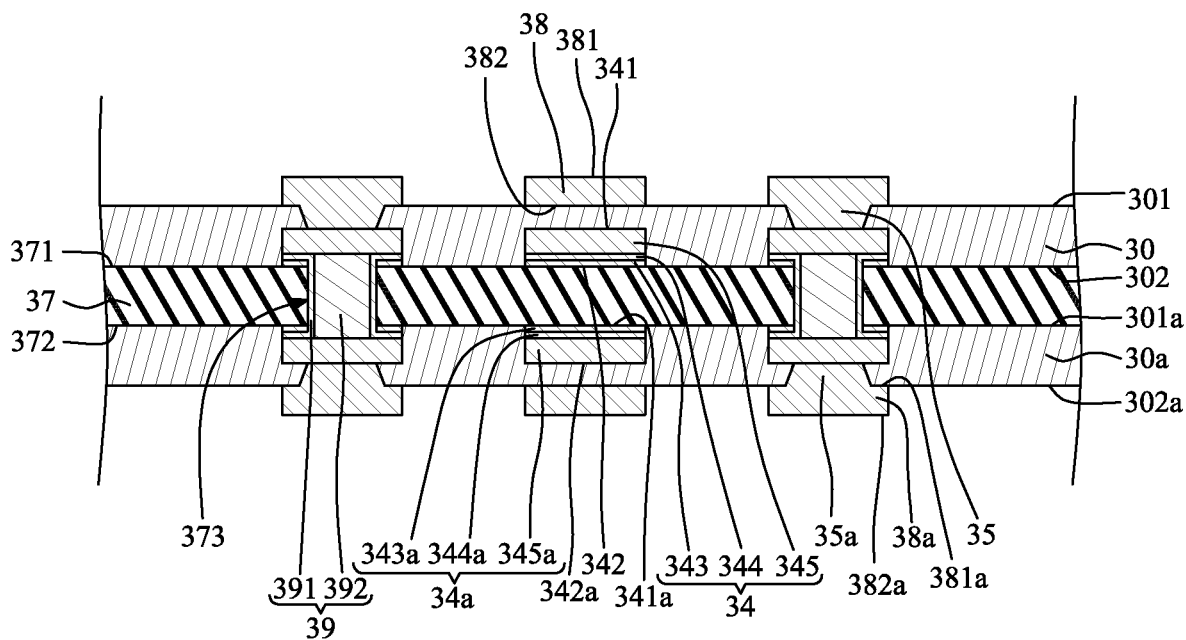
FIG. 24 illustrates one or more stages of an example of a method for manufacturing a wiring structure according to some embodiments of the present disclosure.

Referring to FIG. 24, the top photoresist layer 59 and the bottom photoresist layer 59a are removed by a stripping technique or other suitable techniques.

Figure 25:
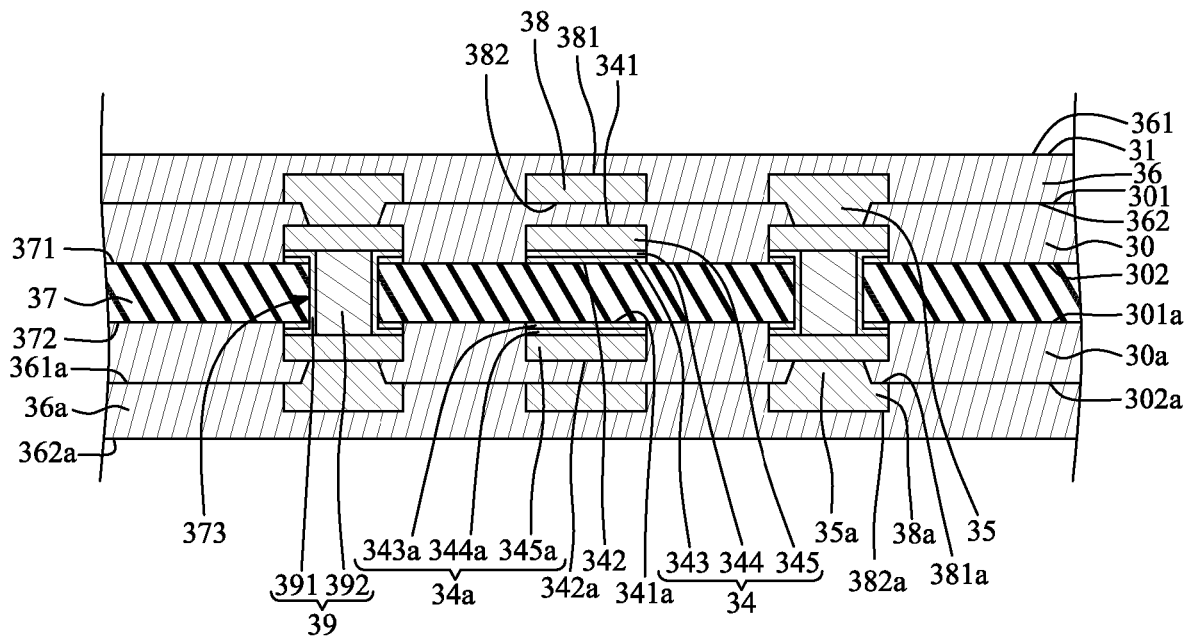
FIG. 25 illustrates one or more stages of an example of a method for manufacturing a wiring structure according to some embodiments of the present disclosure.

Referring to FIG. 25, a second upper dielectric layer 36 is formed or disposed on the top surface 301 of the first upper dielectric layer 30 to cover the top surface 301 of the first upper dielectric layer 30 and the second upper circuit layer 38 by a lamination technique or other suitable techniques. Meanwhile, a second lower dielectric layer 36a is formed or disposed on the bottom surface 302a of the first lower dielectric layer 30a to cover the bottom surface 302a of the first lower dielectric layer 30a and the second lower circuit layer 38a by a lamination technique or other suitable techniques.

Figure 26:
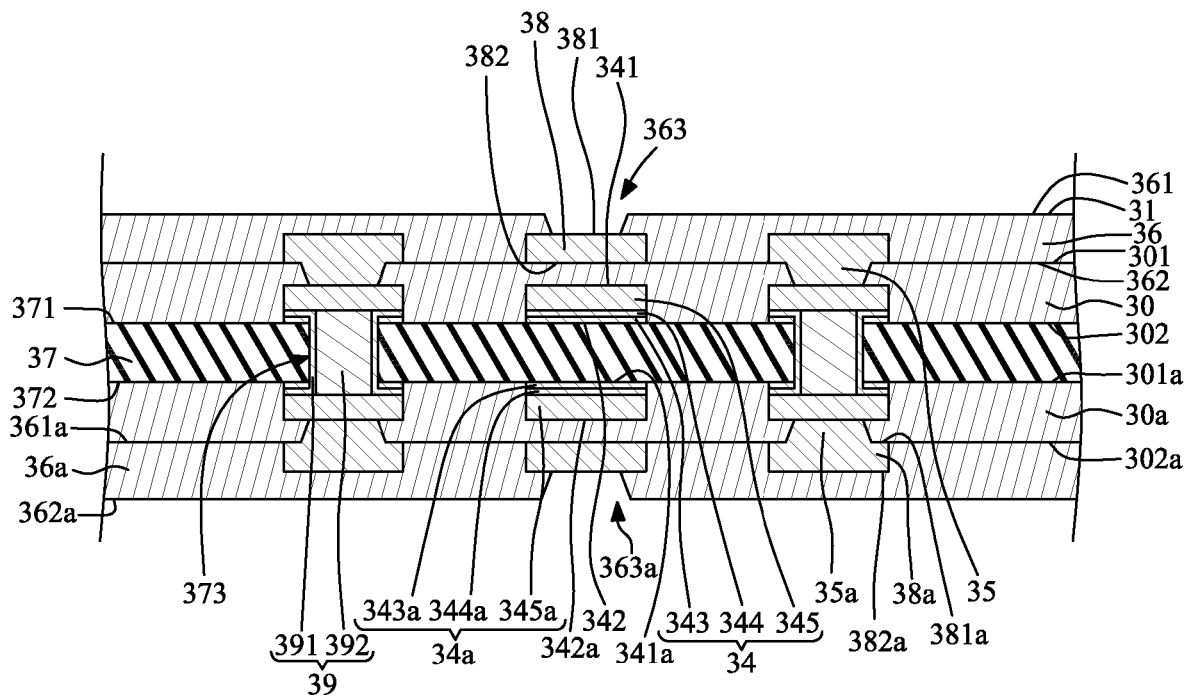
FIG. 26 illustrates one or more stages of an example of a method for manufacturing a wiring structure according to some embodiments of the present disclosure.

Referring to FIG. 26, at least one through hole 363 is formed to extend through the second upper dielectric layer 36 to expose a portion of the second upper circuit layer 38 by a drilling technique or other suitable techniques. Meanwhile, at least one through hole 363a is formed to extend through the second lower dielectric layer 36a to expose a portion of the second lower circuit layer 38a by a drilling technique or other suitable techniques.

Figure 27:
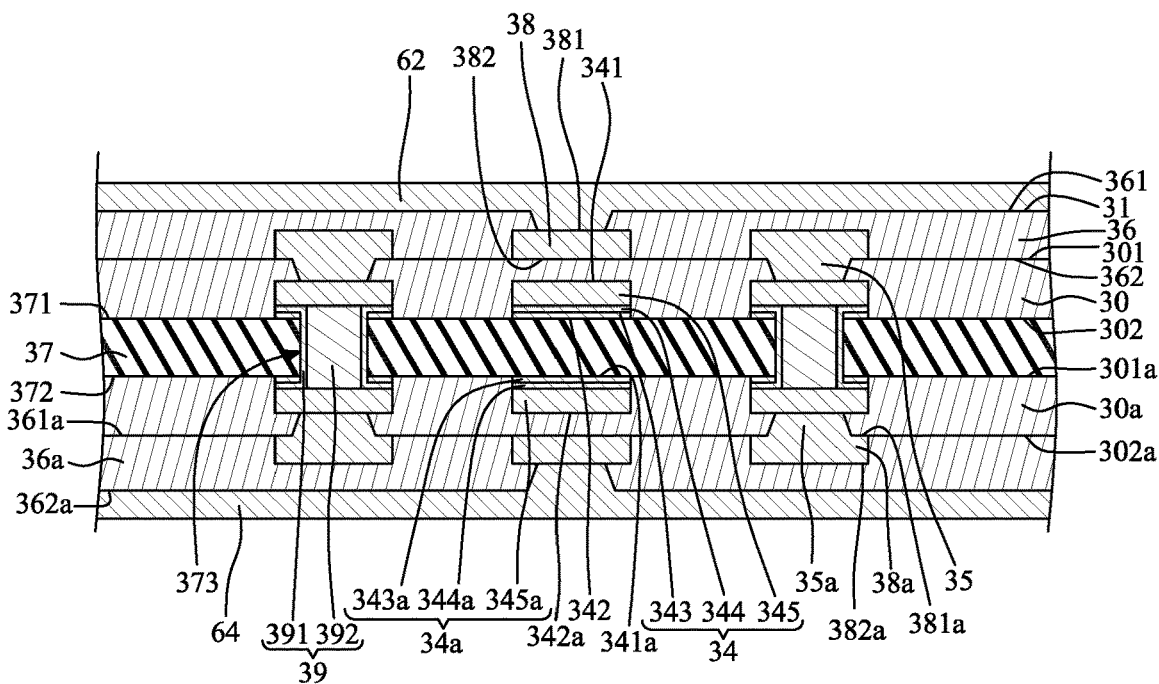
FIG. 27 illustrates one or more stages of an example of a method for manufacturing a wiring structure according to some embodiments of the present disclosure.

Referring to FIG. 27, a top metallic layer 62 is formed on the second upper dielectric layer 36 and in the through hole 363 to form an upper interconnection via 35 by a plating technique or other suitable techniques. Meanwhile, a bottom metallic layer 64 is formed on the second lower dielectric layer 36a and in the through hole 363a to form a lower interconnection via 35a by a plating technique or other suitable techniques.

Figure 28:
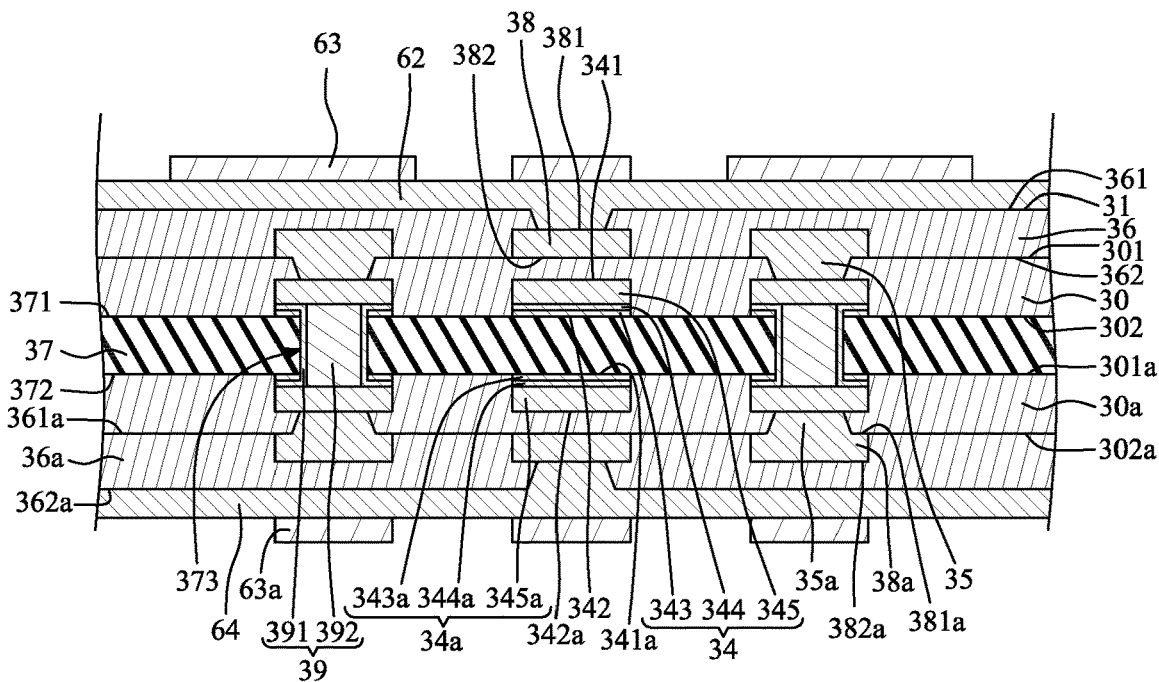
FIG. 28 illustrates one or more stages of an example of a method for manufacturing a wiring structure according to some embodiments of the present disclosure.

Referring to FIG. 28, a top photoresist layer 63 is formed or disposed on the top metallic layer 62, and a bottom photoresist layer 63a is formed or disposed on the bottom metallic layer 64. Then, the photoresist layers 63, 63a are patterned by exposure and development.

Figure 29:
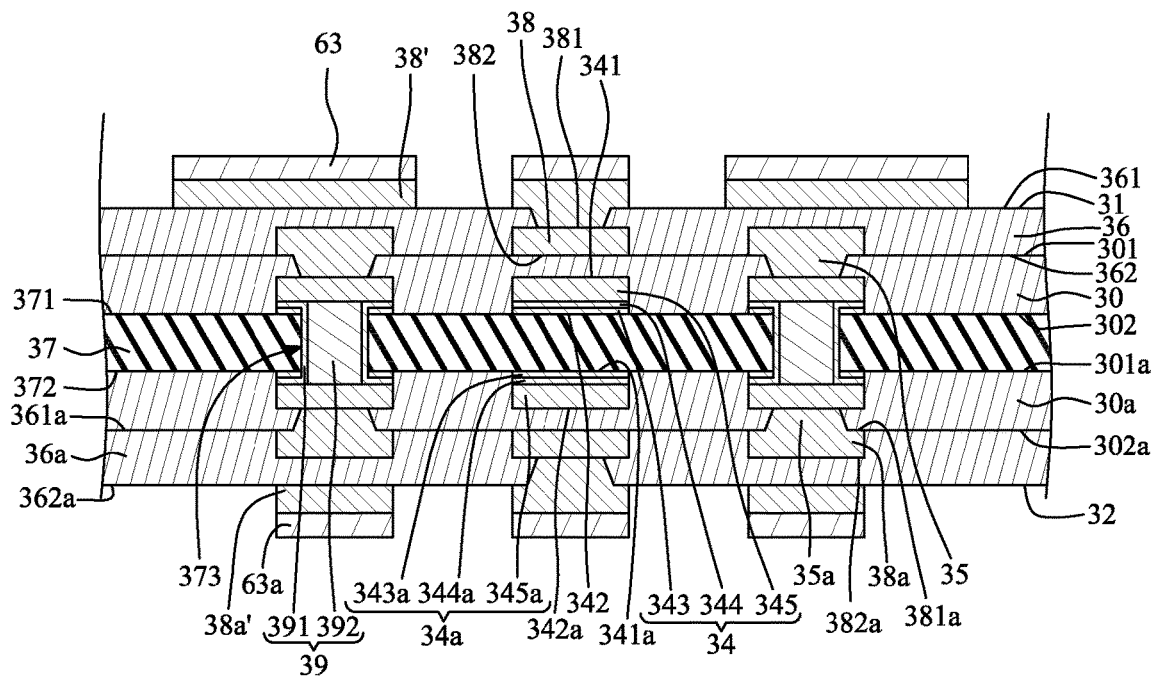
FIG. 29 illustrates one or more stages of an example of a method for manufacturing wiring structure according to some embodiments of the present disclosure.

Referring to FIG. 29, portions of the top metallic layer 62 that are not covered by the top photoresist layer 63 are removed by an etching technique or other suitable techniques. Portions of the top metallic layer 62 that are covered by the top photoresist layer 63 remain to form a second upper circuit layer 38'. Meanwhile, portions of the bottom metallic layer 64 that are not covered by the bottom photoresist layer 63a are removed by an etching technique or other suitable techniques. Portions of the bottom metallic layer 64 that are covered by the bottom photoresist layer 63a remain to form a second lower circuit layer 38a'.

Figure 30:
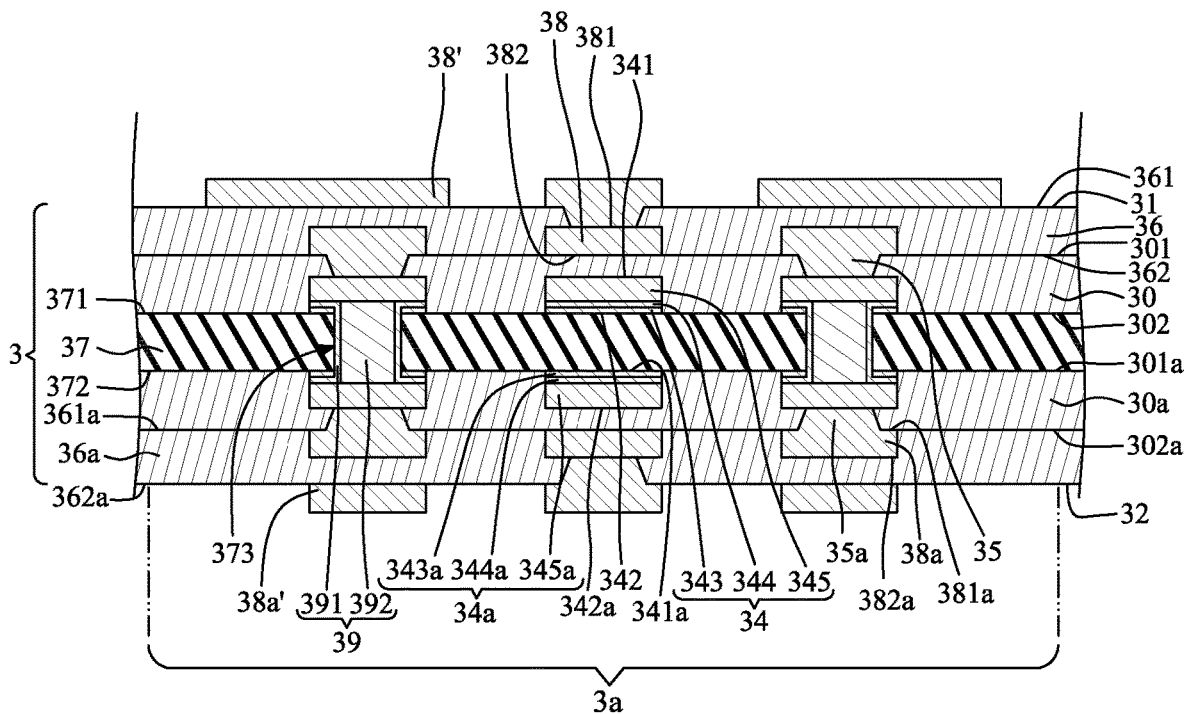
FIG. 30 illustrates one or more stages of an example of a method for manufacturing a wiring structure according to some embodiments of the present disclosure.

Referring to FIG. 30, the top photoresist layer 63 and the bottom photoresist layer 63a are removed by a stripping technique or other suitable techniques. Meanwhile, the lower substrate 3 with at least one lower conductive structure 3a is formed.

Figure 31:
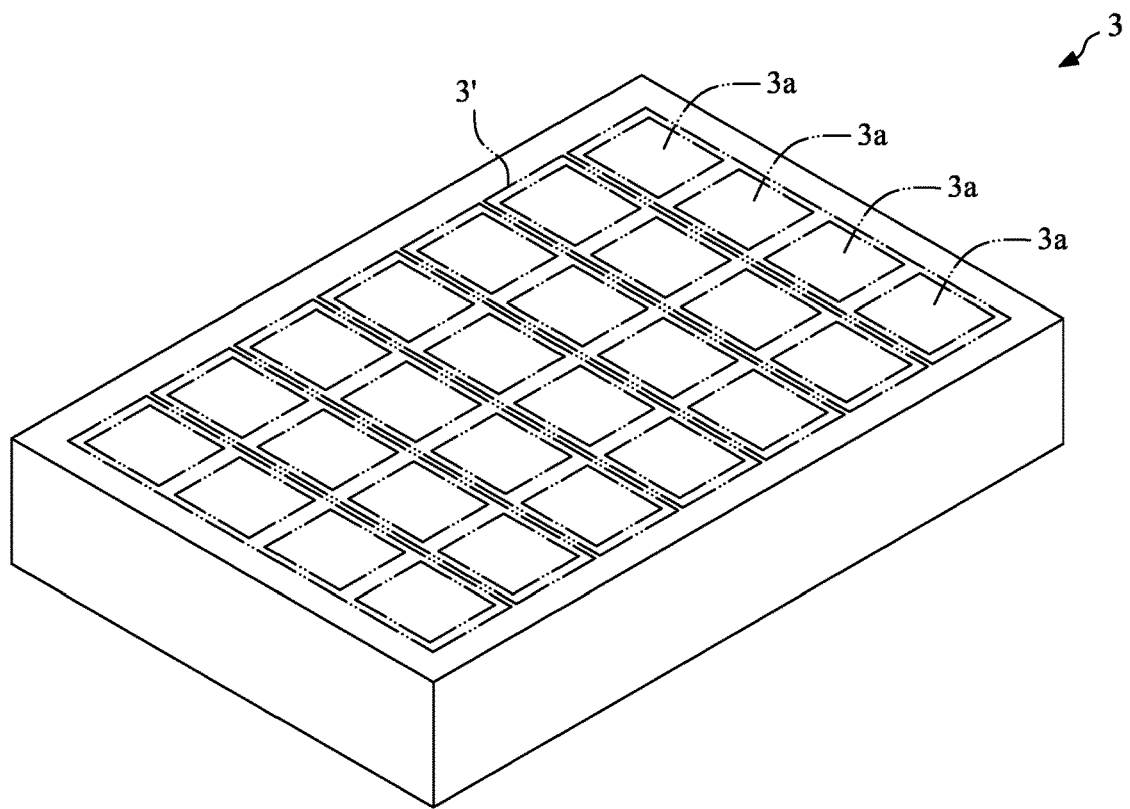
FIG. 31 illustrates one or more stages of an example of a method for manufacturing a wiring structure according to some embodiments of the present disclosure.

Referring to FIG. 30 and FIG. 31, wherein FIG. 31 illustrates a perspective view of the lower substrate 3 of FIG. 30. The lower substrate 3 includes at least one lower conductive structure 3a. For example, the lower substrate 3 may include a plurality of lower conductive structures 3a arranged in an array. The lower substrate 3 includes a plurality of strip areas 3'. Then, an electrical property (such as open circuit/short circuit) of the lower substrate 3 (e.g., the lower conductive structures 3a of the strip areas 3') is tested.

Figure 32:
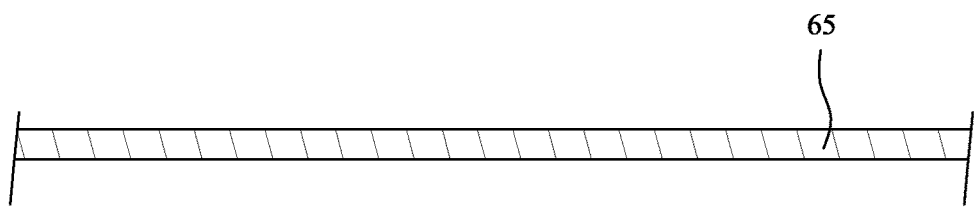
FIG. 32 illustrates one or more stages of an example of a method for manufacturing a wiring structure according to some embodiments of the present disclosure.

Referring to FIG. 32 through FIG. 44, a plurality of upper strips 2 are provided. The upper strips 2 are manufactured as follows. Referring to FIG. 32, a carrier 65 is provided. The carrier 65 may be a glass carrier, and may be in a wafer type or a panel type.

Figure 33:
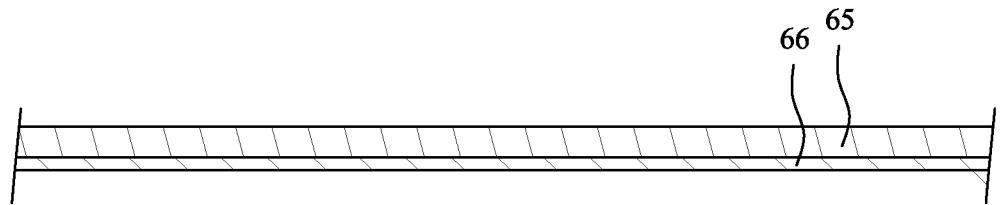
FIG. 33 illustrates one or more stages of an example of a method for manufacturing a wiring structure according to some embodiments of the present disclosure.

Referring to FIG. 33, a release layer 66 is coated on a bottom surface of the carrier 65.

Figure 34:
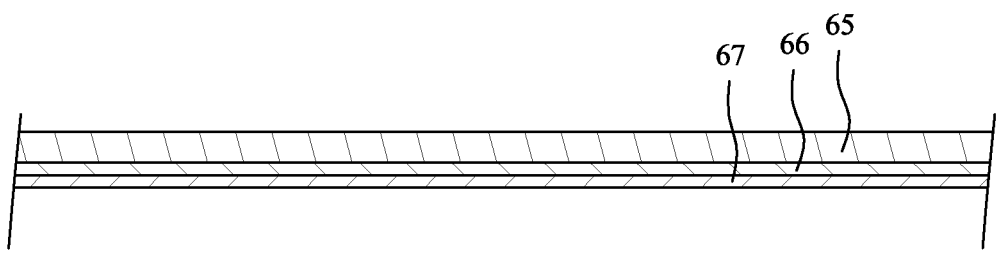
FIG. 34 illustrates one or more stages of an example of a method for manufacturing a wiring structure according to some embodiments of the present disclosure.

Referring to FIG. 34, a conductive layer 67 (e.g., a seed layer) is formed or disposed on the release layer 66 by a physical vapor deposition (PVD) technique or other suitable techniques.

Figure 35:
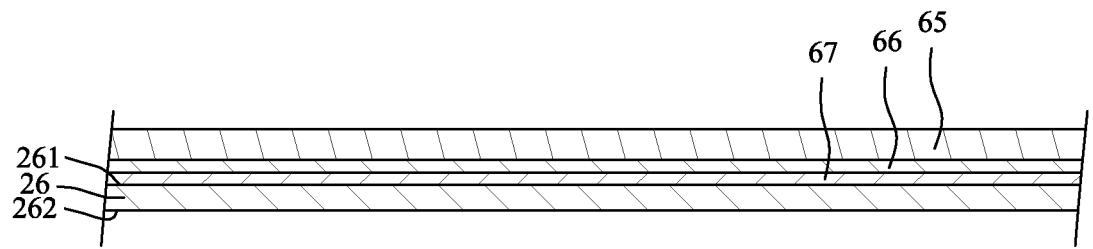
FIG. 35 illustrates one or more stages of an example of a method for manufacturing a wiring structure according to some embodiments of the present disclosure.

Referring to FIG. 35, a second dielectric layer 26 is formed on the conductive layer 67 by a coating technique or other suitable techniques.

Figure 36:
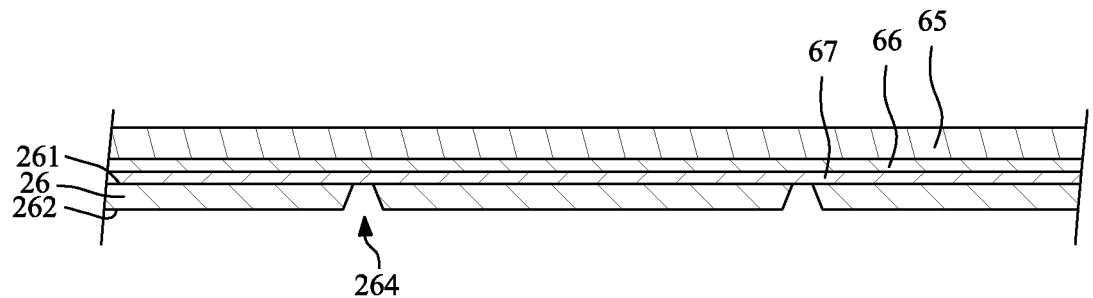
FIG. 36 illustrates one or more stages of an example of a method for manufacturing a wiring structure according to some embodiments of the present disclosure.

Referring to FIG. 36, at least one through hole 264 is formed to extend through the second dielectric layer 26 to expose a portion of the conductive layer 67 by an exposure and development technique or other suitable techniques.

Figure 37:
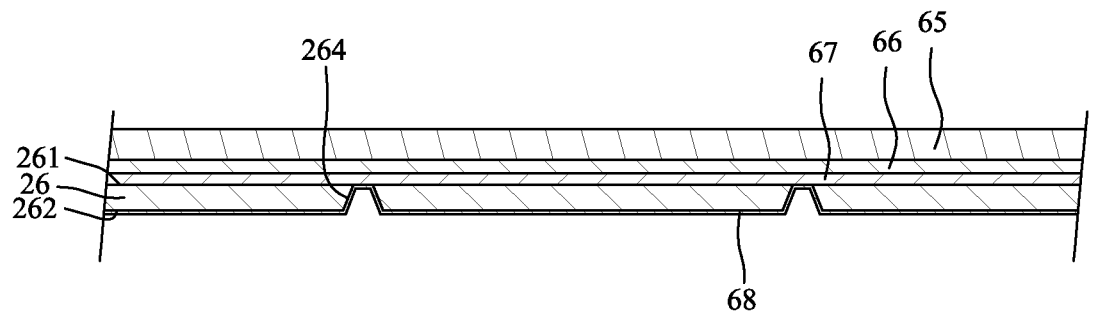
FIG. 37 illustrates one or more stages of an example of a method for manufacturing a wiring structure according to some embodiments of the present disclosure.

Referring to FIG. 37, a seed layer 68 is formed on a bottom surface 262 of the second dielectric layer 26 and in the through hole 264 by a PVD technique or other suitable techniques.

Figure 38:
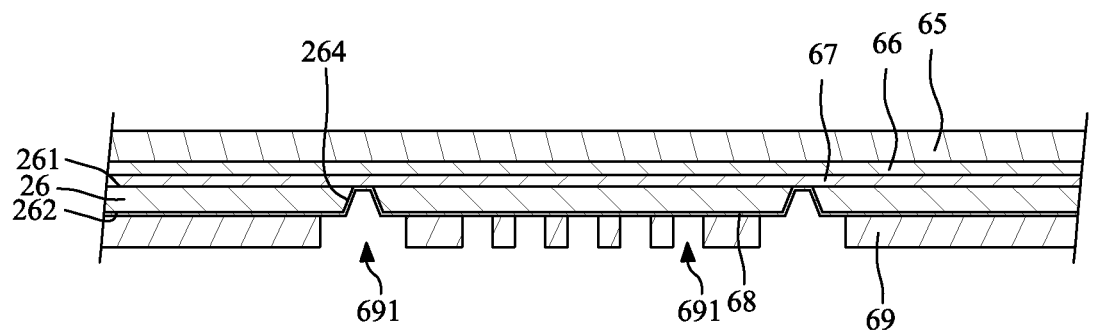
FIG. 38 illustrates one or more stages of an example of a method for manufacturing a wiring structure according to some embodiments of the present disclosure.

Referring to FIG. 38, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 39:
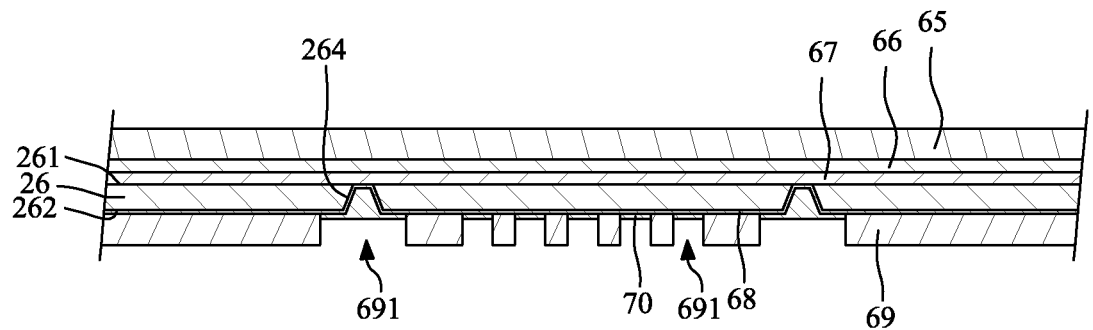
FIG. 39 illustrates one or more stages of an example of a method for manufacturing a wiring structure according to some embodiments of the present disclosure.

Referring to FIG. 39, a conductive material 70 (e.g., a metallic material) is disposed in the openings 691 of the photoresist layer 69 and on the seed layer 68 by a plating technique or other suitable techniques.

Figure 40:
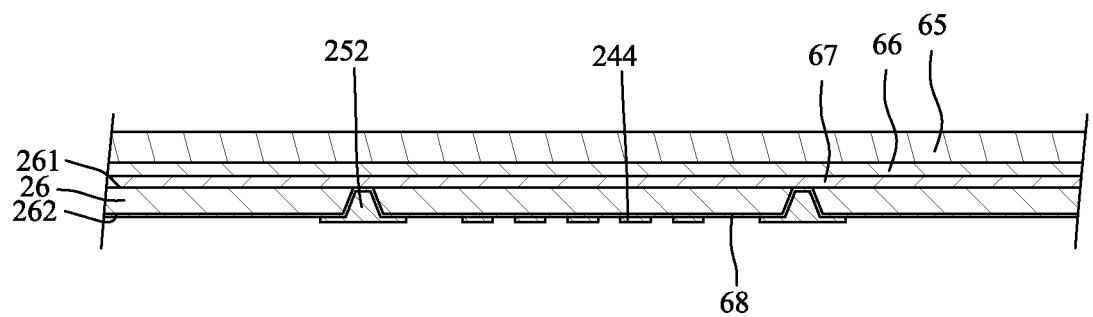
FIG. 40 illustrates one or more stages of an example of a method for manufacturing wiring structure according to some embodiments of the present disclosure.

Referring to FIG. 40, the photoresist layer 69 is removed by a stripping technique or other suitable techniques.

Figure 41:
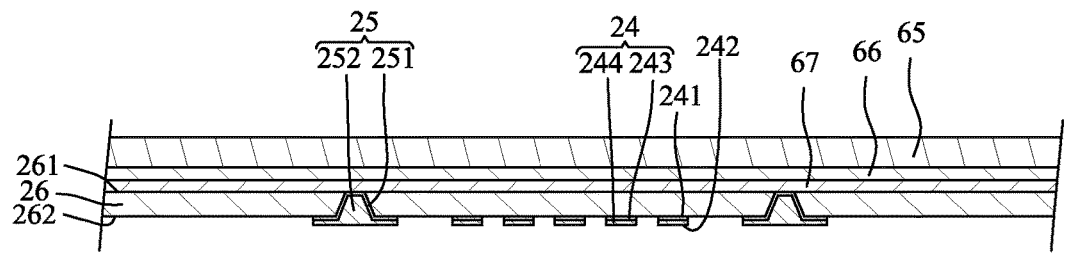
FIG. 41 illustrates one or more stages of an example of a method for manufacturing a wiring structure according to some embodiments of the present disclosure.

Referring to FIG. 41, portions of the seed layer 68 that are not covered by the conductive material 70 are removed by an etching technique or other suitable techniques. Meanwhile, a circuit layer 24 and at least one inner via 25 are formed. The circuit layer 24 may be a fan-out circuit layer or an RDL, and an L/S of the circuit layer 24 may be less than or equal to about 2 μm/about 2 μm, or less than or equal to about 1.8 μm/about 1.8 μm. The inner via 25 is disposed in the through hole 264 of the second dielectric layer 26. In some embodiments, the inner via 25 tapers upwardly.

Figure 42:
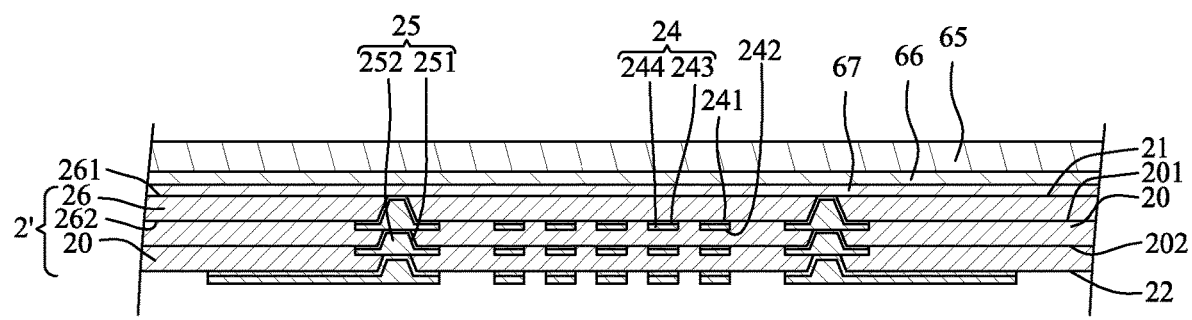
FIG. 42 illustrates one or more stages of an example of a method for manufacturing a wiring structure according to some embodiments of the present disclosure.

Referring to FIG. 42, a plurality of first dielectric layers 20 and a plurality of circuit layers 24 are formed by repeating the stages of FIG. 35 to FIG. 41. In some embodiments, each circuit layer 24 is embedded in the corresponding first dielectric layer 20, and a top surface 241 of the circuit layer 24 may be substantially coplanar with a top surface 201 of the first dielectric layer 20. Meanwhile, a conductive structure 2' is formed. Then, an electrical property (such as open circuit/short circuit) of the conductive structure 2' is tested. It is noted that the conductive structure 2' may be in a wafer type or a panel type.

Figure 43:
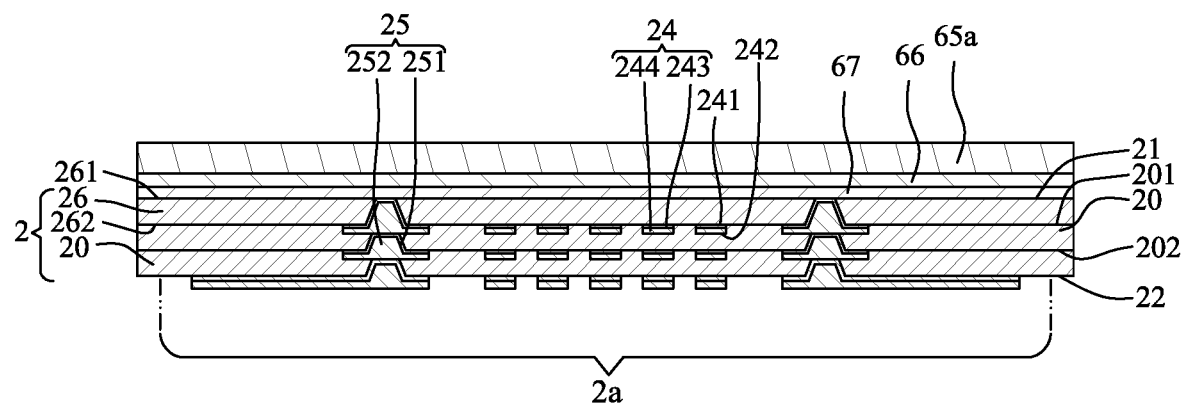
FIG. 43 illustrates one or more stages of an example of a method for manufacturing a wiring structure according to some embodiments of the present disclosure.
Figure 44:
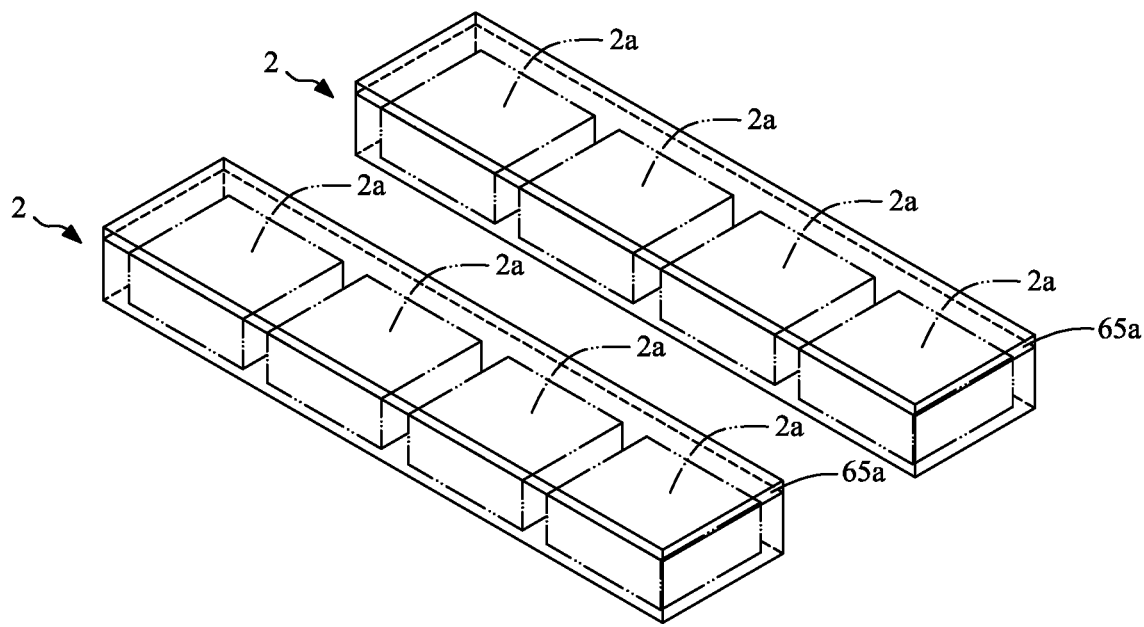
FIG. 44 illustrates one or more stages of an example of a method for manufacturing a wiring structure according to some embodiments of the present disclosure.

Referring to FIG. 43 and FIG. 44, wherein FIG. 44 illustrates perspective views of the upper strips 2 of FIG. 43. The conductive structure 2' and the carrier 65 are cut to form a plurality of upper strips 2 with a plurality of carrier strips 65a. Each of the upper strips 2 includes at least one upper conductive structure 2a. For example, each of the upper strips 2 may include a plurality of upper conductive structures 2a arranged in a row. It is noted that the upper strip 2 is in a strip type.

Figure 45:
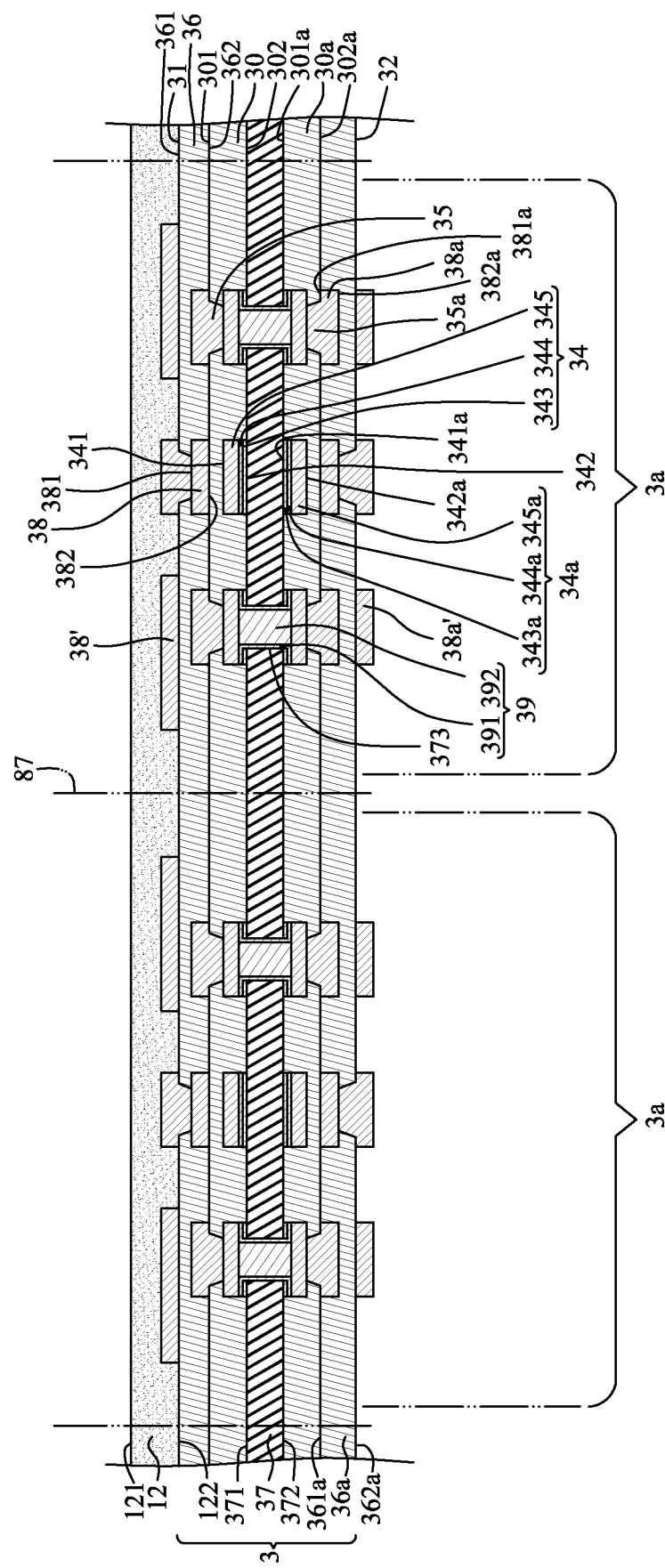
FIG. 45 illustrates one or more stages of an example of a method for manufacturing a wiring structure according to some embodiments of the present disclosure.

Referring to FIG. 45, an adhesive layer 12 is formed or applied on the top surface 31 of the lower substrate 3. A material of the adhesive layer 12 may include an insulating film, such as ABF. In some embodiments, the lower substrate 3 may have a plurality of cutting lines 87.

Figure 46:
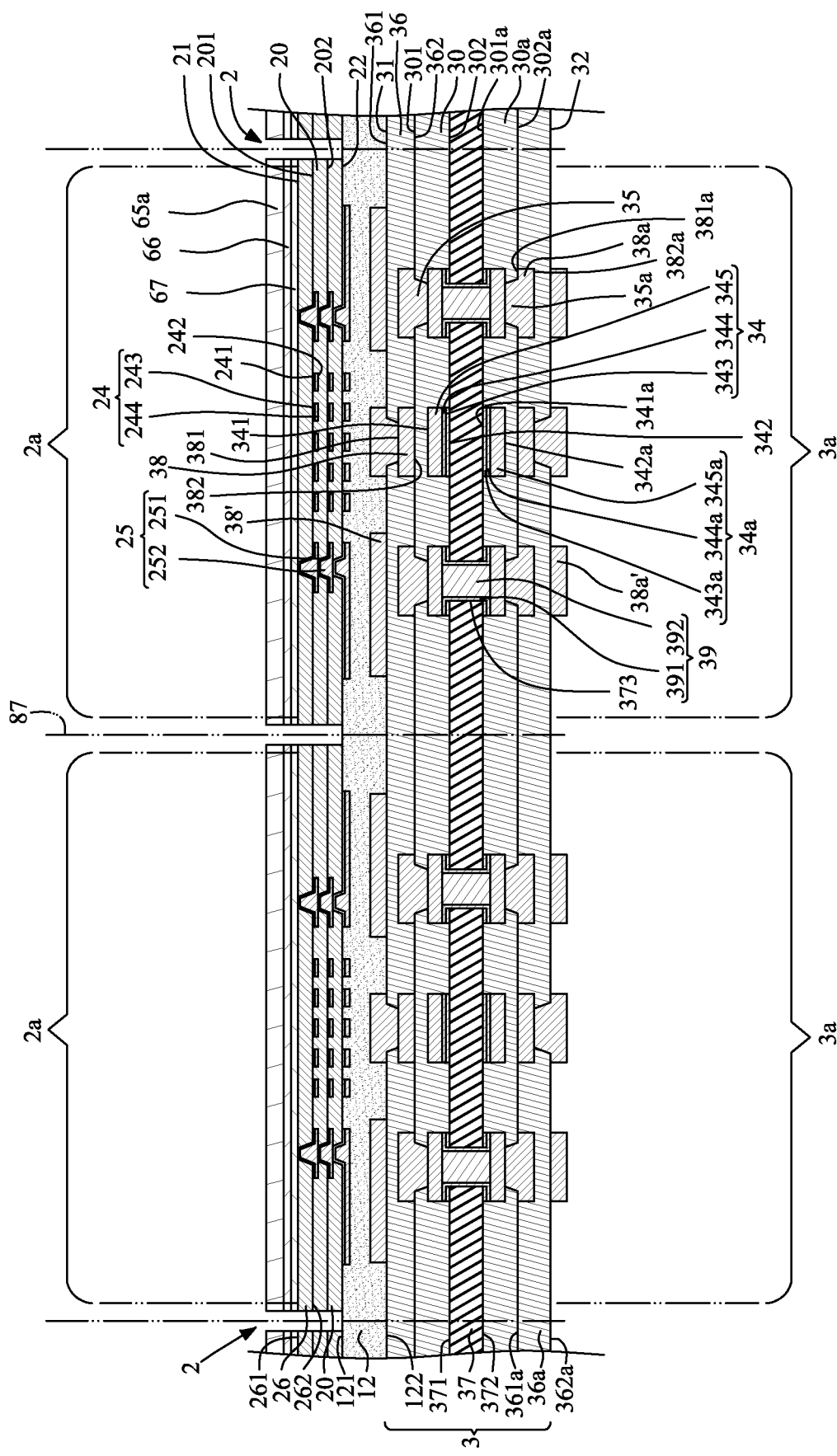
FIG. 46 illustrates one or more stages of an example of a method for manufacturing a wiring structure according to some embodiments of the present disclosure.

Referring to FIG. 46, the upper strips 2 and the carrier strips 65a are attached to the strip areas 3' of the lower substrate 3 side by side through the adhesive layer 12. The upper strips 2 face the lower substrate 3. A position of the upper conductive structure 2a of the upper strip 2 and the carrier strip 65a corresponds to a position of the lower conductive structure 3a of the lower substrate 3. That is, the upper conductive structure 2a is disposed right above the lower conductive structure 3a. In some embodiments, known good upper strip 2' is selectively attached to known good strip area 3' of the lower substrate 3. For example, a desired yield of the wiring structure 1a (FIG. 5) may be set to be 80%. That is, (the yield of the upper strip 2)×(the yield of the strip area 3' of the lower substrate 3) is set to be greater than or equal to 80%. If a yield of the upper strip 2 is less than a predetermined yield such as 80% (which is specified as bad or unqualified component), then, the bad (or unqualified) upper strip 2 is discarded. If a yield of the upper strip 2 is greater than or equal to the predetermined yield such as 80% (which is specified as known good or qualified component), then the known good upper strip 2 can be used. In addition, if a yield of the strip area 3' of the lower substrate 3 is less than a predetermined yield such as 80% (which is specified as bad or unqualified component), then the bad (or unqualified) strip area 3' is marked and will not be bonded with any upper strip 2. If a yield of the strip area 3' of the lower substrate 3 is greater than or equal to the predetermined yield such as 80% (which is specified as known good component or qualified component), then the known good upper strip 2 can be bonded to the known good strip area 3' of the lower substrate 3. It is noted that the upper strip 2 having a yield of 80% will not be bonded to the strip area 3' of the lower substrate 3 having a yield of 80%, since the resultant yield of the wiring structure 1a (FIG. 5) is 64%, which is lower than the desired yield of 80%. The upper strip 2 having a yield of 80% can be bonded to the strip area 3' of the lower substrate 3 having a yield of 100%; thus, the resultant yield of the wiring structure 1a (FIG. 5) can be 80%. In addition, an upper strip 2 having a yield of 90% can be bonded to the strip area 3' of the lower substrate 3 having a yield of greater than 90%, since the resultant yield of the wiring structure 1a (FIG. 5) can be greater than 80%.

In addition, the relative positions of the upper strips 2 are separated and will not influence each other. In some embodiments, if one or some of the upper strips 2 may be shifted with respect to a predetermined position of the lower substrate 3, the other upper strips 2 still can be disposed on a predetermined position of the lower substrate 3.

Then, the adhesive layer 12 is cured to form an intermediate layer 12.

Figure 47:
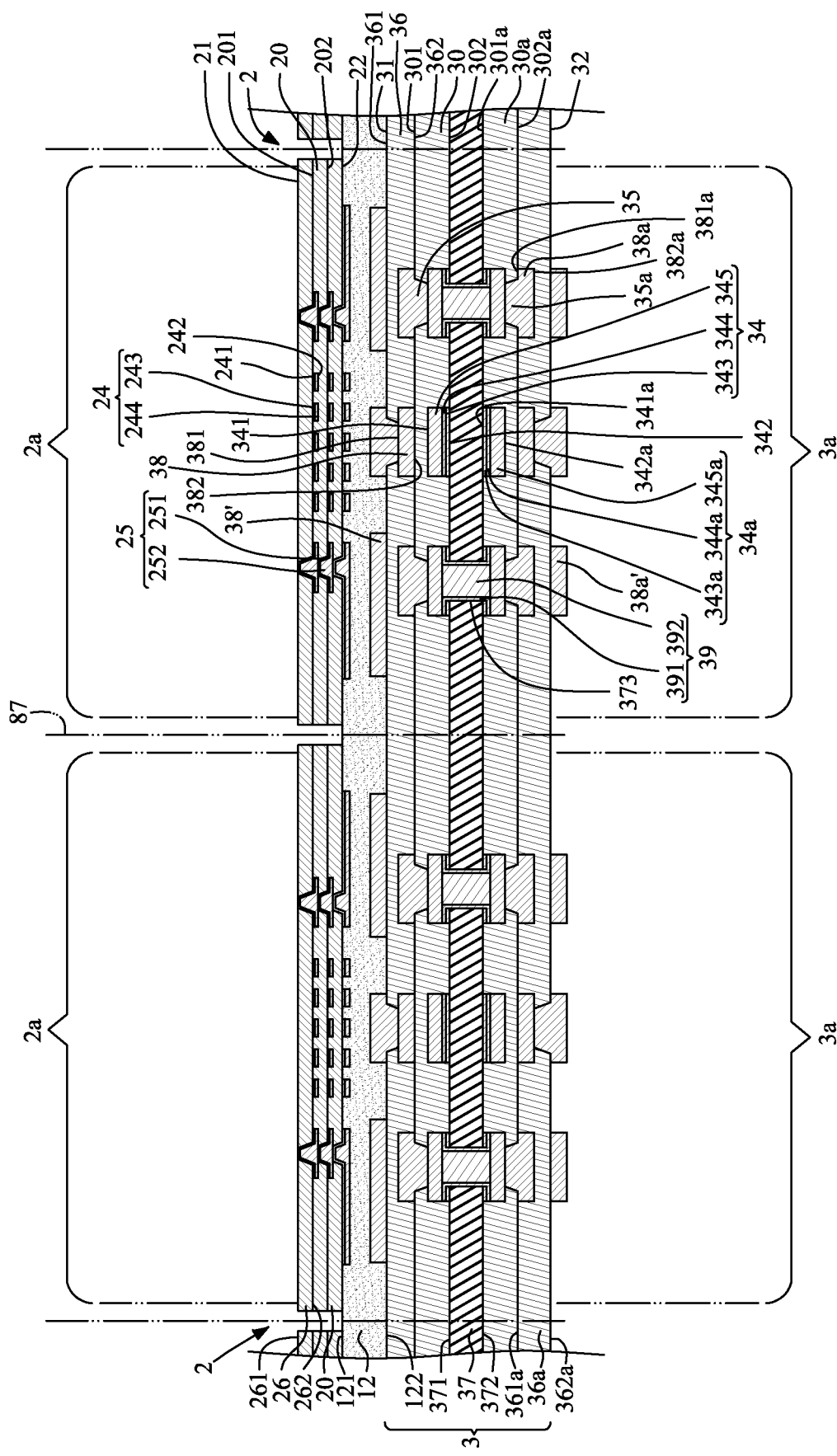
FIG. 47 illustrates one or more stages of an example of a method for manufacturing a wiring structure according to some embodiments of the present disclosure.

Referring to FIG. 47, the carrier strips 65a, the release layer 66 and the conductive layer 67 are removed so as to expose a portion of the inner via 25.

Figure 48:
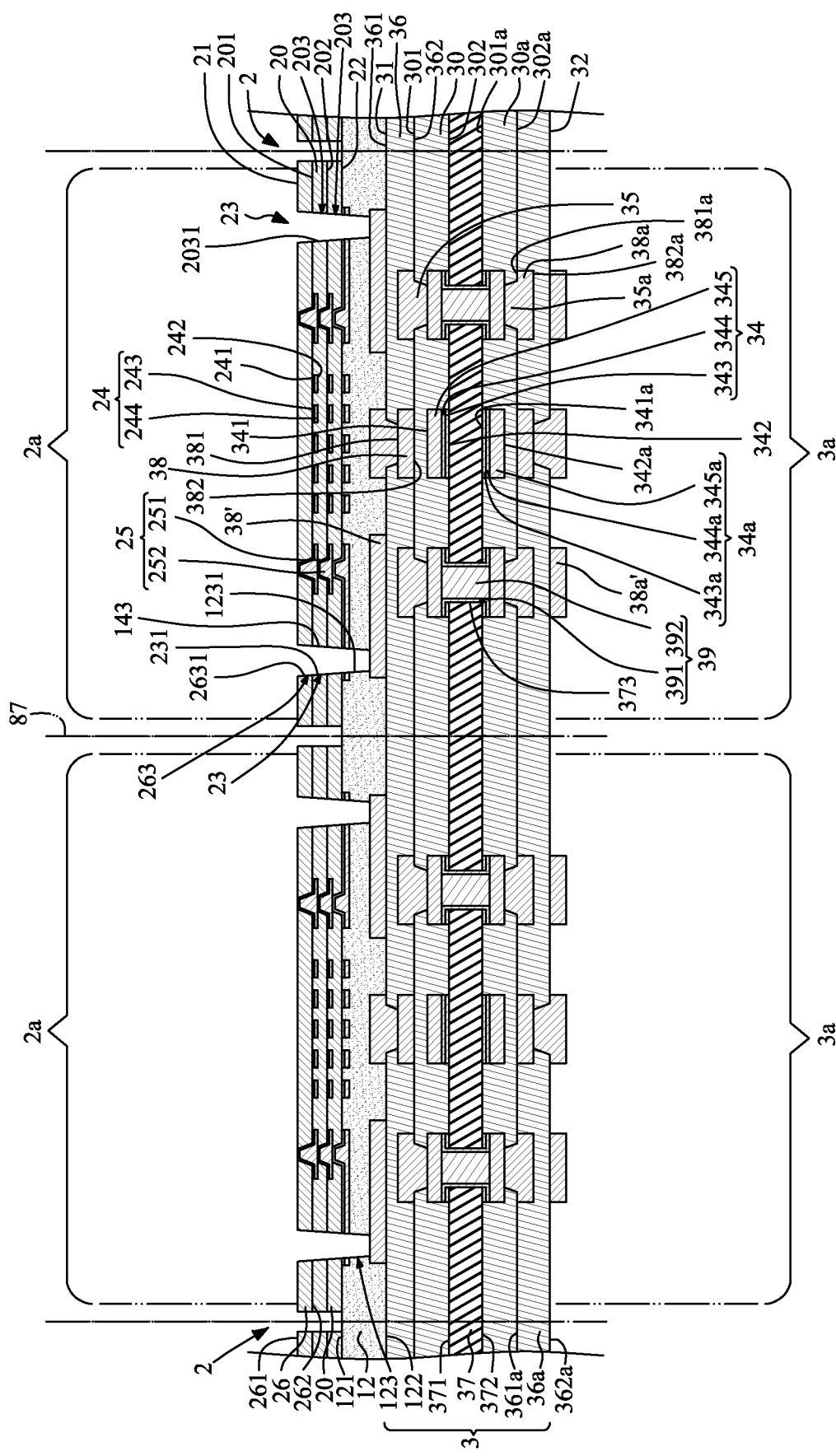
FIG. 48 illustrates one or more stages of an example of a method for manufacturing a wiring structure according to some embodiments of the present disclosure.

Referring to FIG. 48, at least one through hole 23 is formed to extend through at least a portion of the upper conductive structure 2 and the intermediate layer 12 by drilling (such as laser drilling) to exposes a circuit layer (e.g., second upper circuit layer 38') of the lower conductive structure 3. The through hole 23 may include a through hole 263 of the second dielectric layer 26, a plurality of through holes 203 of the first dielectric layers 20 and a through hole 123 of the intermediate layer 12. In some embodiments, the through hole 23 extends through the bottommost first circuit layer 24 of the upper conductive structure 2 and terminates at or on a topmost circuit layer (e.g., the second upper circuit layer 38') of the lower conductive structure 3. That is, the through hole 23 does not extend through the topmost circuit layer (e.g., the second upper circuit layer 38') of the lower conductive structure 3. The through hole 23 may expose a portion of the topmost circuit layer (e.g., the top surface of the second upper circuit layer 38') of the lower conductive structure 3. As shown in FIG. 48, the through hole 23 tapers downwardly; that is, a size of a top portion of the through hole 23 is greater than a size of a bottom portion of the through hole 23. In addition, an inner surface 1231 of the through hole 123 of the intermediate layer 12 is coplanar with or aligned with inner surfaces 2031 of the through holes 203 of the first dielectric layers 20 and an inner surface 2631 of the through hole 263 of the second dielectric layer 26.

Figure 49:
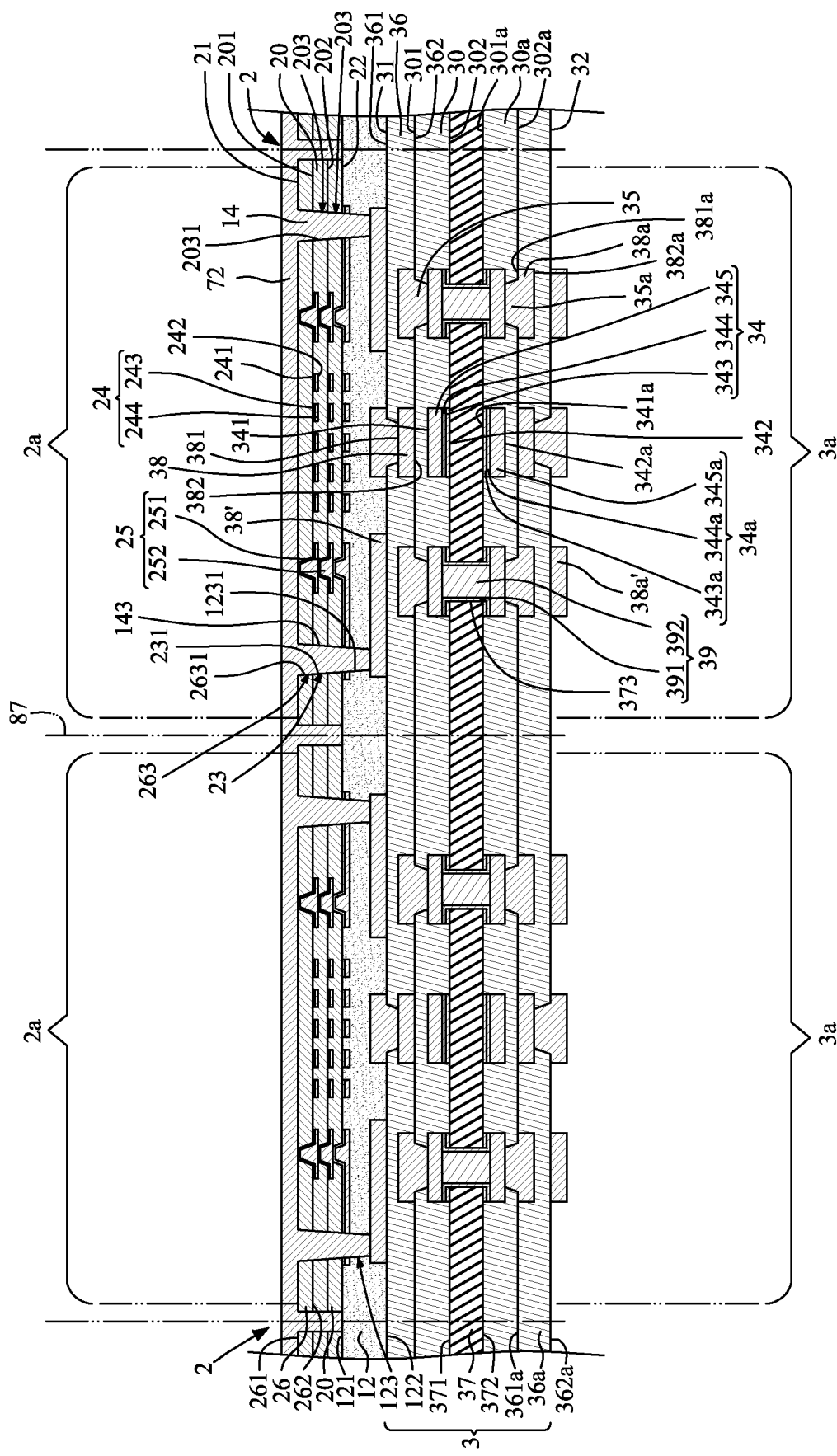
FIG. 49 illustrates one or more stages of an example of a method for manufacturing a wiring structure according to some embodiments of the present disclosure.

Referring to FIG. 49, a metallic layer 72 is formed on the surface 21 of the upper conductive structure 2 and in the through hole 23 to form at least one upper through via 14 in the through hole 23 by a plating technique or other suitable techniques. Thus, the upper conductive structure 2a of the upper strip 2 is electrically connected to the lower conductive structure 3a of the lower substrate 3 through the upper through via 14.

Figure 50:
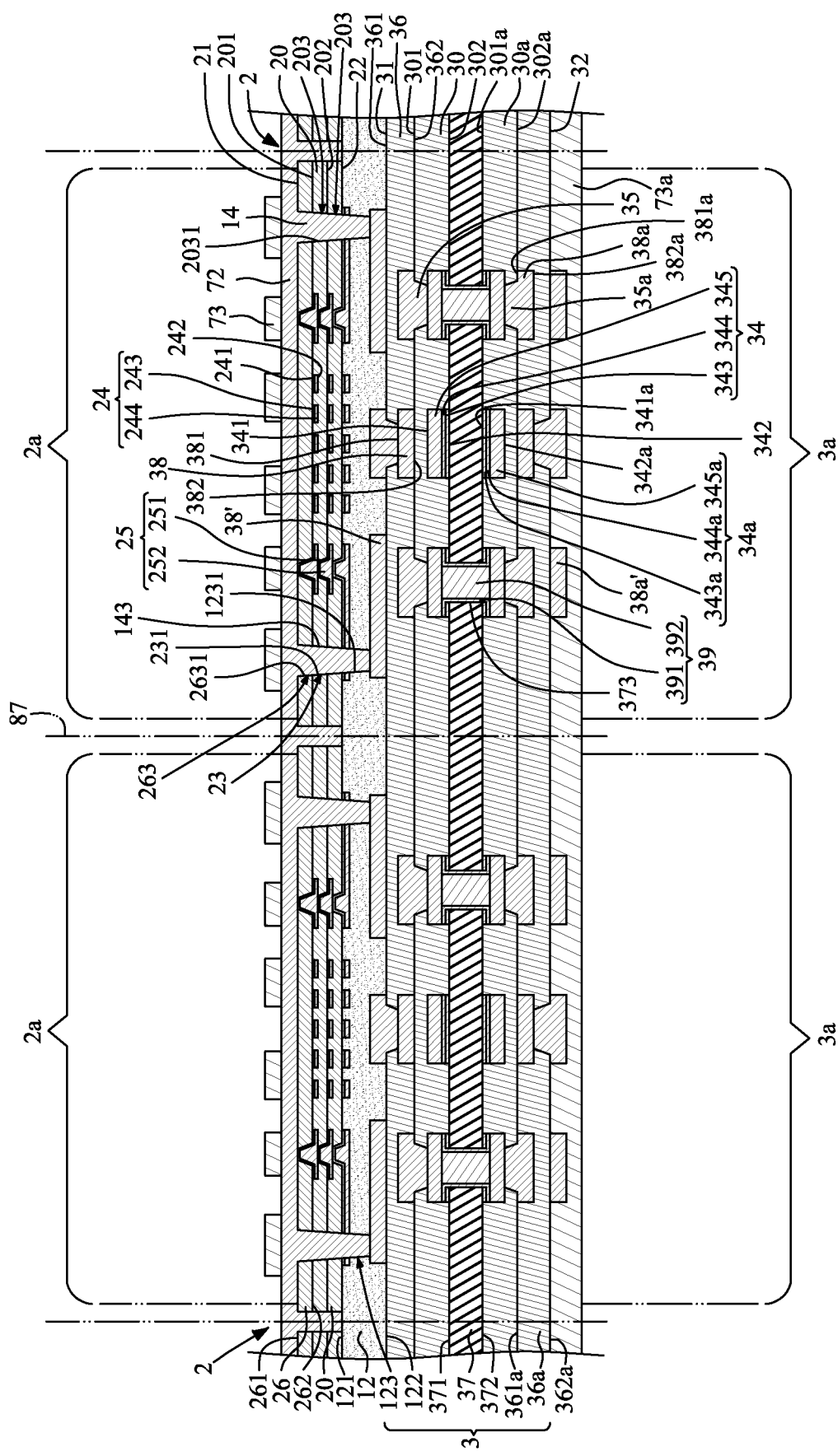
FIG. 50 illustrates one or more stages of an example of a method for manufacturing a wiring structure according to some embodiments of the present disclosure.

Referring to FIG. 50, a top photoresist layer 73 is formed or disposed on the metallic layer 72, and a bottom photoresist layer 73a is formed or disposed on the bottom surface 32 of the lower conductive structure 3. Then, the top photoresist layer 73 is patterned by an exposure and development technique or other suitable techniques.

Figure 51:
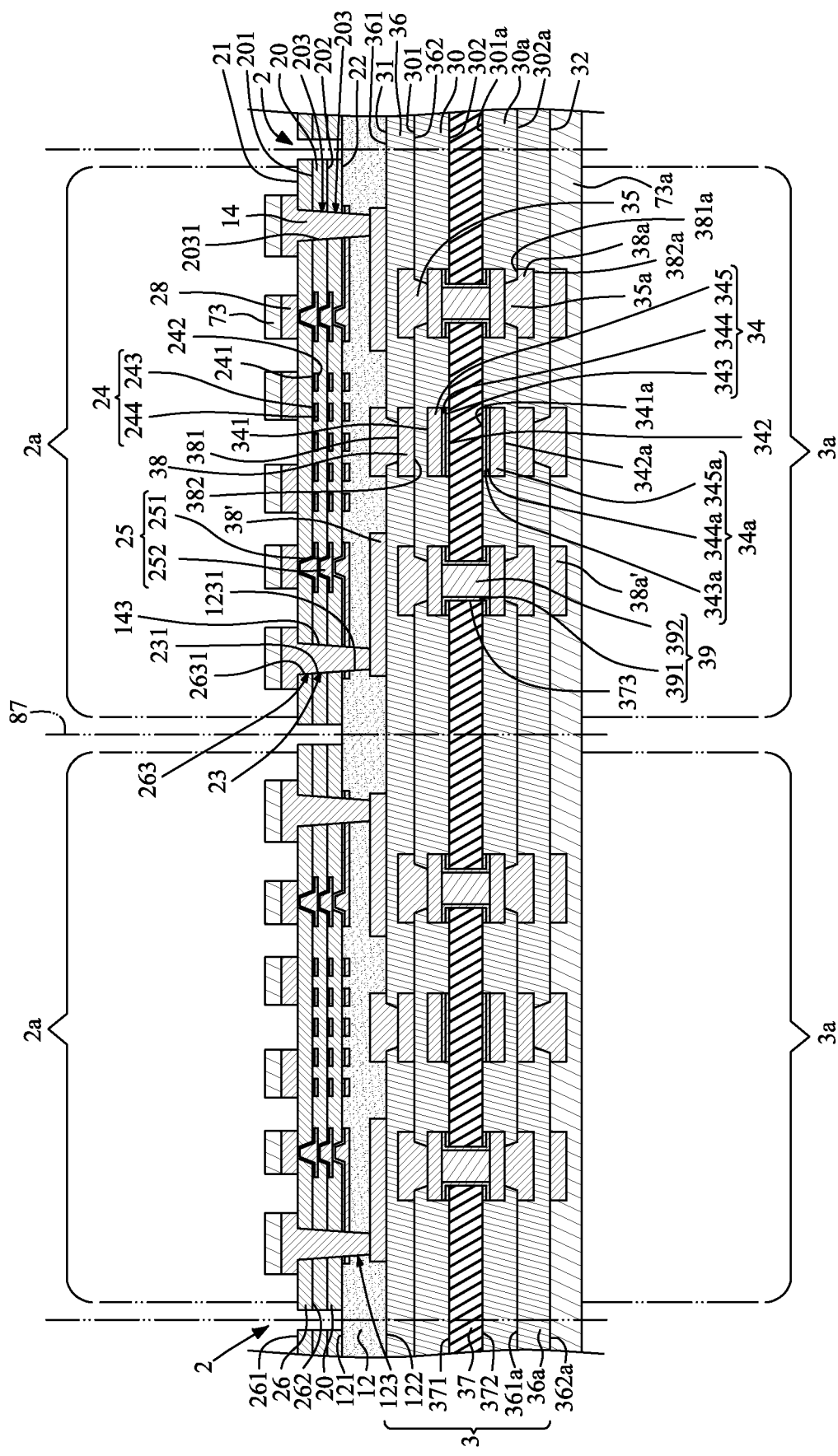
FIG. 51 illustrates one or more stages of an example of a method for manufacturing a wiring structure according to some embodiments of the present disclosure.

Referring to FIG. 51, portions of the metallic layer 72 that are not covered by the top photoresist layer 73 are removed by an etching technique or other suitable techniques. Portions of the metallic layer 72 that are covered by the top photoresist layer 73 remain to form a second circuit layer 28. Then, the top photoresist layer 73 and the bottom photoresist layer 73a are removed by a stripping technique or other suitable techniques, so as to obtain the wiring structure 1 of FIG. 1 to FIG. 4.

In some embodiments, a singulation process is conducted to the lower conductive structure 3 and the intermediate layer 12 along the cutting lines 87 to obtain a plurality of wiring structure 1a of FIG. 5.

Figure 52:
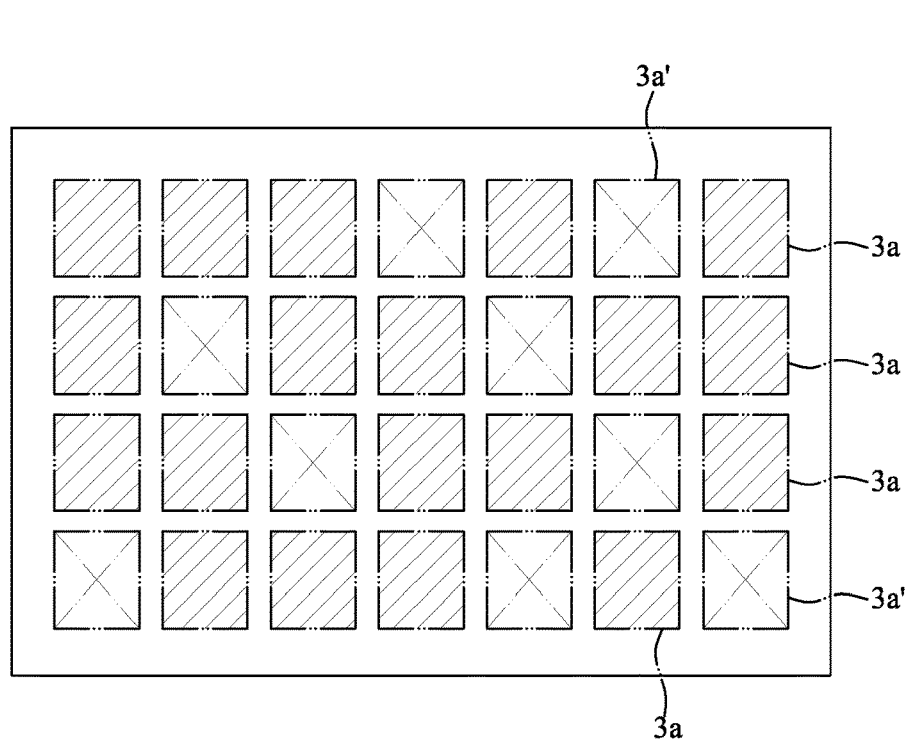
FIG. 52 illustrates one or more stages of an example of a method for manufacturing a wiring structure according to some embodiments of the present disclosure.

FIG. 52 through FIG. 59 illustrate a method for manufacturing a wiring structure according to some embodiments of the present disclosure. In some embodiments, the method is for manufacturing the wiring structure 1c shown in FIG. 7. The initial stages of the illustrated process are the same as, or similar to, the stages illustrated in FIG. 11 to FIG. 31. FIG. 52 depicts a stage subsequent to that depicted in FIG. 31.

Referring to FIG. 52, a top view of the lower substrate 3 is illustrated. After a testing process, the lower conductive structures 3a that pass the testing are marked as known good die units or qualified die units. Meanwhile, the lower conductive structures 3a' that fail to pass the testing are marked as known bad die units or unqualified die units.

Figure 53:
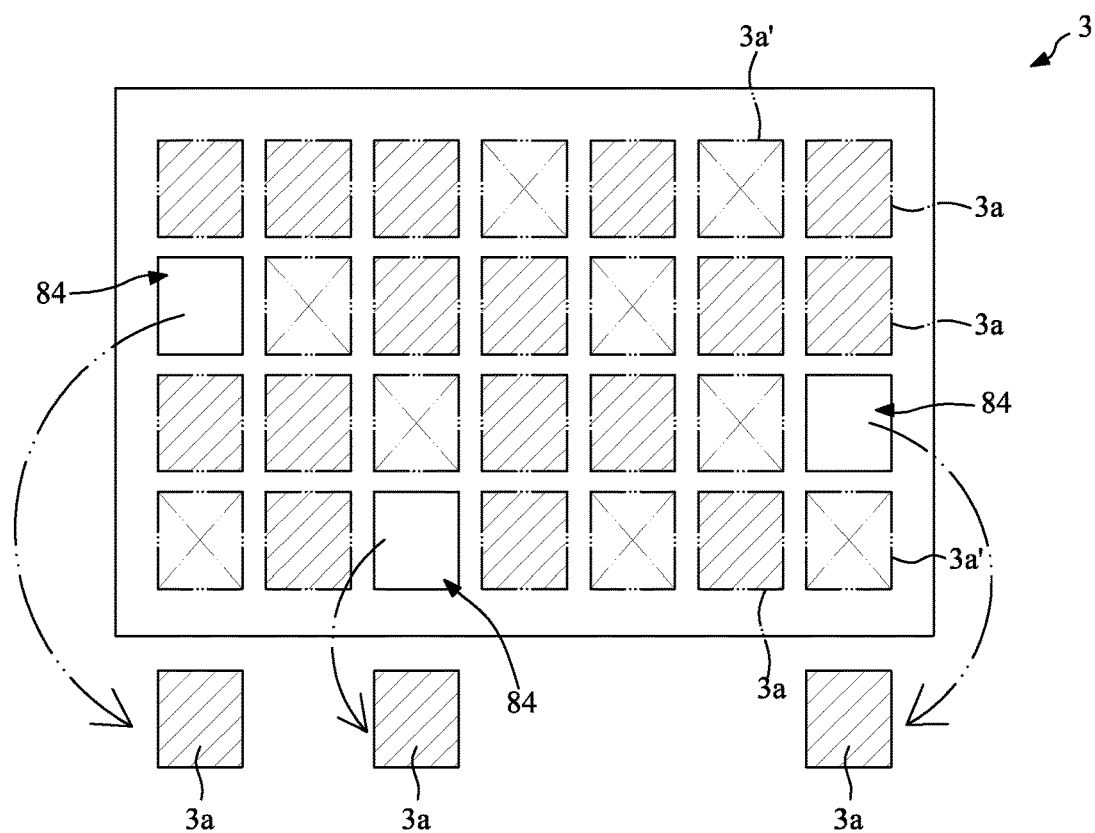
FIG. 53 illustrates one or more stages of an example of a method for manufacturing a wiring structure according to some embodiments of the present disclosure.

Referring to FIG. 53, the known good lower conductive structures 3a are singulated and picked up from the lower substrate 3 to form a plurality of openings 84 in the lower substrate 3. In addition, the known bad lower conductive structures 3a' remain in the lower substrate 3, and may be discarded.

Figure 54:
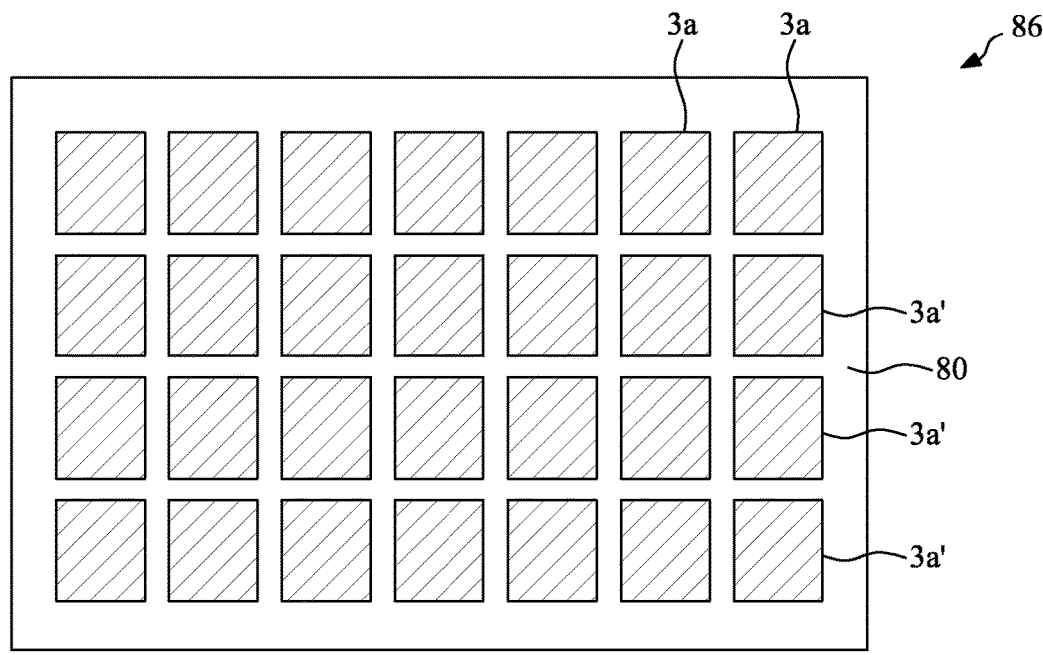
FIG. 54 illustrates one or more stages of an example of a method for manufacturing a wiring structure according to some embodiments of the present disclosure.

Referring to FIG. 54, the known good lower conductive structures 3a are selectively constituted and rearranged is an array. Then, a lower encapsulant 80 (e.g., molding compound) is formed to encapsulate the known good lower conductive structures 3a to form a lower module 86.

Figure 55:
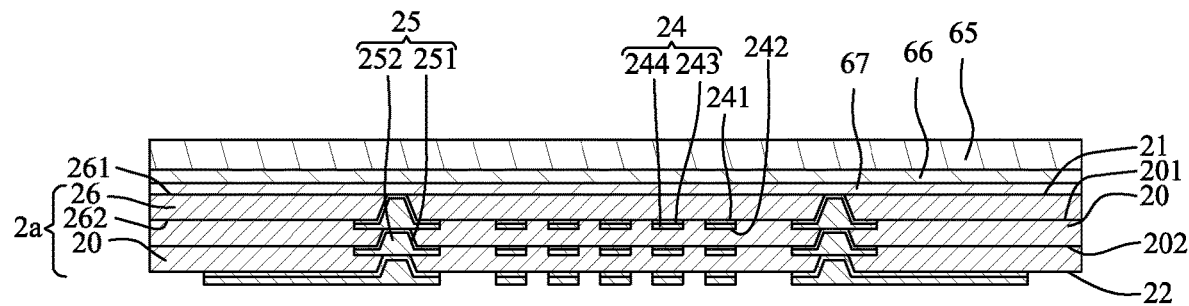
FIG. 55 illustrates one or more stages of an example of a method for manufacturing a wiring structure according to some embodiments of the present disclosure.

The following stages of the illustrated process are the same as, or similar to, the stages illustrated in FIG. 32 to FIG. 42. FIG. 55 depicts a stage subsequent to that depicted in FIG. 42. Referring to FIG. 55, the conductive structure 2' and the carrier 65 of FIG. 42 are cut to form a plurality of upper conductive structures 2a. It is noted that each of the upper conductive structures 2a is a die unit.

Figure 56:
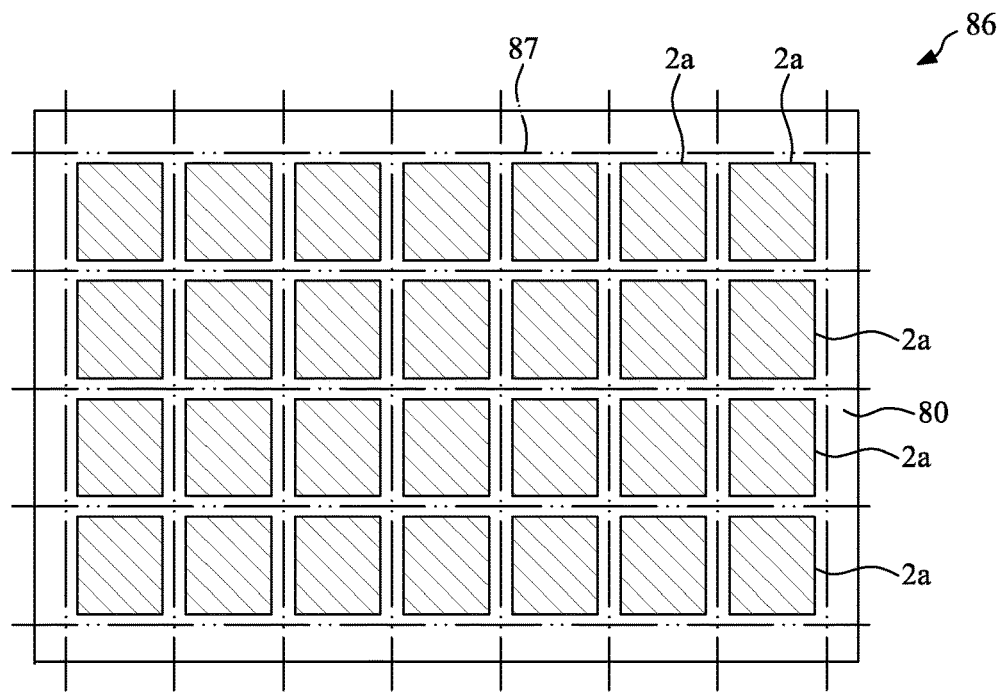
FIG. 56 illustrates one or more stages of an example of a method for manufacturing a wiring structure according to some embodiments of the present disclosure.
Figure 57:
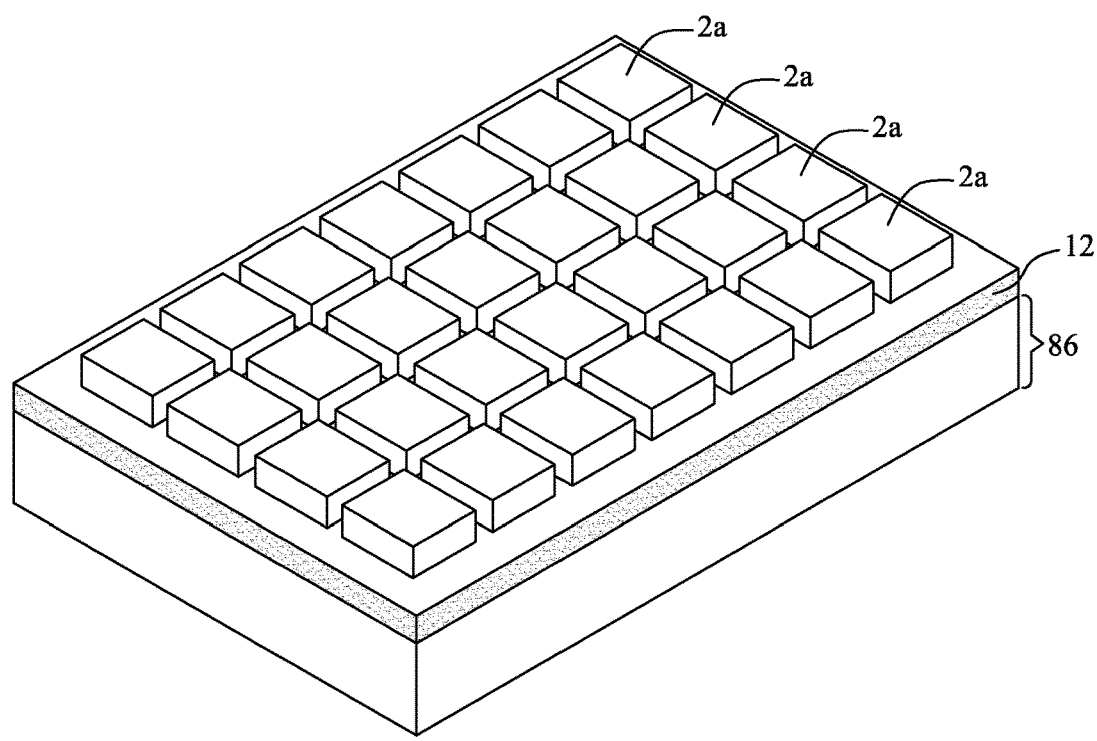
FIG. 57 illustrates one or more stages of an example of a method for manufacturing a wiring structure according to some embodiments of the present disclosure.
Figure 58:
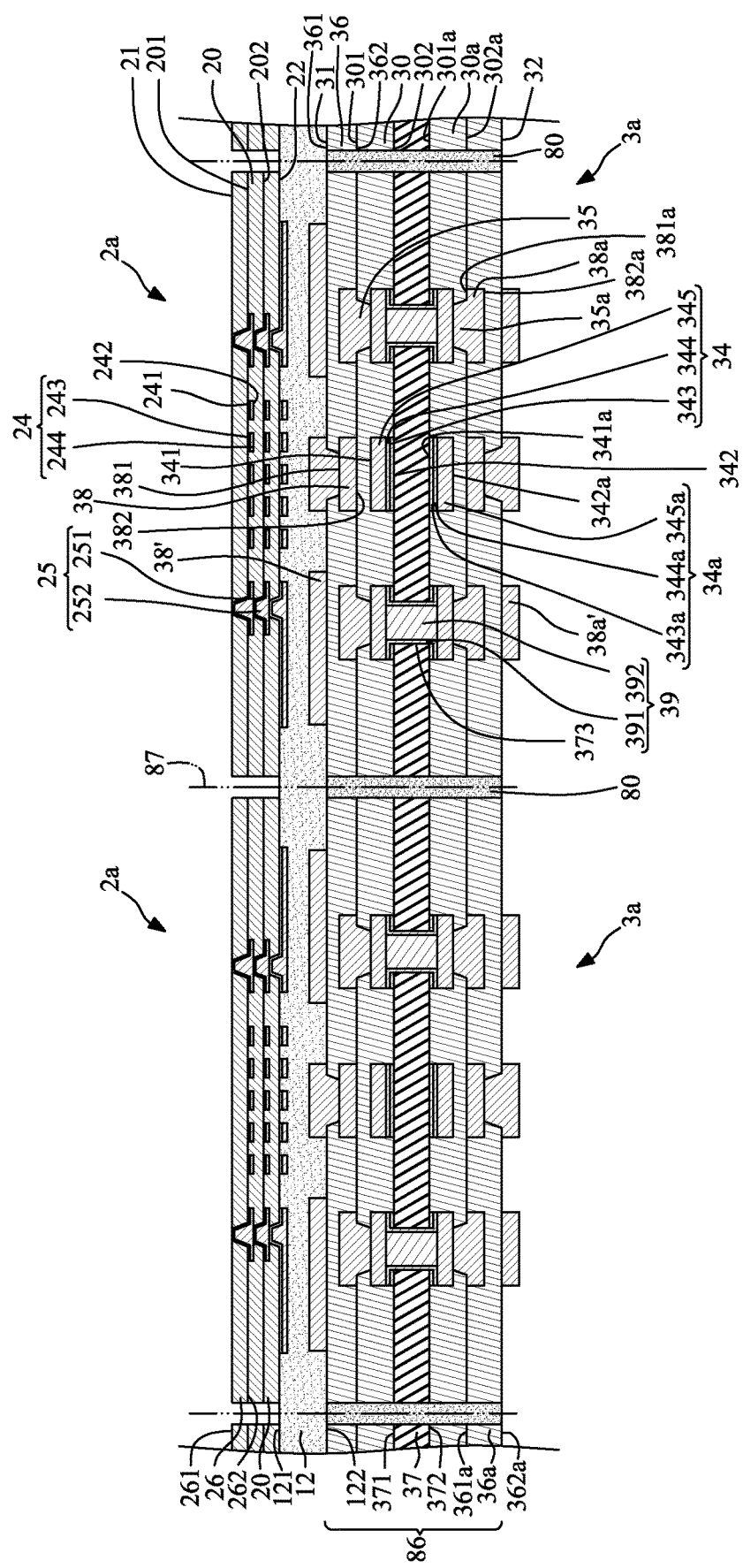
FIG. 58 illustrates one or more stages of an example of a method for manufacturing a wiring structure according to some embodiments of the present disclosure.

Referring to FIG. 56, FIG. 57 and FIG. 58, wherein FIG. 57 illustrates a perspective view of FIG. 56, and FIG. 58 illustrates a cross-sectional view a portion of FIG. 56. The upper conductive structures 2a and the carrier 65 are attached to the lower module 86 through an adhesive layer 12. The upper conductive structures 2a face the lower module 86. Then, the adhesive layer 12 is cured to form an intermediate layer 12. Then, the carrier strips 65, the release layer 66 and the conductive layer 67 are removed so as to expose a portion of the inner via 25. As shown in FIG. 56 and FIG. 58, the lower module 86 may include a plurality of cutting lines 87 crossed with each other.

Figure 59:
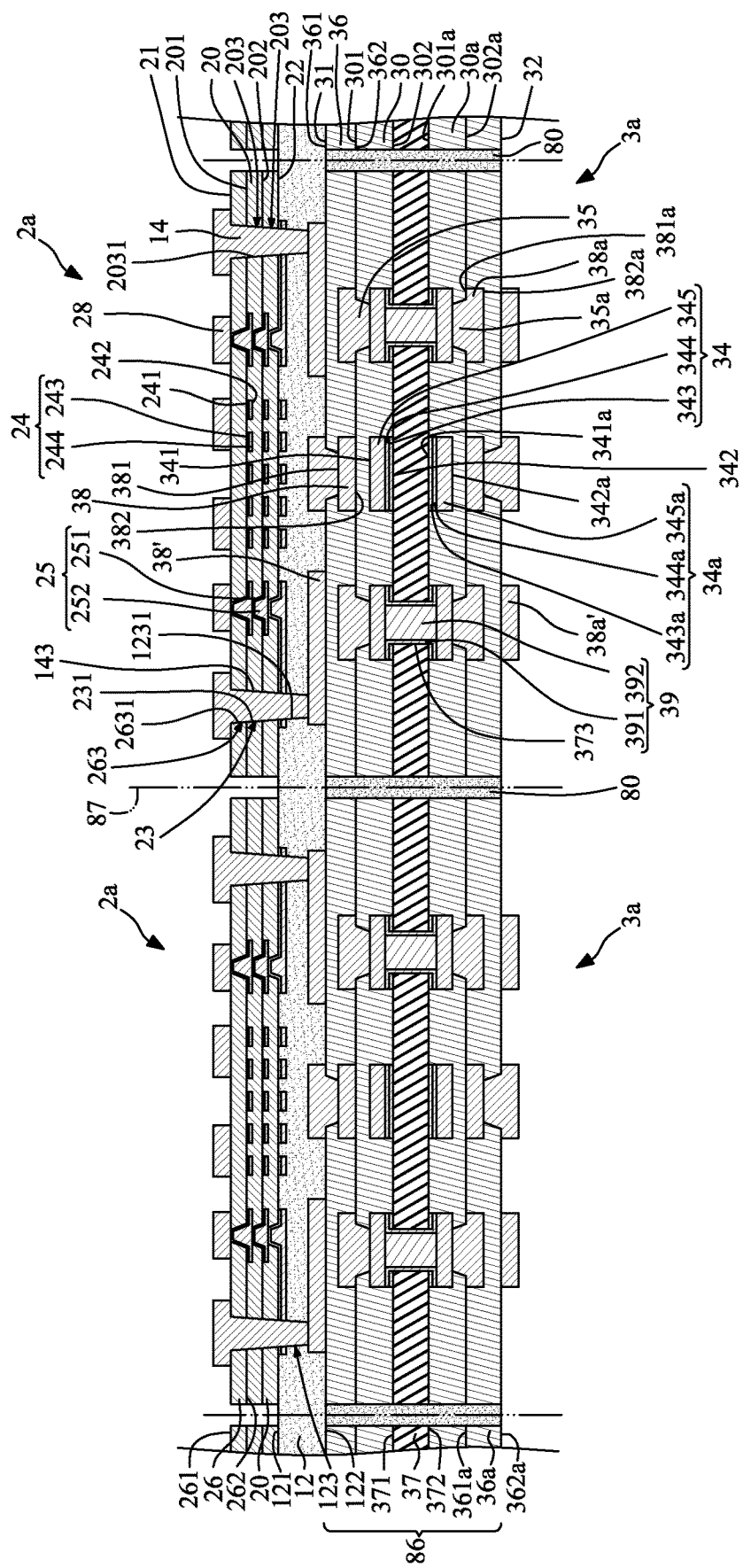
FIG. 59 illustrates one or more stages of an example of a method for manufacturing a wiring structure according to some embodiments of the present disclosure.

Referring to FIG. 59, at least one upper through via 14 is formed to extend through the upper conductive structure 2a and the intermediate layer 12. Thus, the upper conductive structures 2a are electrically connected to the lower conductive structures 3a of the lower module 86 through the upper through via 14.

Then, a singulation process is conducted to singulate the lower module 86 along the cutting lines 87 to form a plurality of wiring structures 1c of FIG. 7.

Figure 60:
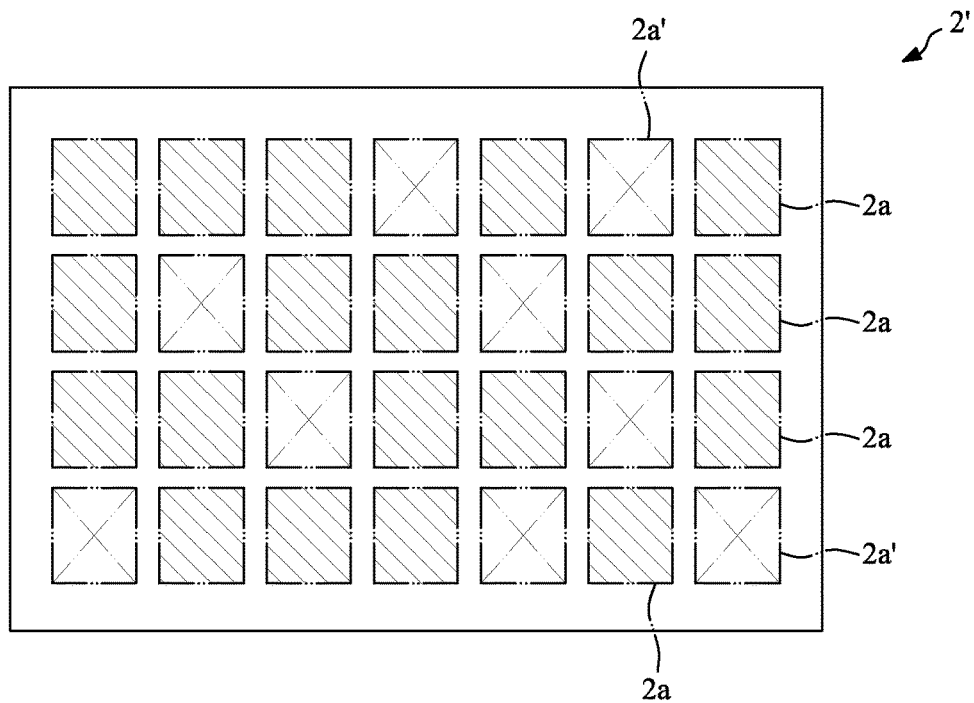
FIG. 60 illustrates one or more stages of an example of a method for manufacturing a wiring structure according to some embodiments of the present disclosure.

FIG. 60 through FIG. 65 illustrate a method for manufacturing a wiring structure according to some embodiments of the present disclosure. In some embodiments, the method is for manufacturing the wiring structure 1e shown in FIG. 9. The initial stages of the illustrated process are the same as, or similar to, the stages illustrated in FIG. 11 to FIG. 31, FIG. 52 to FIG. 54, and FIG. 32 to FIG. 42. FIG. 60 depicts a stage subsequent to that depicted in FIG. 42.

Referring to FIG. 60, a top view of the conductive structure 2' is illustrated. After a testing process, the upper conductive structures 2a that pass the testing are marked as known good die units or qualified die units. Meanwhile, the upper conductive structures 2a' that fail to pass the testing are marked as known bad die units or unqualified die units.

Figure 61:
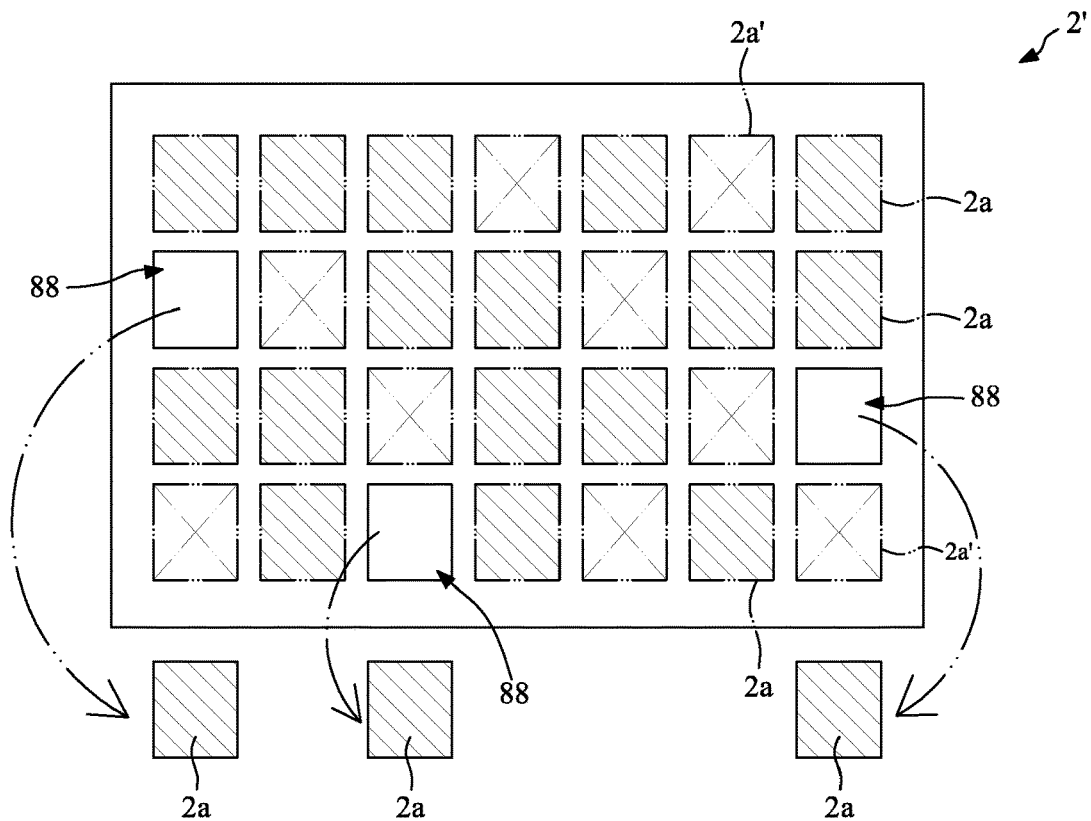
FIG. 61 illustrates one or more stages of an example of a method for manufacturing a wiring structure according to some embodiments of the present disclosure.

Referring to FIG. 61, the known good upper conductive structures 2a are singulated and picked up from the conductive structure 2' to form a plurality of openings 88 in the conductive structure 2'. In addition, the known bad upper conductive structures 2a' remain in the conductive structure 2', and may be discarded.

Figure 62:
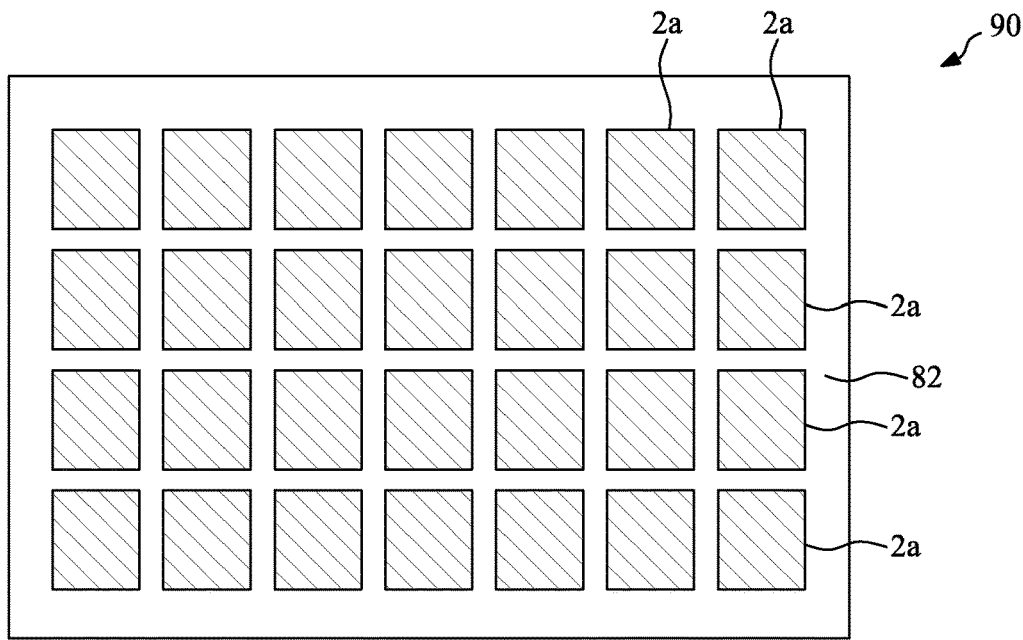
FIG. 62 illustrates one or more stages of an example of a method for manufacturing a wiring structure according to some embodiments of the present disclosure.

Referring to FIG. 62, the known good upper conductive structures 2a are selectively constituted and rearranged is an array. Then, an upper encapsulant 82 (e.g., molding compound) is formed to encapsulate the known good upper conductive structures 2a to form an upper module 90.

Figure 63:
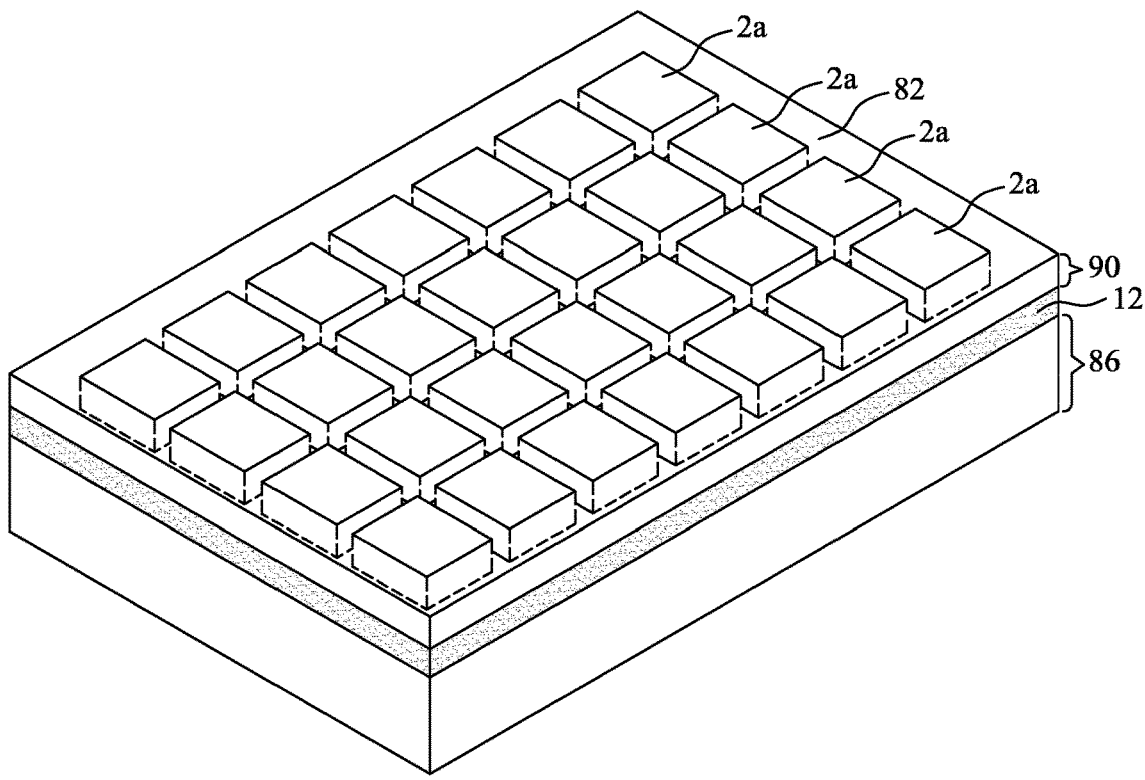
FIG. 63 illustrates one or more stages of an example of a method for manufacturing a wiring structure according to some embodiments of the present disclosure.
Figure 64:
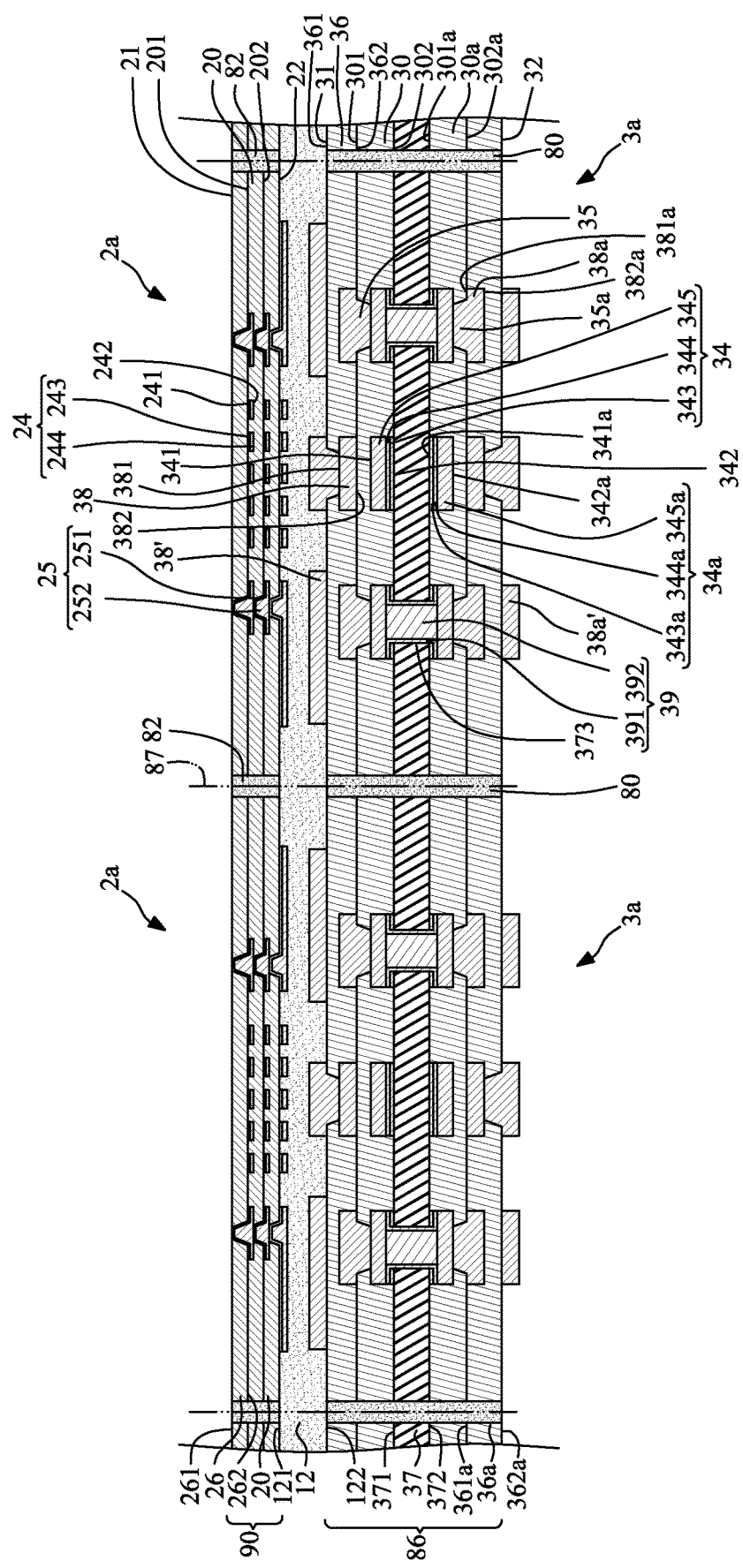
FIG. 64 illustrates one or more stages of an example of a method for manufacturing a wiring structure according to some embodiments of the present disclosure.

Referring to FIG. 63 and FIG. 64, wherein FIG. 64 illustrates a cross-sectional view of a portion of FIG. 63. The upper module 90 is attached to the lower module 86 through an adhesive layer 12. Thus, the known good upper conductive structures 2a are attached to the known good lower conductive structures 3a respectively. Then, the adhesive layer 12 is cured to form an intermediate layer 12.

Figure 65:
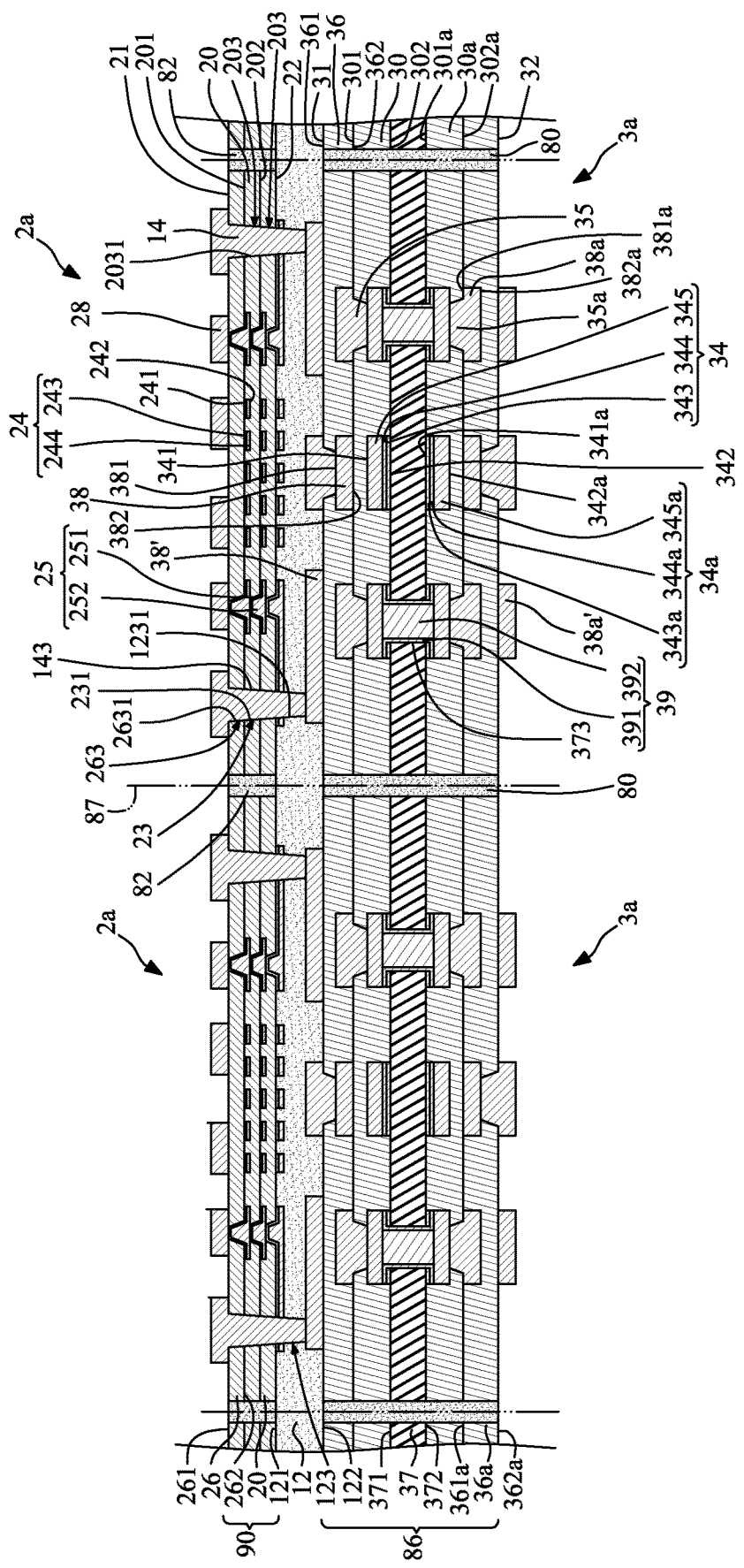
FIG. 65 illustrates one or more stages of an example of a method for manufacturing a wiring structure according to some embodiments of the present disclosure.

Referring to FIG. 65, at least one upper through via 14 is formed to extend through the upper conductive structure 2a and the intermediate layer 12. Thus, the upper conductive structures 2a of the upper module 90 are electrically connected to the lower conductive structures 3a of the lower module 86 through the upper through via 14.

Then, a singulation process is conducted to singulate the lower module 86, the intermediate layer 12 and the upper module 90 along the cutting lines to form a plurality of wiring structures 1e of FIG. 9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
    an upper conductive structure including at least one upper dielectric layer and at least one upper circuit layer in contact with the upper dielectric layer;
    a lower conductive structure including at least one lower dielectric layer and at least one lower circuit layer in contact with the lower dielectric layer;
    a lower encapsulant surrounding a lateral peripheral surface of the lower conductive structure; and
    an intermediate layer disposed between the upper conductive structure and the lower conductive structure and bonding the upper conductive structure and the lower conductive structure together, wherein the upper conductive structure is electrically connected to the lower conductive structure,
    wherein a lateral peripheral surface of the intermediate layer is substantially coplanar with a lateral peripheral surface of the lower encapsulant.

2. The wiring structure of claim 1, wherein a lateral peripheral surface of the upper conductive structure is inwardly recessed from the lateral peripheral surface of the lower encapsulant.

3. The wiring structure of claim 1, wherein a lateral peripheral surface of the upper conductive structure is substantially coplanar with a lateral peripheral surface of the lower conductive structure.

4. The wiring structure of claim 1, wherein a lateral peripheral surface of the upper conductive structure is inwardly recessed from a lateral peripheral surface of the lower conductive structure.

5. The wiring structure of claim 1, wherein a portion of the intermediate layer covers a top surface of the lower encapsulant.

6. The wiring structure of claim 1, further comprising an upper encapsulant surrounding a lateral peripheral surface of the upper conductive structure.

7. The wiring structure of claim 6, wherein a lateral peripheral surface of the upper encapsulant is substantially coplanar with the lateral peripheral surface of the lower encapsulant.

8. The wiring structure of claim 6, wherein the lateral peripheral surface of the upper conductive structure is substantially coplanar with a lateral peripheral surface of the lower conductive structure.

9. The wiring structure of claim 6, wherein the lateral peripheral surface of the upper conductive structure is inwardly recessed from a lateral peripheral surface of the lower conductive structure.

10. The wiring structure of claim 1, wherein a line space of the lower circuit layer of the lower conductive structure is greater than a line space of the upper circuit layer of the upper conductive structure.

11. A wiring structure, comprising:
- a high-density conductive structure including at least one dielectric layer and at least one circuit layer in contact with the dielectric layer;
- a low-density conductive structure bonded to and electrically connected to the high-density conductive structure, and including at least one dielectric layer and at least one circuit layer in contact with the dielectric layer;
- a lower encapsulant surrounding a lateral peripheral surface of the low-density conductive structure; and
- an intermediate layer disposed between the high-density conductive structure and the low-density conductive structure and bonding the high-density conductive structure and the low-density conductive structure together, wherein a lateral peripheral surface of the intermediate layer is substantially coplanar with a lateral peripheral surface of the lower encapsulant.

12. The wiring structure of claim 11, wherein the low-density conductive structure further includes a core portion, the at least one dielectric layer and the at least one circuit layer of the low-density conductive structure are disposed adjacent to a surface of the core portion.

13. The wiring structure of claim 11, wherein a line space of the circuit layer of the low-density conductive structure is greater than a line space of the circuit layer of the high-density conductive structure.

14. The wiring structure of claim 11, further comprising at least one upper through via extending through at least a portion of the high-density conductive structure, and electrically connected to the circuit layer of the low-density conductive structure.

15. A wiring structure, comprising:
- an upper conductive structure including at least one upper dielectric layer and at least one upper circuit layer in contact with the upper dielectric layer;
- a lower conductive structure electrically connected to the upper conductive structure, and including at least one lower dielectric layer and at least one lower circuit layer in contact with the lower dielectric layer;
- an intermediate layer disposed between the upper conductive structure and the lower conductive structure and bonding the upper conductive structure and the lower conductive structure together; and
- a lower encapsulant covering a lateral peripheral surface of the lower conductive structure and being in contact with a portion of the intermediate layer,
- wherein a lateral peripheral surface of the intermediate layer is substantially coplanar with a lateral peripheral surface of the lower encapsulant.

16. The wiring structure of claim 15, wherein a lateral peripheral surface of the upper conductive structure is inwardly recessed from the lateral peripheral surface of the lower encapsulant.

17. The wiring structure of claim 15, further comprising an upper encapsulant surrounding a lateral peripheral surface of the upper conductive structure.

18. The wiring structure of claim 15, wherein the lower conductive structure further includes a core portion, the at least one lower dielectric layer and the at least one lower circuit layer of the lower conductive structure are disposed adjacent to a surface of the core portion.

19. The wiring structure of claim 15, wherein a line space of the lower circuit layer of the lower conductive structure is greater than a line space of the upper circuit layer of the upper conductive structure.

20. The wiring structure of claim 15, further comprising at least one upper through via extending through at least a portion of the upper conductive structure and the intermediate layer, and electrically connected to the lower circuit layer of the lower conductive structure.

* * * * *